United States Patent [19]

Hamilton

[11] Patent Number: 4,516,218
[45] Date of Patent: May 7, 1985

[54] MEMORY SYSTEM WITH SINGLE COMMAND SELECTIVE SEQUENTIAL ACCESSING OF PREDETERMINED PLURALITIES OF DATA LOCATIONS

[75] Inventor: Stephen P. Hamilton, Midland, Tex.

[73] Assignee: Texas Instruments Incorporated, Dallas, Tex.

[21] Appl. No.: 163,025

[22] Filed: Jun. 26, 1980

[51] Int. Cl.³ ............ G06F 9/32; G06F 13/06; G06F 15/02
[52] U.S. Cl. .................. 364/900; 364/706; 364/708
[58] Field of Search .......... 364/200, 900, 706, 708

[56] References Cited

U.S. PATENT DOCUMENTS

| | | | |
|---|---|---|---|
| 3,638,199 | 1/1972 | Kolankowsky et al. | 364/200 |
| 4,020,470 | 4/1977 | Drimak et al. | 364/200 |
| 4,037,213 | 7/1977 | Atkins et al. | 364/200 |
| 4,139,893 | 8/1977 | Poland | 364/706 |
| 4,258,430 | 3/1981 | Tyburski | 364/900 |
| 4,259,668 | 3/1981 | Nishimura et al. | 340/711 |
| 4,281,390 | 7/1981 | Olander, Jr. et al. | 364/706 |
| 4,291,385 | 9/1981 | Osborne et al. | 364/709 |
| 4,298,949 | 11/1981 | Poland | 364/706 |
| 4,301,511 | 11/1981 | Shimizu et al. | 364/709 |
| 4,317,183 | 2/1982 | Shimizu et al. | 364/900 |
| 4,319,324 | 3/1982 | Johnson et al. | 364/200 |
| 4,346,437 | 8/1982 | Blahut et al. | 364/200 |
| 4,379,328 | 4/1983 | Catiller | 364/200 |

Primary Examiner—James D. Thomas
Assistant Examiner—Archie E. Williams
Attorney, Agent, or Firm—Rene' E. Grossman; Leo N. Heiting; Melvin Sharp

[57] ABSTRACT

This addressing system, advantageously for smaller scale data processors with relatively narrow data paths, facilitates transferring pluralities of multibit data words, e.g., storing or fetching the contents of a multidigit register in a calculator. A bidirectional bus couples a controller and a plug-in memory. The controller generates address, data, and command signals. A decoder receives command signals and outputs signals to a program counter (PC) alternatively indicating a normal mode, in which the controller accesses a single specified memory address, or a multiple access mode, in which a predetermined number of sequential addresses are accessed starting at a specified address. In response to selective command decoder output, the PC alternatively may store received addresses, output stored count values to the controller or to a memory array, or increment the count value in synchronism with data transfers to/from multiple memory locations. The decoder, PC, and memory array are contained within the portable memory module's housing, which may be mounted in another housing containing the controller.

In a ROM embodiment, the mounted memory is powered directly from a source in the controller housing. In a RAM embodiment, the module's housing includes a power switching circuit and an internal battery to provide uninterrupted power to the read/write memory cells irrespective of whether the module is mounted or detached.

11 Claims, 52 Drawing Figures

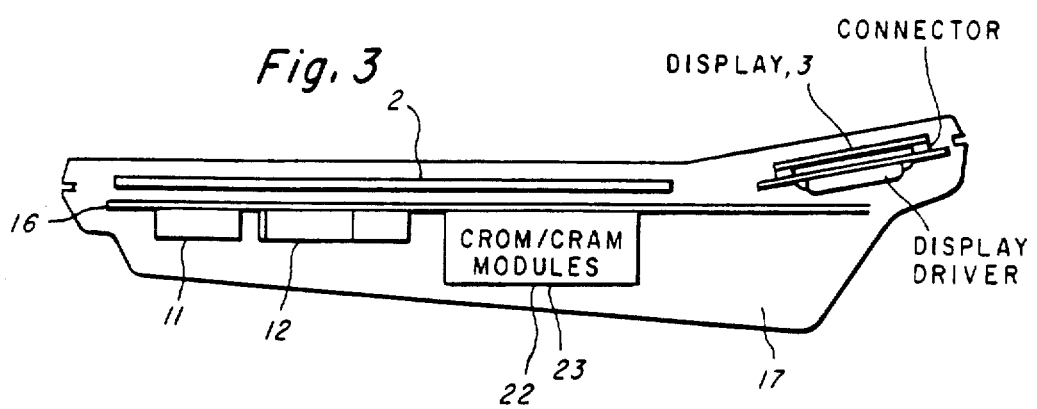

| SEQUENCE STATE (HEX) | CS | I/O 1 | I/O 2 | I/O 4 | I/O 8 | FUNCTIONAL DESCRIPTION |
|---|---|---|---|---|---|---|
| 00-0F | 0 | X | X | X | X | DESELECTED |
| 10 | 1 | 0 | 0 | 0 | 0 | NOP STATE |
| 11XXX | 1 | | X | X | X | COMMAND COMMENCEMENT TRANSITION WHEN TRANSITION FROM 10000 TO 11XXX SEE BELOW FOR COMMAND CODES: |
| 19 | 1 | ⌐ | 0 | 0 | 1 | LOAD ADDRESS |
| 1A | 1 | ⌐ | 0 | 1 | 0 | READ ADDRESS |
| 1B | 1 | ⌐ | 1 | 1 | 1 | READ TWO DIGITS |
| 1C | 1 | ⌐ | 0 | 0 | 0 | READ SIXTEEN DIGITS |
| 1D | 1 | ⌐ | 1 | 1 | 1 | WRITE TWO DIGITS |
| 1E | 1 | ⌐ | 1 | 0 | 0 | WRITE SIXTEEN DIGITS |
| 1F | 1 | ⌐ | 1 | 1 | 1 | |
| 18 | 1 | ⌐ | 0 | 0 | 0 | |

COMMANDS:
RAM ONLY: 1C, 1D, 1E, 1F, 18

0 = LOGIC 0 LEVEL SIGNAL
1 = LOGIC 1 LEVEL SIGNAL
X = DON'T CARE WHETHER LOGIC 0 OR 1
⌐ = TRANSITION FROM LOGIC 0 TO LOGIC 1 LEVEL

Fig.6

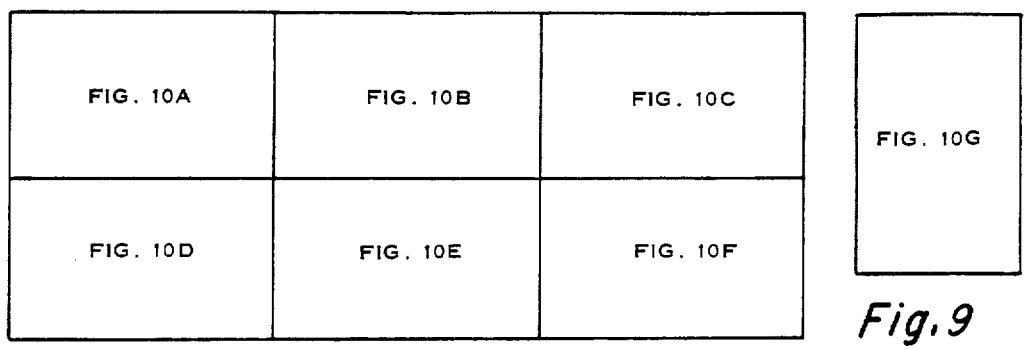
Fig. 9
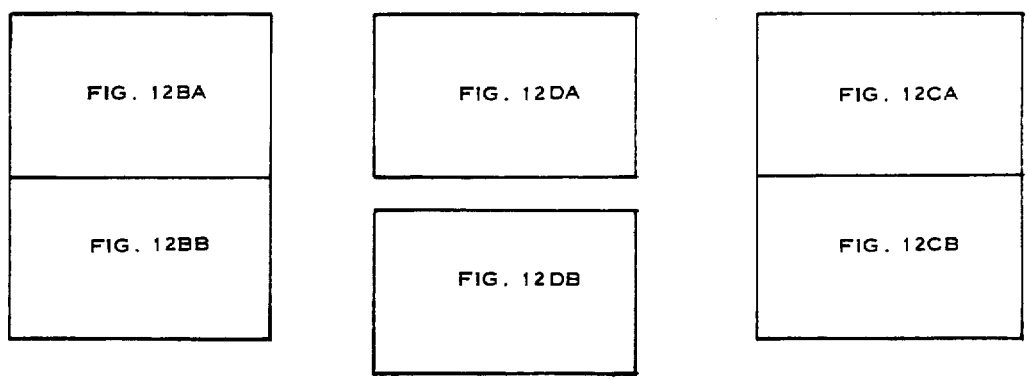
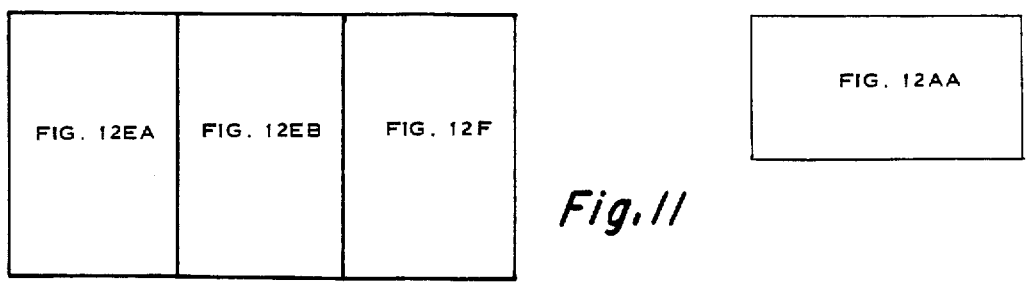
Fig. 11

ROM ADDRESS SCHEME — 5 DIGIT BCD          *Fig. 10G*
MAX. VALID ADDRESS — 14999
A16  A15 A14 A13 A12 A11  A10 A9 A8  A7 A6 A5 A4  A3 A2 A1 A0
METAL LINE DECODE                    DIFFUSION DECODE
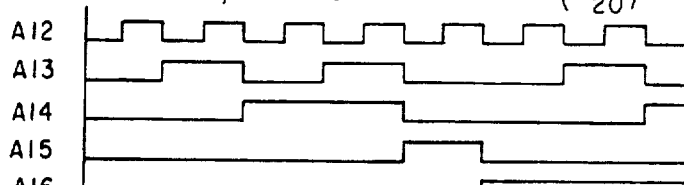
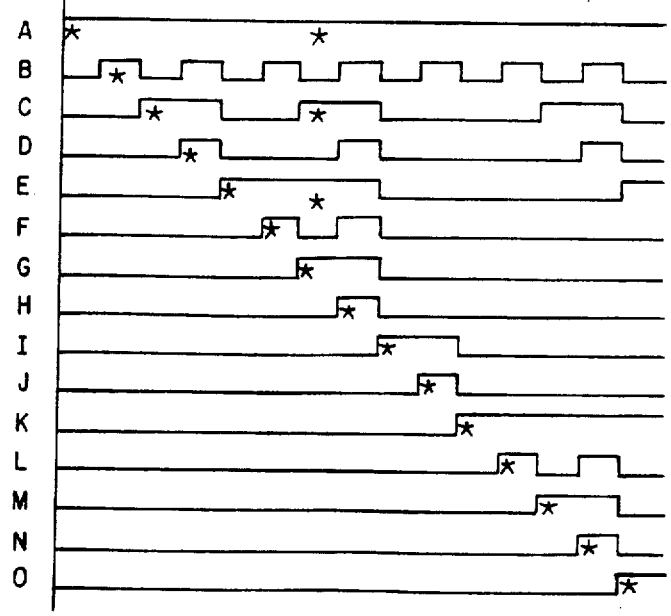

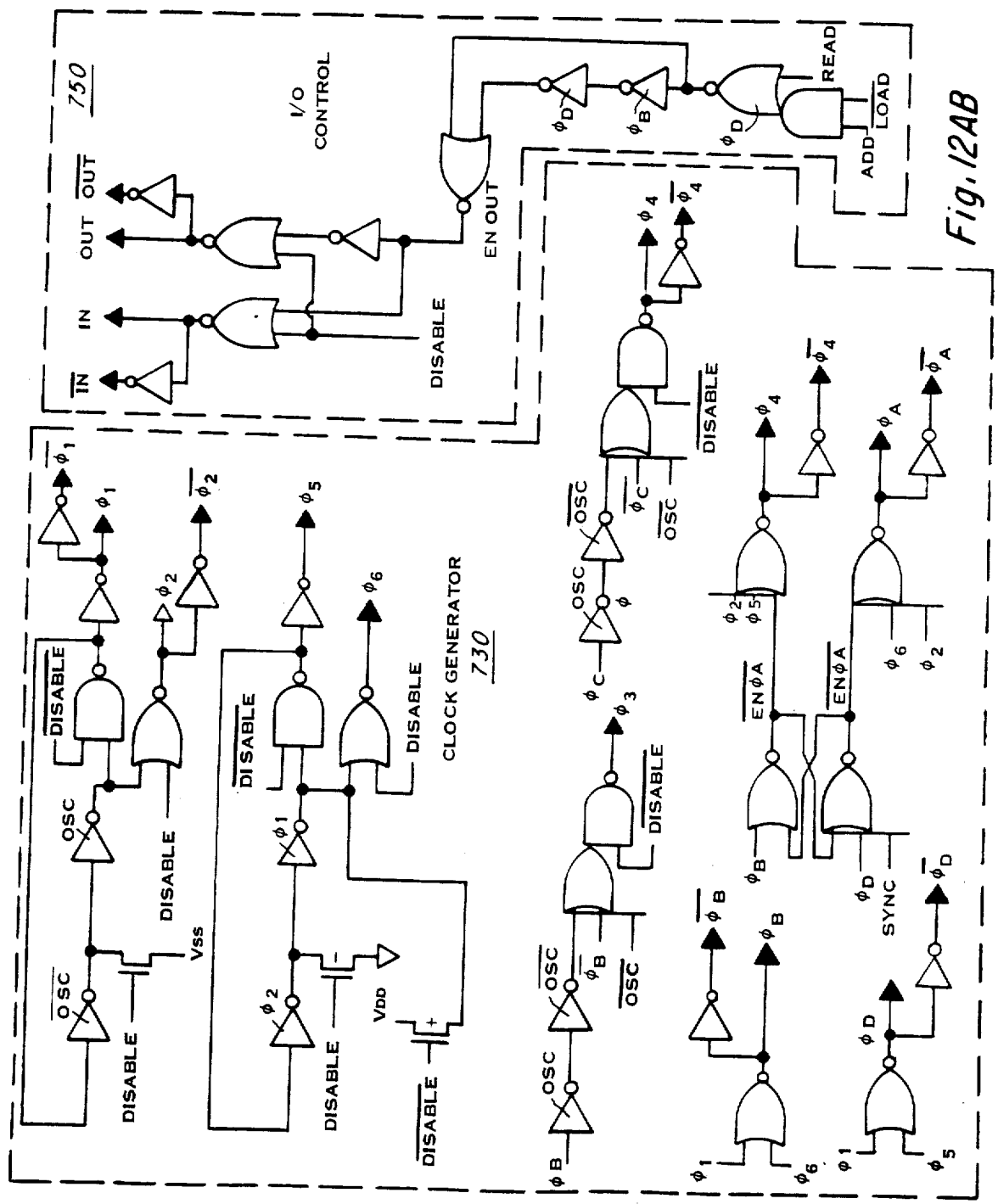

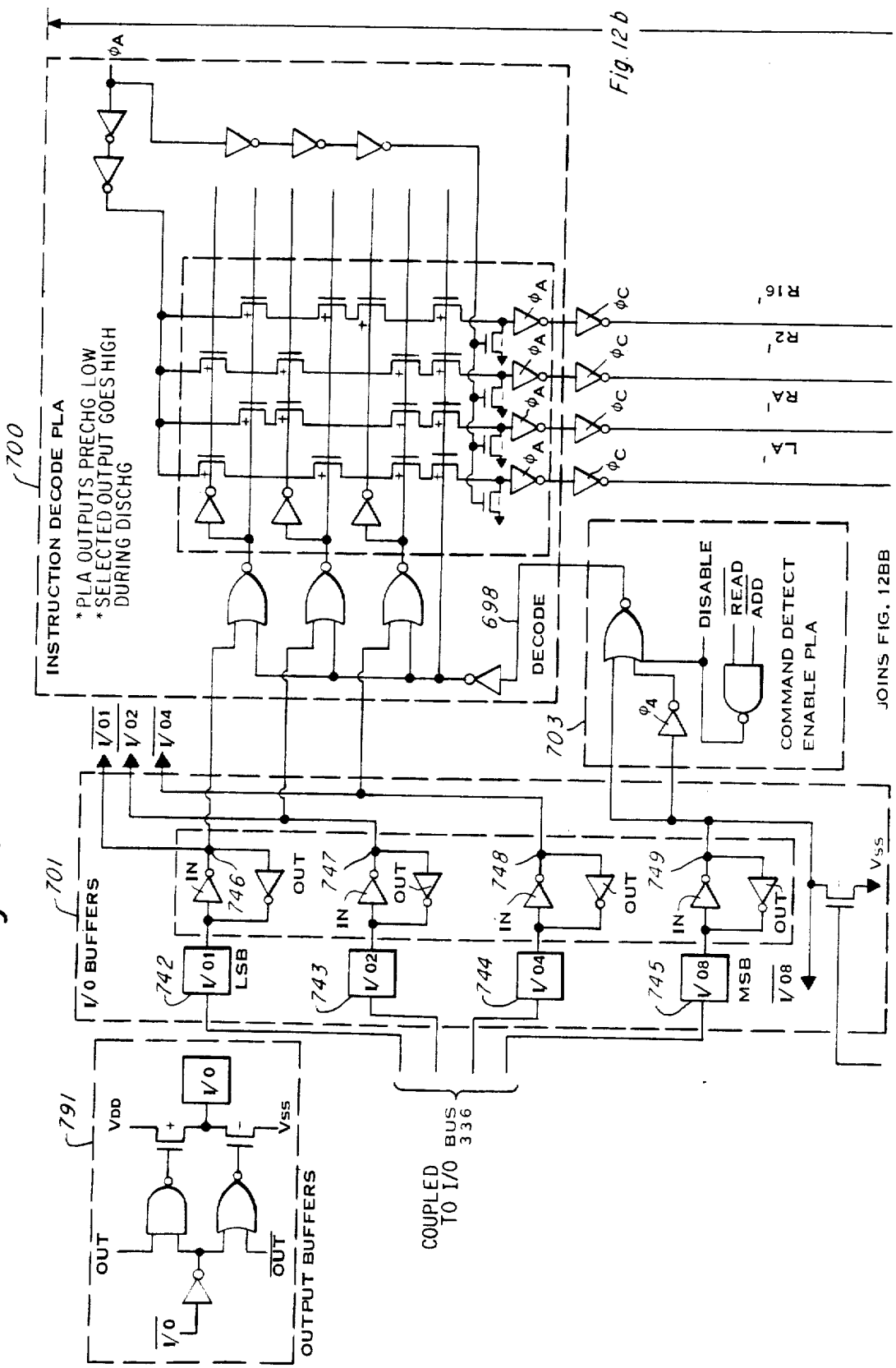

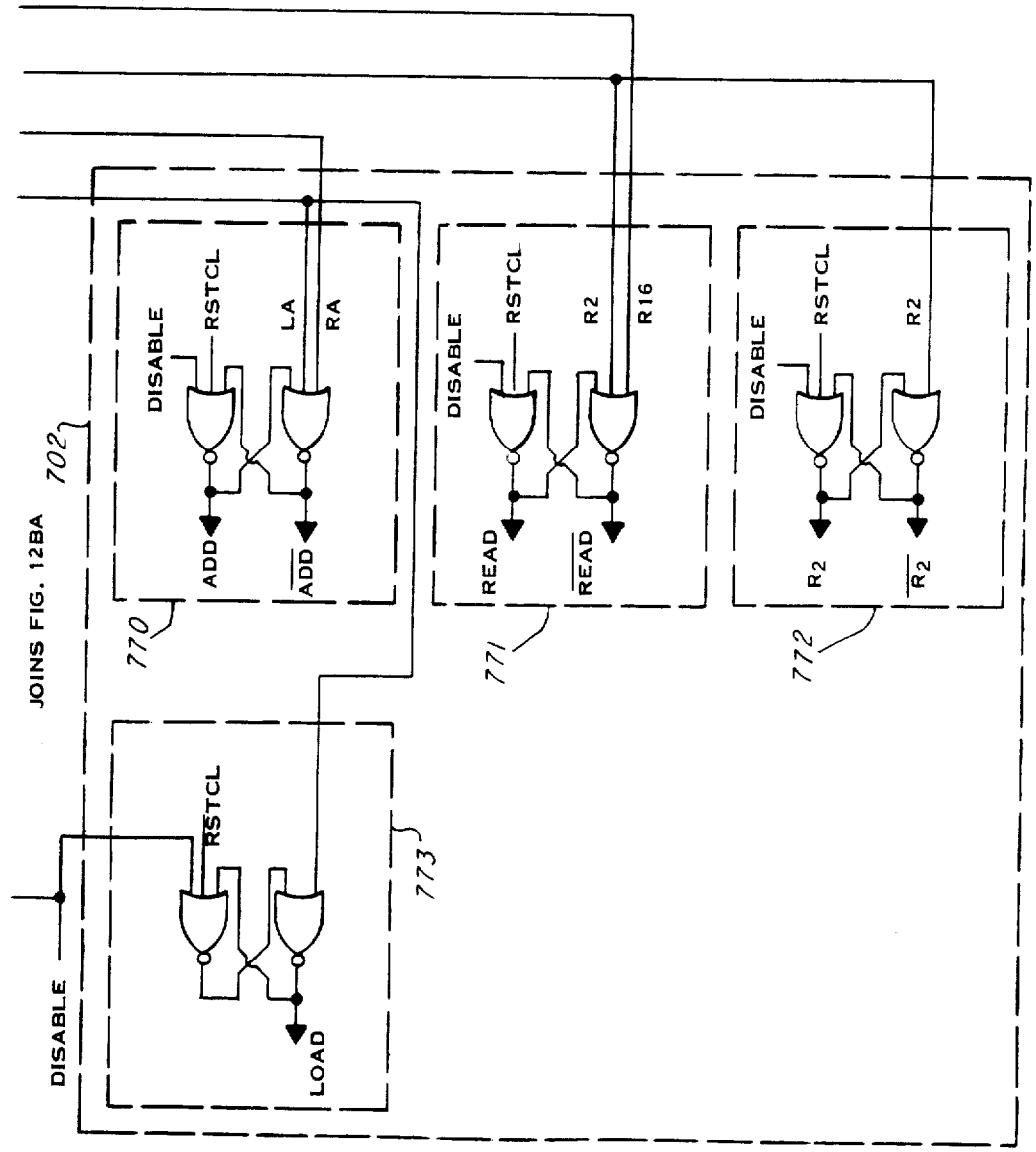

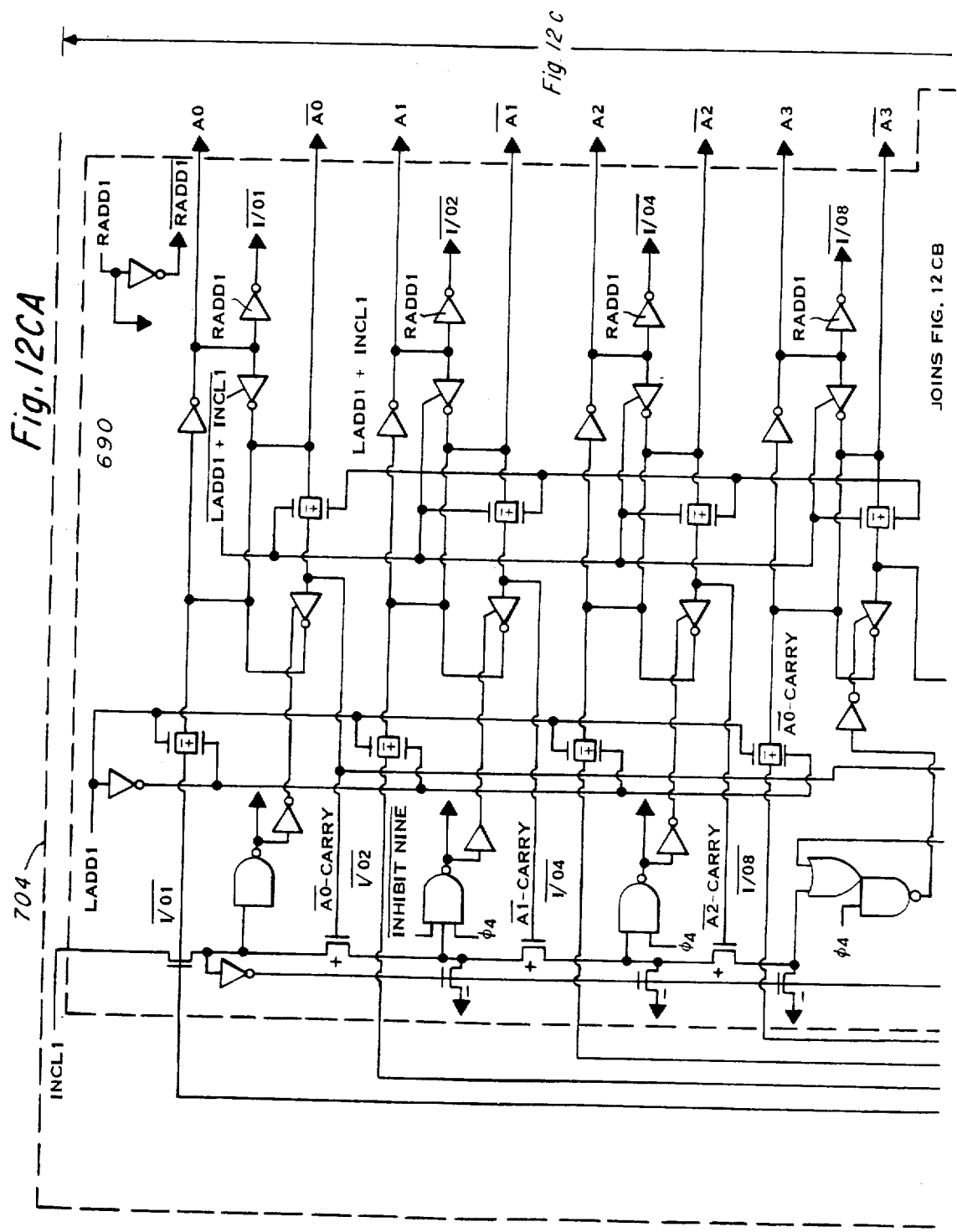

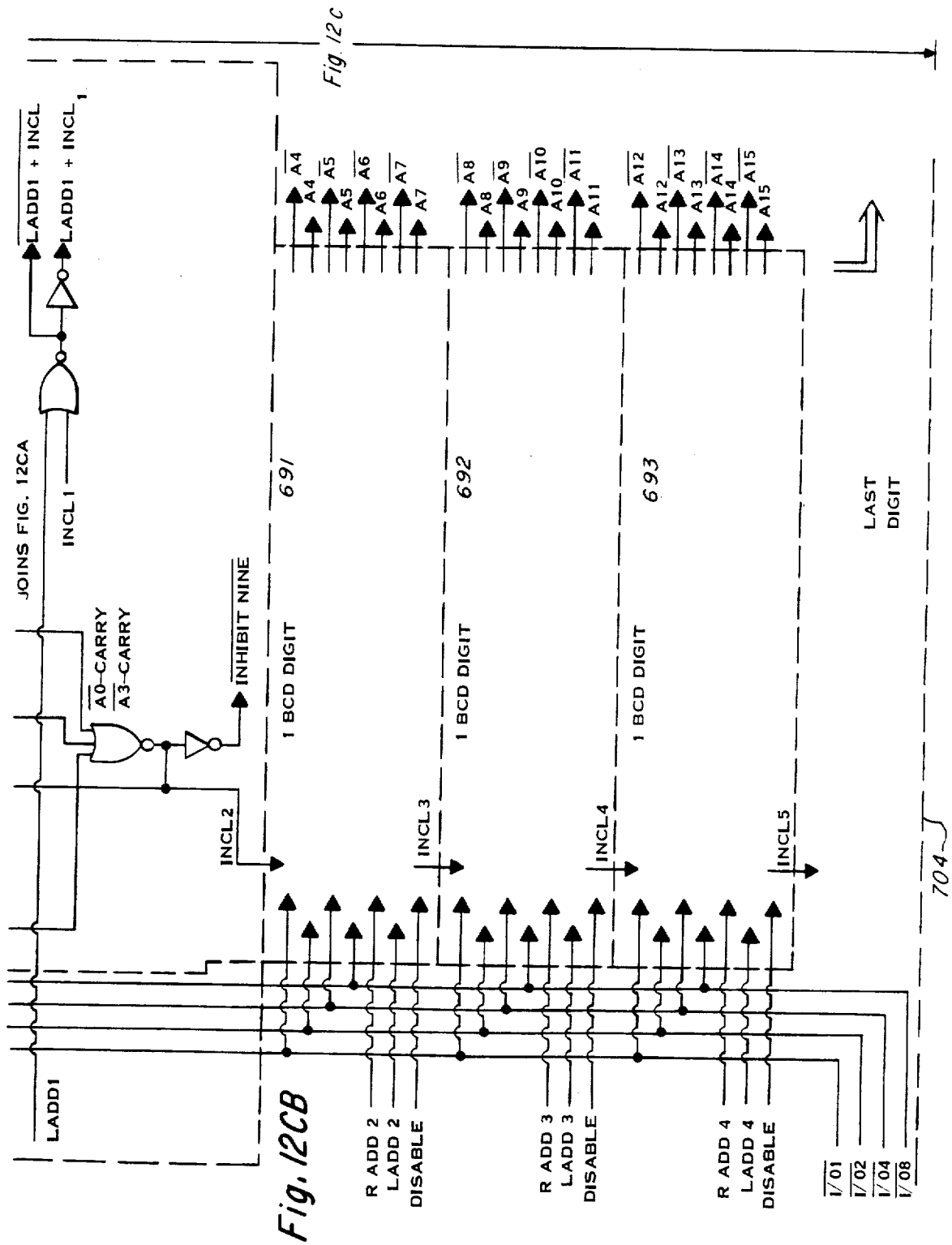

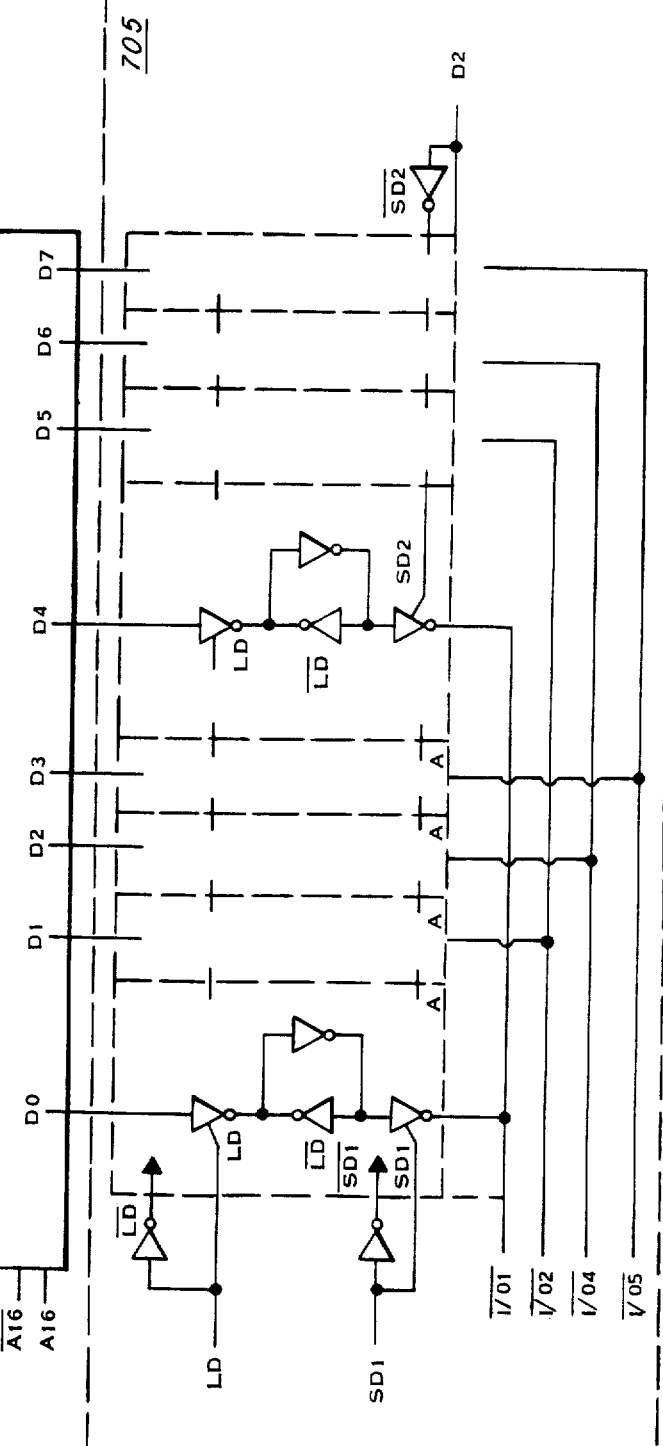

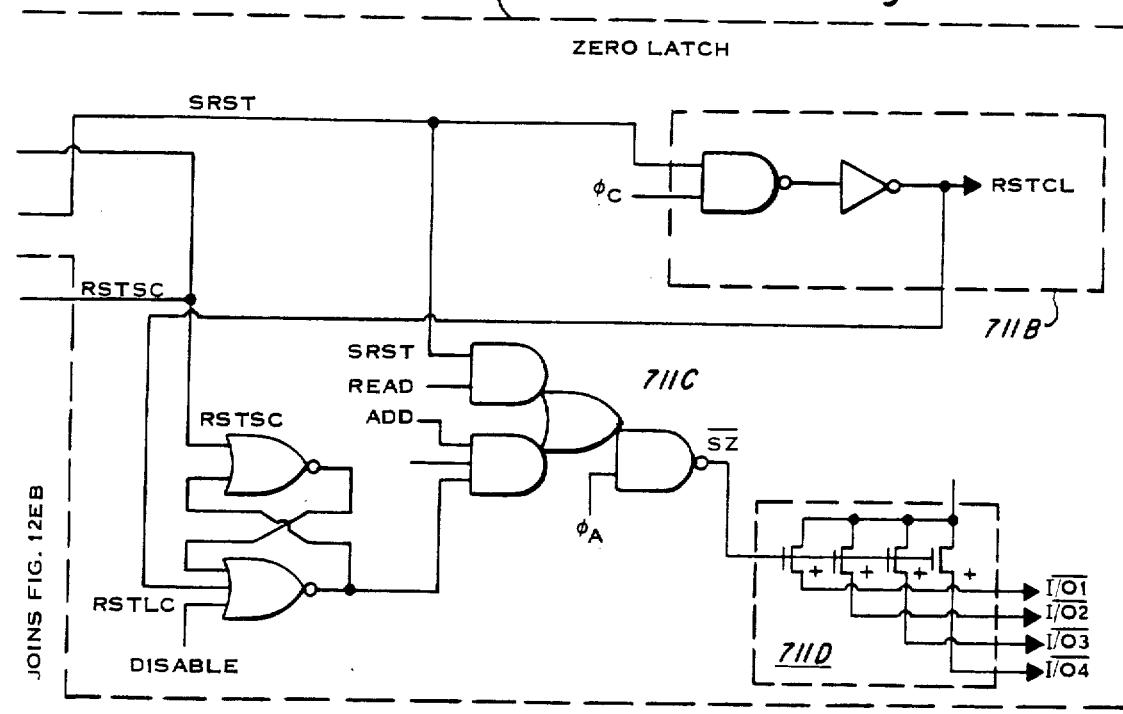
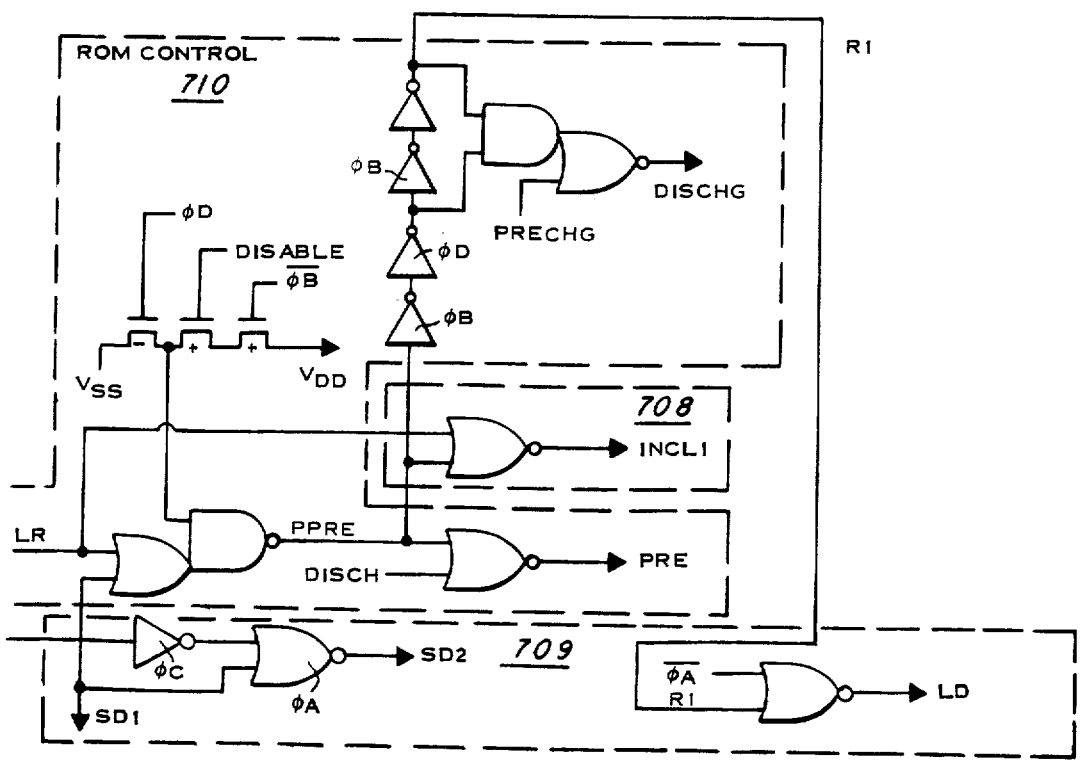
Fig. 12F

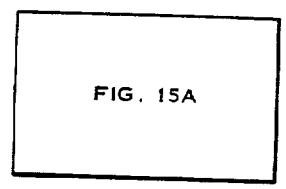
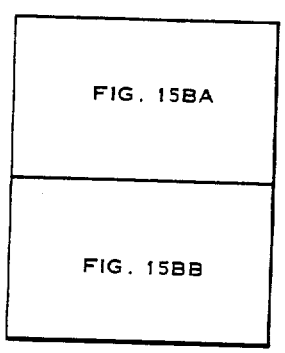
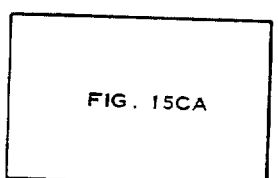
Fig. 14
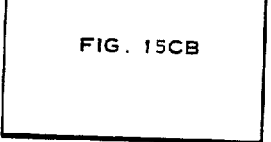
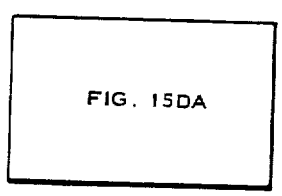
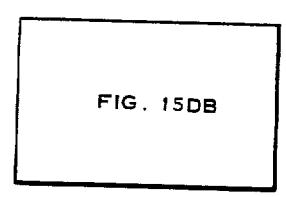
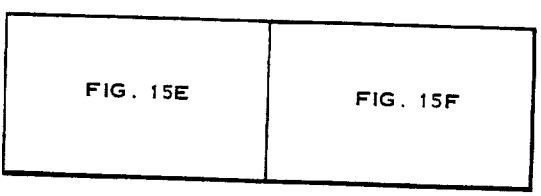
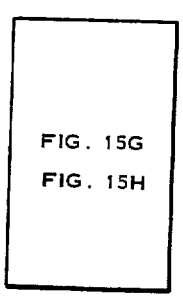
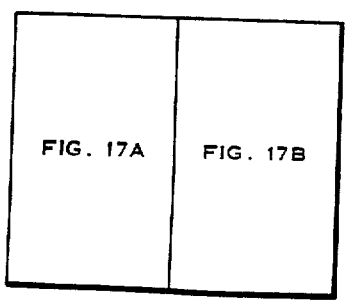
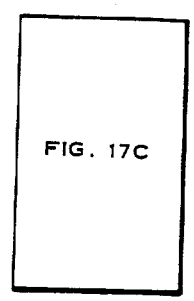
Fig. 16

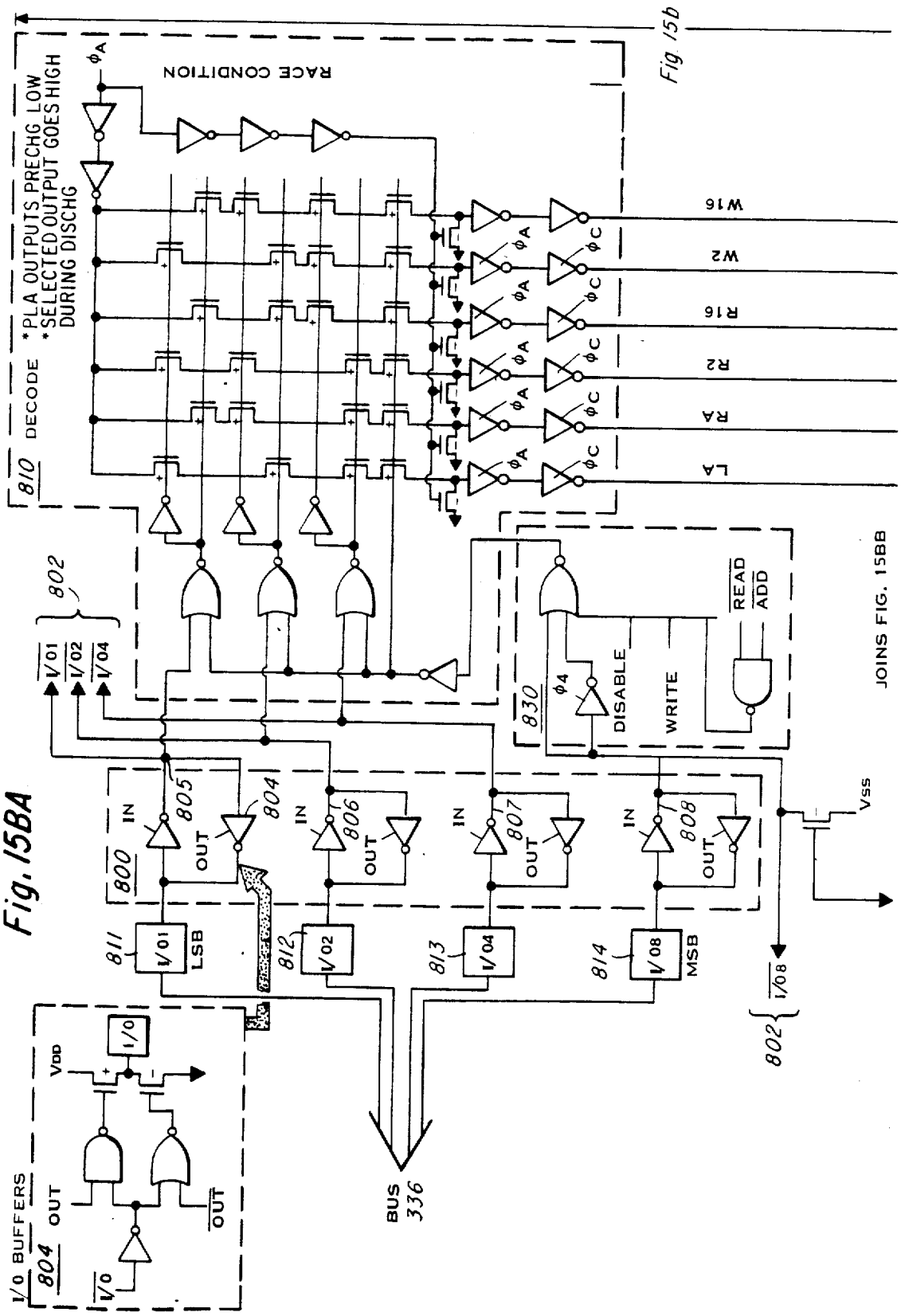

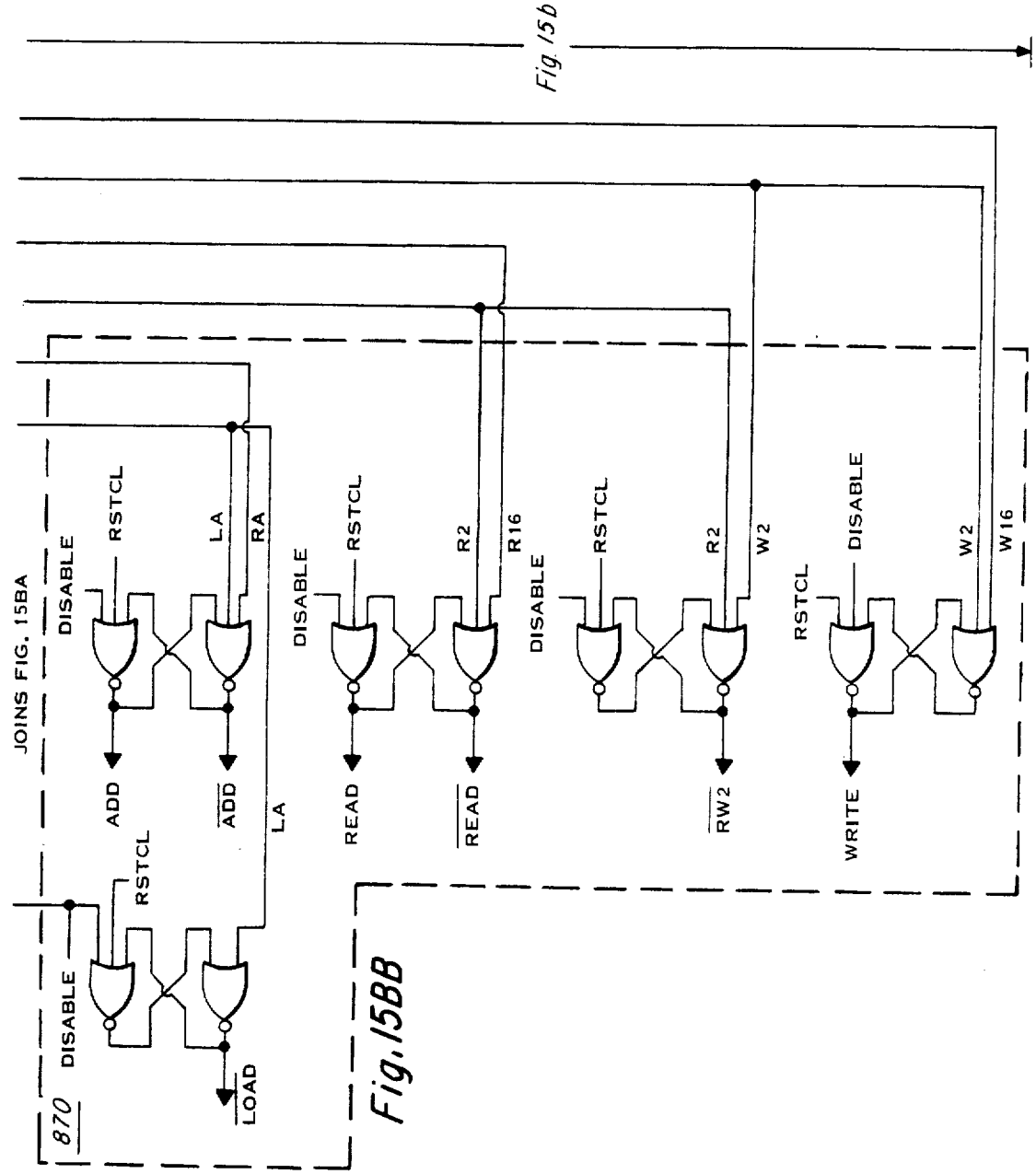

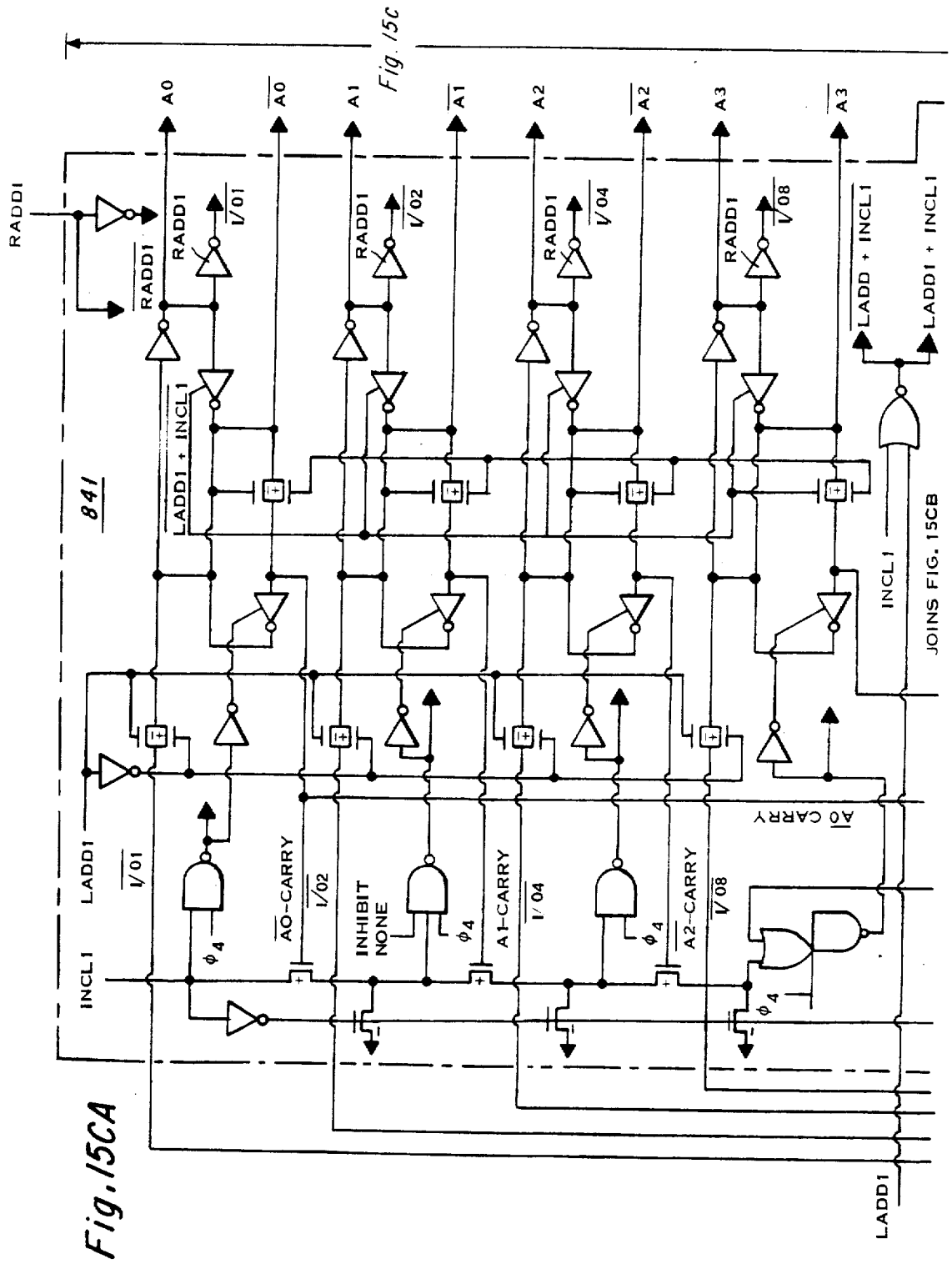

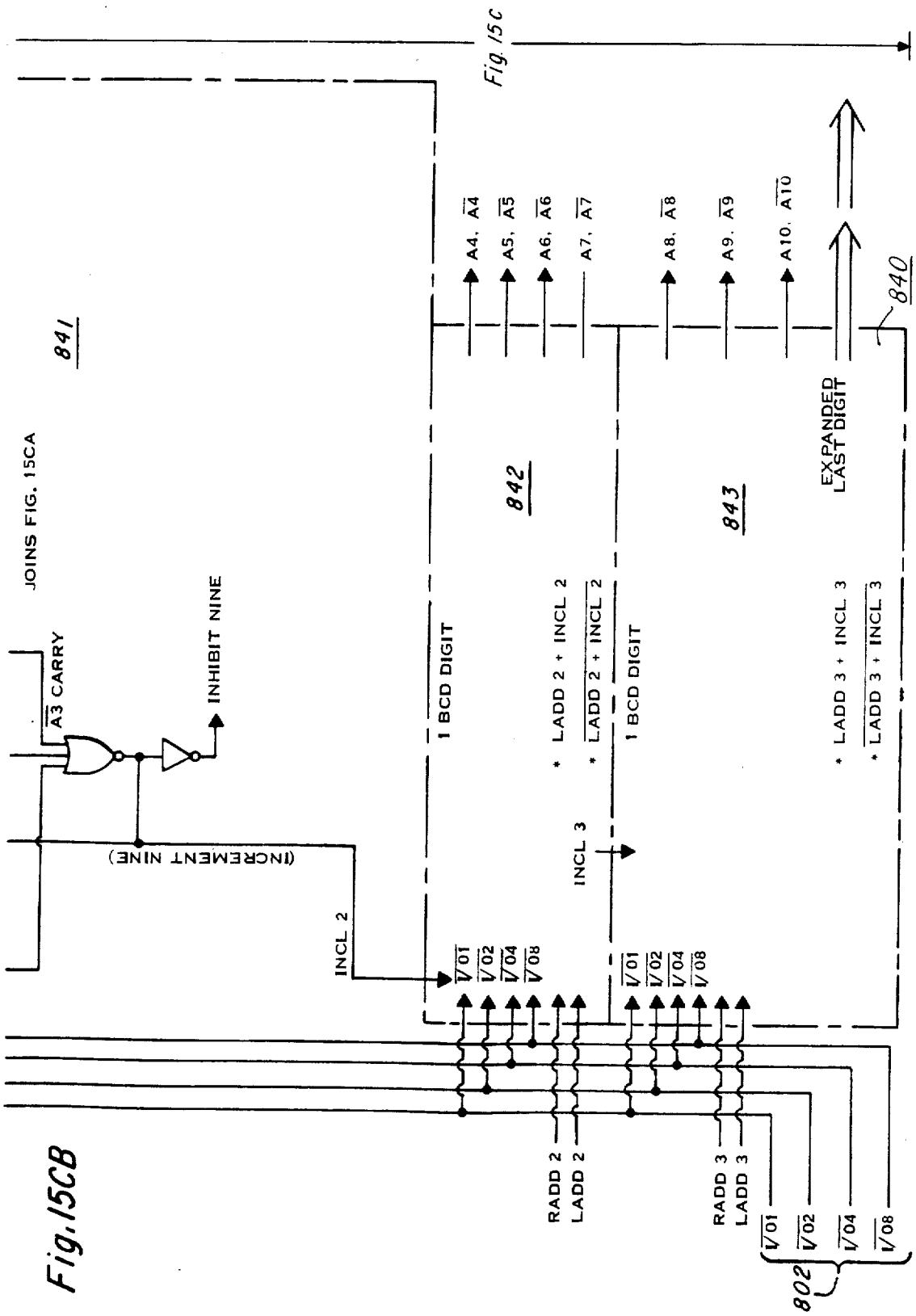

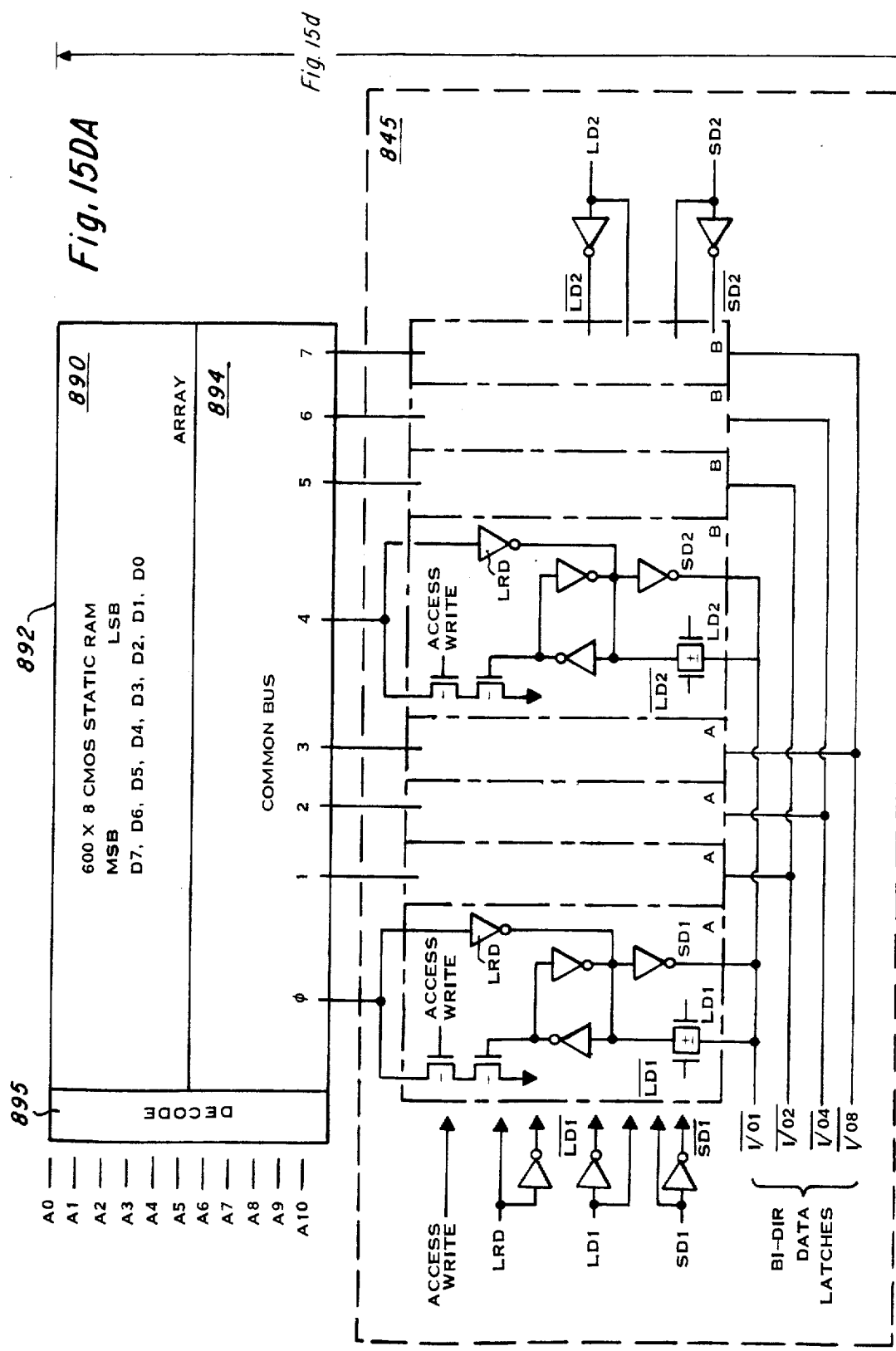

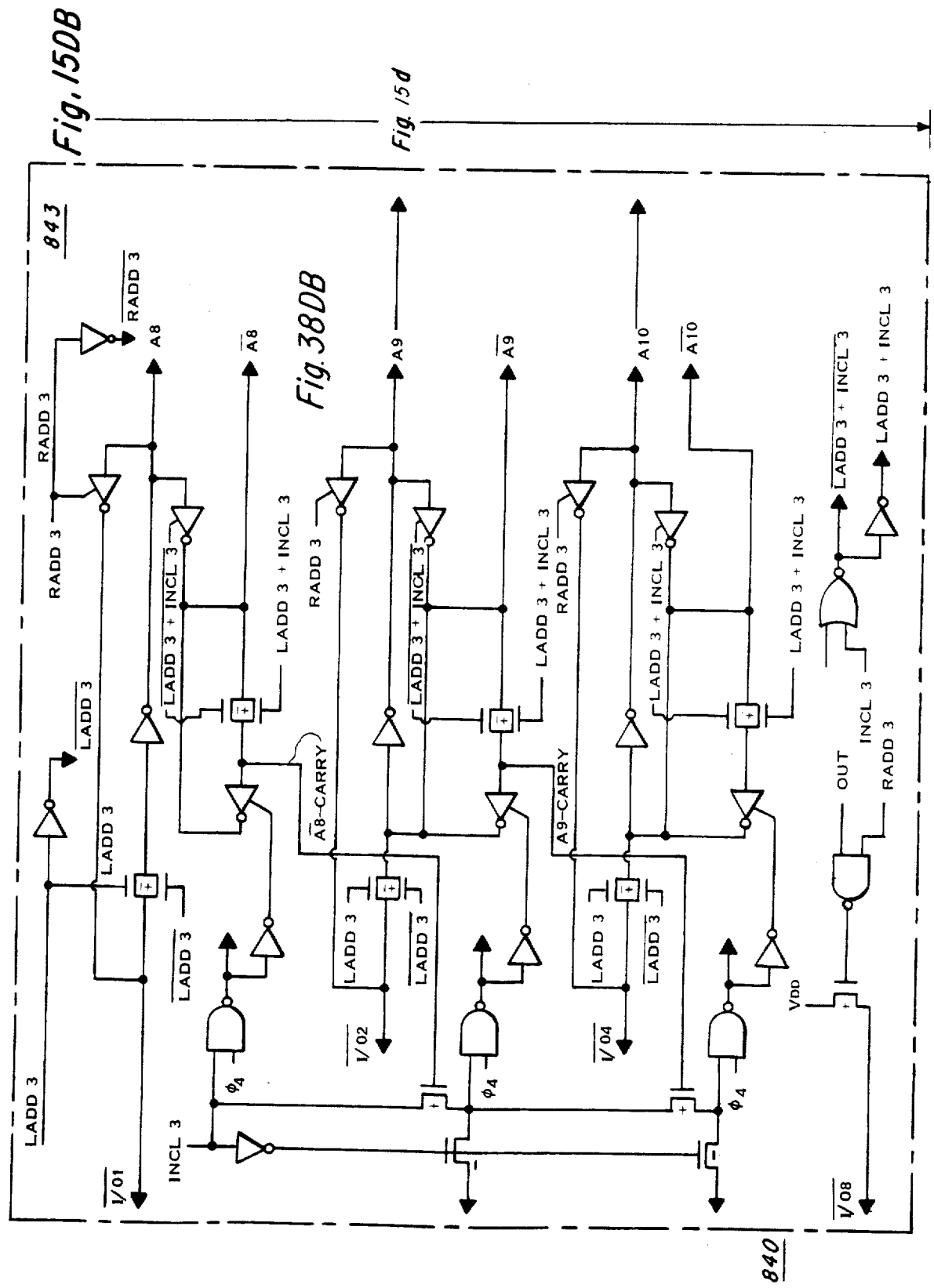

NOTE GATE TYPE:

+ ⇒ P CHANNEL
− ⇒ N CHANNEL

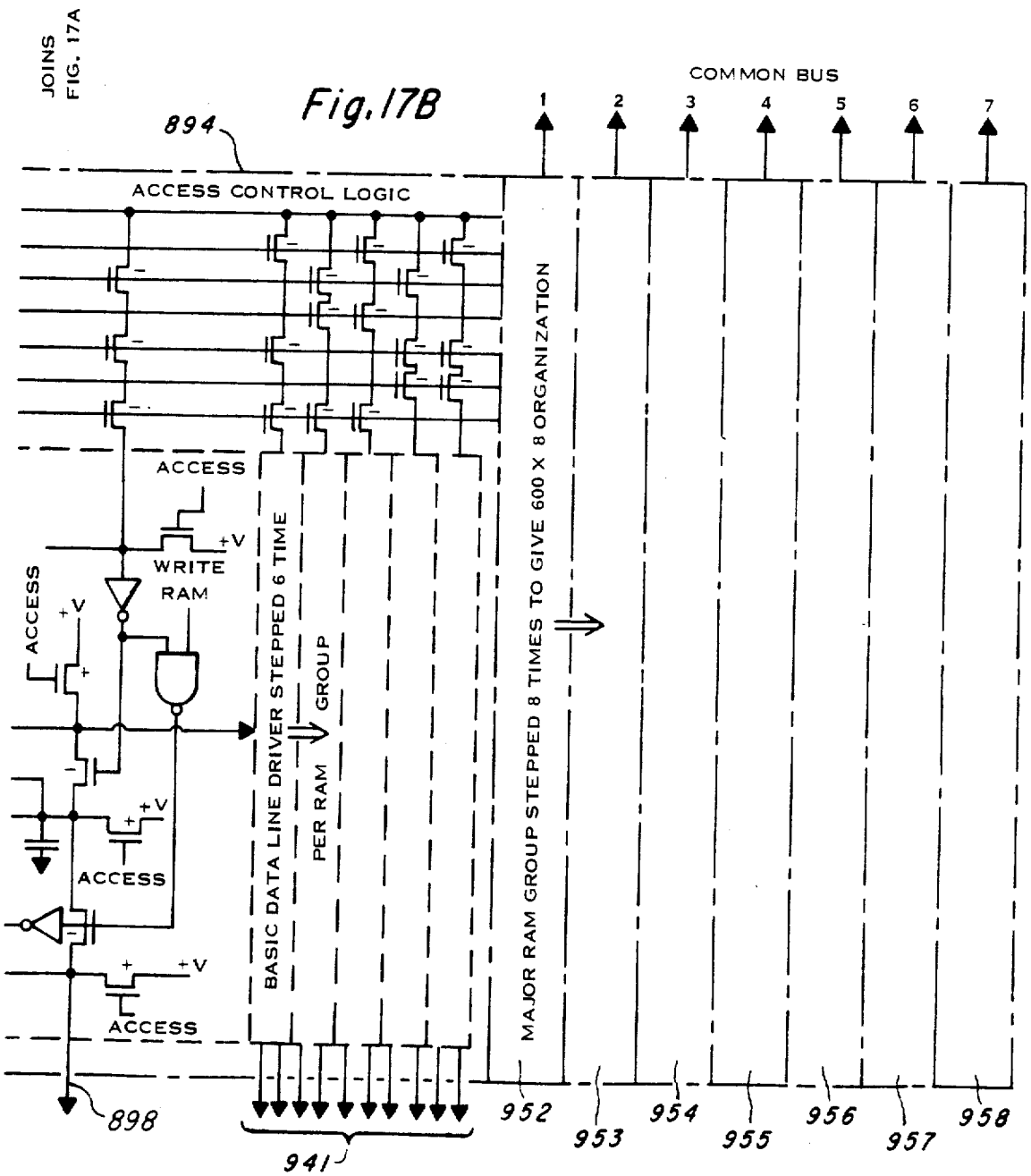

MEMORY SYSTEM WITH SINGLE COMMAND SELECTIVE SEQUENTIAL ACCESSING OF PREDETERMINED PLURALITIES OF DATA LOCATIONS

BACKGROUND OF THE INVENTION

This invention relates to a memory system and more particularly to a command responsive memory circuit for providing multiple memory location data transfers in response to single command instructions.

Heretofore, memory operations included single memory location read and write cycles responsive to a single command. This was true whether separate buses were utilized for control signals and address signals, or whether a common bus was used for address signals and control signals with a separate bus for signal type identification. As a result of the single memory location per single command communications protocol, each memory data transfer required a separate data transfer command. In many applications where it was known in advance that multiple memory locations were to be sequentially transferred to the main processor of the data processing system, the single memory location per single command communications protocol increased control program size, increased operation time (that is, decreased benchmark performance) and unnecessarily complicated the structuring of the desired function. For example, where the contents of a multidigit register are to be transferred, for example, in a calculator, a separate read or write memory command was required for each digit position to be transferred.

SUMMARY OF THE INVENTION

The present invention is a memory with variable digit addressing modes and a data processing system utilizing such a memory. This data processing system includes a controller for selectively outputting either a command, address, or data signal, the controller including a circuit for receiving an input data signal, and a memory coupled to the controller for providing either storage or retrieval of data from multiple memory locations in response to receiving a first command signal. Thus, a single command signal is sufficient to initiate multiple data transfers to or from the memory. In the preferred embodiment, this data processing system further includes a program counter for selectively storing a received address signal in response to receiving a second command signal for selectively incrementing the program counter periodically in synchronism with the transferred data signals in response to receiving the second command signal. Thus, a program counter within the memory provides sequential address outputs so as to address multiple memory locations within the memory in response to the second command signal. In the preferred embodiment, the program counter is included within said memory. Furthermore, in the preferred embodiment, the program counter further selectively outputs the presently stored program counter address in response to receiving a third command signal. In a preferred embodiment, the set of memory control sequences includes outputting data from multiple memory locations in the memory responsive to receiving a fourth command signal, and storing sequentially transferred data in multiple memory locations in the memory in response to receiving a fifth command signal. In the preferred embodiment, provision is made for storing or outputting data to or from two or sixteen memory locations within the memory. However, greater or lesser numbers of sequential data transfers to or from the memory may be provided by varying the command decode structure.

BRIEF DESCRIPTION OF THE DRAWINGS

The novel features believed characteristic of the invention are set forth in the appended claims. The invention itself, however, as well as a preferred mode of use, further objects, and advantages thereof, will be best understood by reference to the following detailed description of illustrative embodiments when read in conjunction with the accompanying drawings, wherein:

FIG. 3 is a side view of the calculator system of FIGS. 1 and 2 detailing the relative placement of components within the calculator housing;

FIG. 6 is a state command table for the communications protocol of the present invention as described with reference to FIGS. 5A–E and may better be understood in conjunction with FIGS. 5A–E;

FIG. 7B is a detailed block diagram of the system shown in FIG. 7A showing also the non-volatile memory embodiments of the memory means 624 of FIG. 7A, and FIG. 7C is a block diagram of a non-volatile memory module embodying the memory means 650 of FIG. 7B;

FIG. 9 is a drawing interrelationship layout for FIGS. 10A–G;

FIGS. 10A–G are a detailed schematic circuit representation of the read-only memory array cells 735 and associated decode circuit 714 corresponding to the memory array 636 of FIG. 7B and memory array 735 of FIG. 8;

FIG. 12AB illustrates a detailed schematic of clock generator 730 and I/O control logic 750.

FIG. 12BB illustrates a schematic diagram of command latch 702.

FIGS. 12EB and 12F and 12G and 12H illustrate reset logic 711B, ROM control 710 and enable to read ROM circuit 712.

FIG. 14 is the layout interrelationship diagram of FIGS. 15A, 15BA and 15BB, 15CA and 15CB, 15DA, 15DB, 15E and 15F, and 15G and 15H

FIG. 15BA illustrates the detailed schematic diagram of I/O buffer 800, output buffers 804, instrument command decode circuit 810 and command detect enable circuit 830.

FIG. 15BB illustrates the detailed schematic diagram of command latches 870.

FIGS. 15CA and 15CB illustrate the detailed schematic diagram of digit states 841, 842 and 843 of program counter 840.

FIG. 15DA illustrates the detailed schematic diagram of data latches 845.

FIG. 15DB illustrates the detailed schematic diagram of BCD program counter 840.

FIG. 16 is a drawing interrelationship diagram of FIGS. 17A-B;

FIGS. 17A-C are a detailed schematic diagram of the memory arrary read-write control logic 897, memory array 890, address decode circuit 895, and other memory array related circuitry as discussed with reference to FIGS. 15A-H

DETAILED DESCRIPTION OF THE INVENTION

Figure 1:
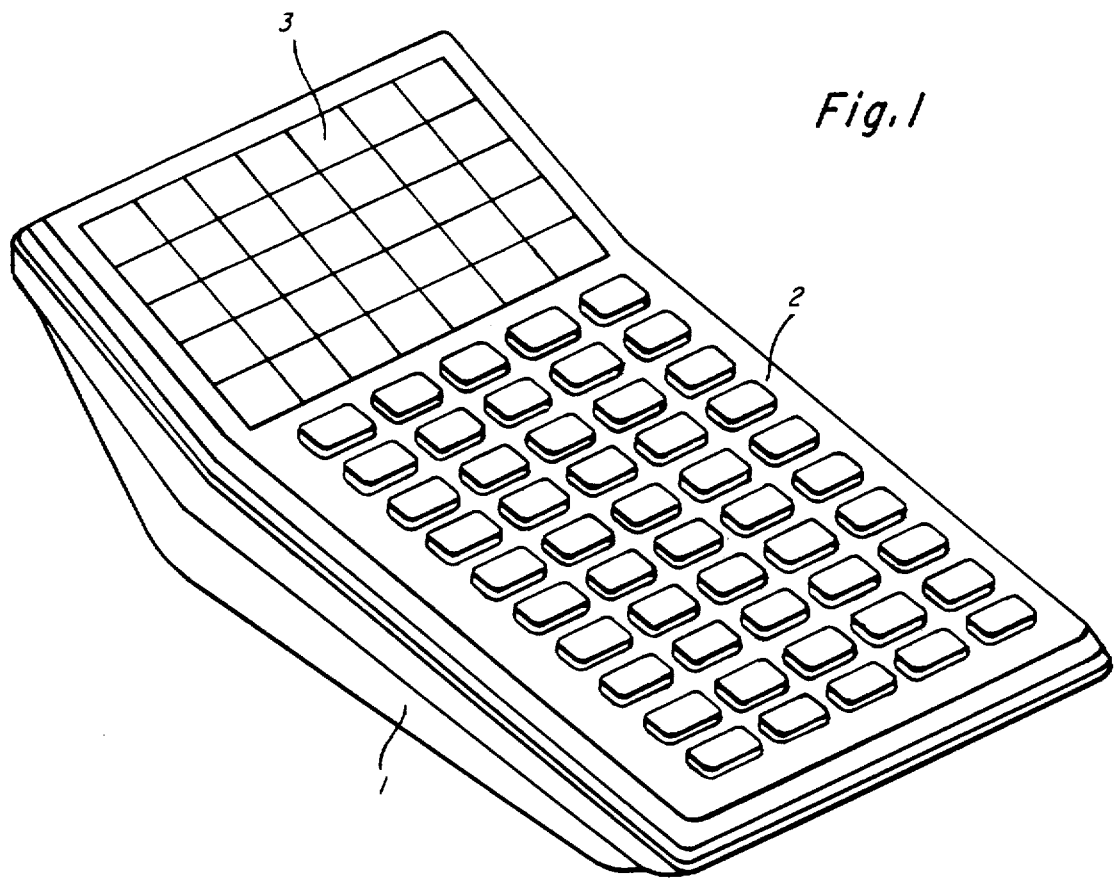
FIG. 1 is a pictoral view of a portable, electronic, handheld calculator of the type which embodies the present invention.

Referring to FIG. 1, an electronic portable calculator of the type which may employ features of this invention is shown in pictoral form. The calculator 1 comprises the keyboard 2, and the display 3. Display 3, in the preferred embodiment, consists of 16 alpha-numeric characters, each provided by liquid crystal display devices, or an array of light emitting diodes, a vacuum florescent tube display, or other display means. The display is preferably implemented having complete alpha-numeric display capability so as to be capable of displaying English language messages as well as permitting the display of data in scientific notation, or other output formats. Of course, the type of display and the number of digits displayed is a design choice. The display may be of the 7 segment, 8 segment, 9 segment, 13 segment, or 5×7 dot matric display character, depending on the character display flexibility desired. In a preferred embodiment, a 5×7 dot matrix per character position is utilized to allow for complete alpha-numeric and special character display. A keyboard, 2, or other input means, preferably includes a set of number keys (0-9), a decimal point key, a plurality of function command keys including, for example, exponential, logarithmic, trigonometric and hierarcy functions. The expotential and logarithmetic function command keys include, for example, $X^2$, $\sqrt{x}$, $1/X$, $\log X$, $\ln X$, $yx$, and $y\sqrt{X}$. The trigonometric functions include, for instance, the sine, cosine, tangent, and their inverses, the hyperbolic sine, hyperbolic cosine, and hyperbolic tangent, and inverse hyperbolic functions. Other function command keys include store (STO), and recall (RCL) keys for respectively storing and recalling a number stored in one of the memory registers. The enter exponent key (EE) allows exponent entry of the number displayed in scientific notation. A $+/-$ key is provided for changing the sign of the display number. An exchange key (X:Y) is provided for exchanging operator and operand of an arithmetic function. More conventional function command keys are supplied, including the clear key (C), the clear entry key (CE) and the plus (+), minus (−), multiply (x), divide (÷), and equal (=) keys. Other function keys, in a preferred embodiment, may include alpha-numeric variable keys (A-Z), parenthesis keys, hierarchy control keys, label key (LBL), and programmable feature function keys. The calculator is further provided with OP code keys for performing special functions such as slope, intercept, plotting operations, alpha-numeric operations, operating system hierarchy interface and control and the like.

Figure 2:
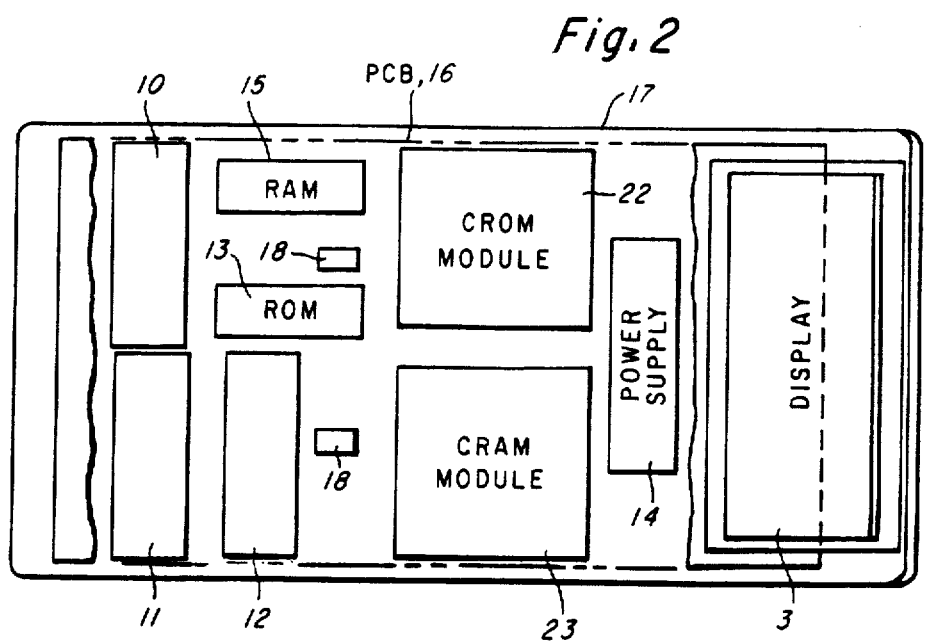
FIG. 2 is a bottom view of the calculator of FIG. 1 showing the placement of major components in the preferred embodiment of the invention of FIG. 1.

Referring to FIG. 2, a bottom view of the calculator 1 of FIG. 1 is shown. The placement of major components in a preferred embodiment of the calculator of FIG. 1 is shown. Controller integrated circuit chips 10, 11, and 12 provide the intelligence and control capabilities of the calculator system. Read/write memory 15, and read only memory 13, provide additional base system data storage beyond that provided on the controller chips 10, 11, and 12. A power supply 14 provides all necessary working voltages to the remainder of the calculator system's electronic components. The controller devices 10, 11 and 12, the read/write memory 15, the read only memory 13, and the power supply 14 are mounted to a main printed circuit board 16 within a calculator case 17. Additionally, compartments within the calculator case 17 are coupled to the main printed circuit board 16 to allow for interconnection of plug-in memory modules 22 and 23 for interconnection to the controller chips 10, 11 and 12.

Referring to FIG. 3, a side view of the calculator system of FIGS. 1 and 2 is shown, detailing the relative placement of the controller chips 10, 11, and 12, the display 3, the keyboard 2, printed circuit board 16, and the memory modules 22 and 23, within the calculator case housing 17.

Figure 4A:
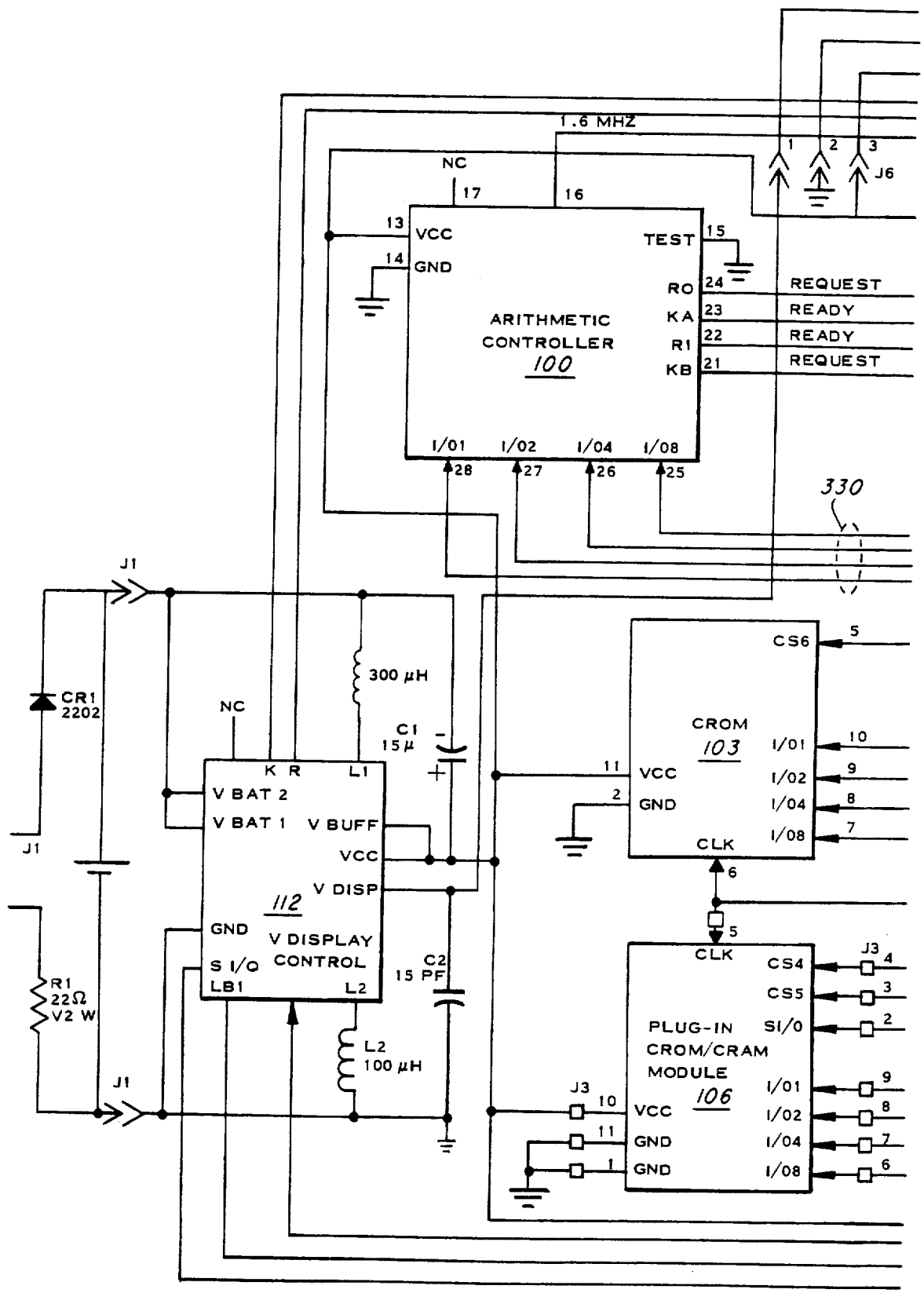
FIGS. 4A–C form a detailed schematic logic diagram of a preferred embodiment of the modular calculator system implemented in the calculator of FIG. 2.
Figure 4B:
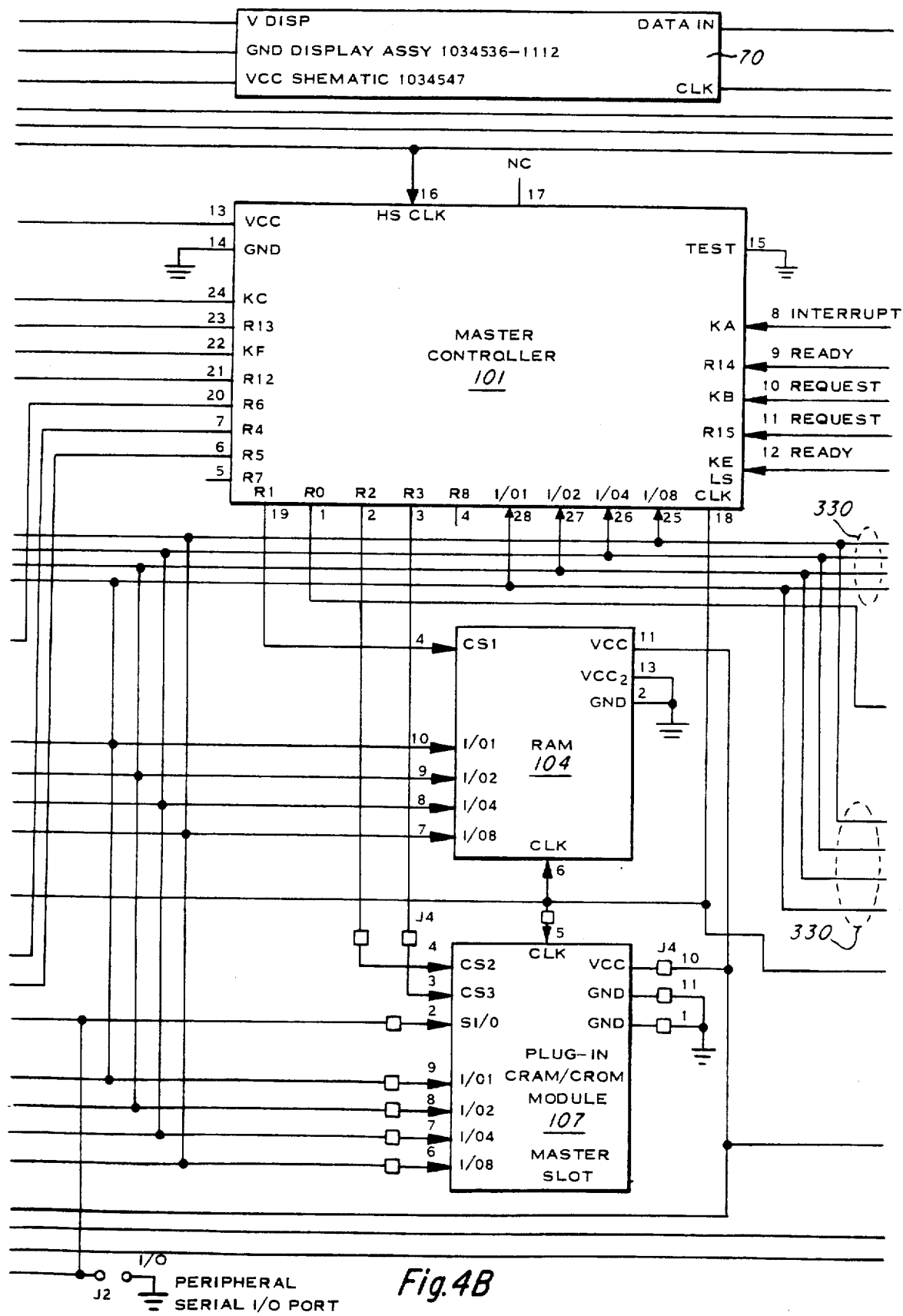
Figure 4C:
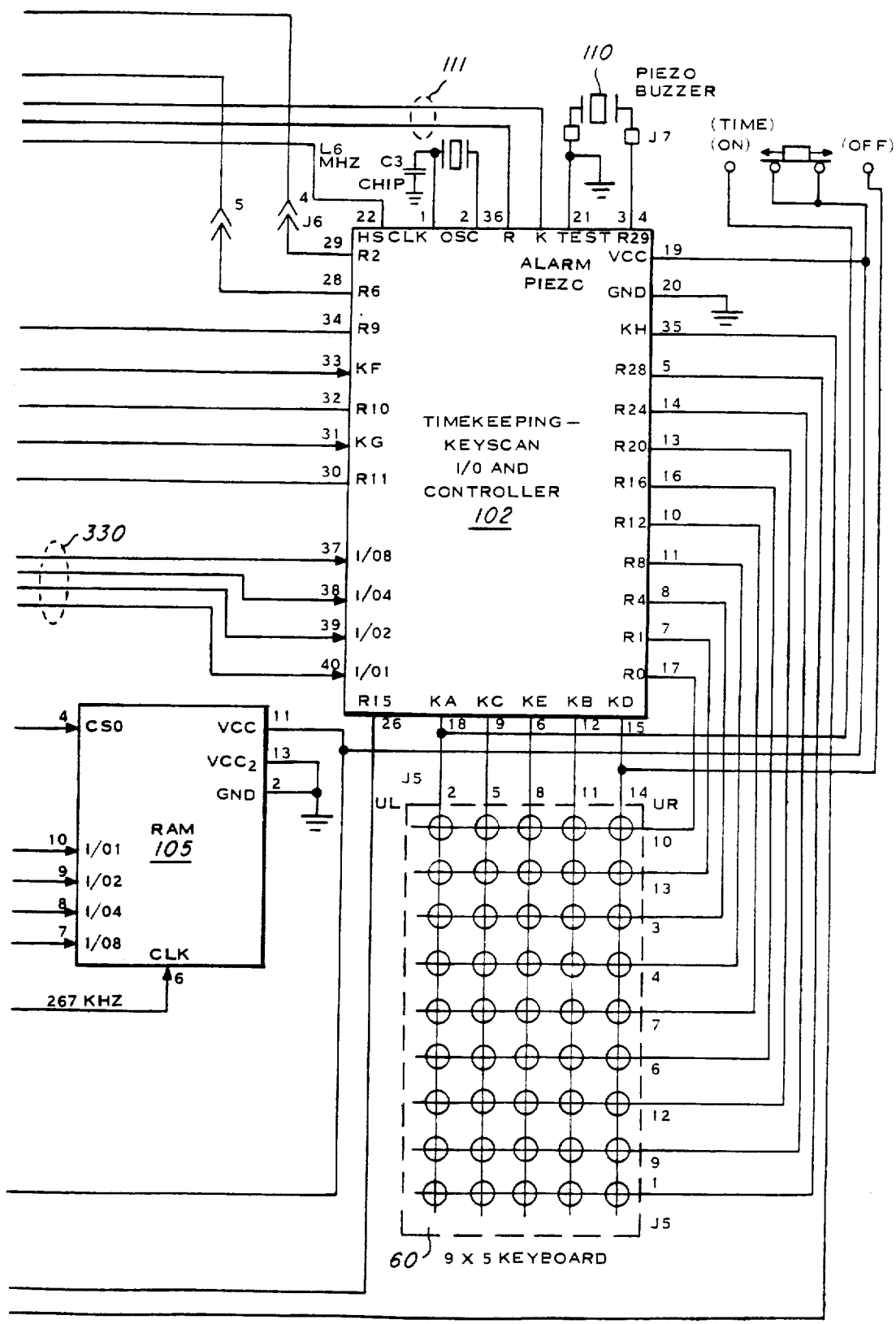

Referring to FIGS. 4A-C, a detailed schematic of an embodiment of the calculator system as implemented in the calculator 1 of FIG. 2 is shown.

The calculator system of FIGS. 4A-C may be comprised of a controller expandable in functional blocks, for providing arithmetic processing and data manipulation and processing such as the arithmetic controller 100, master controller 101 and timekeeping I/O controller 102; an input device, such as the keyboard 60, coupled to the controller for providing outputs to the controller in response to an externally supplied stimulus; a memory such as the memory 103, 104, 105, 106, and 107, expandable in partioned blocks, coupled to the controller, for storing data and providing data outputs to the controller in response to receiving select inputs; display interface means, such as the cascadable display drivers 70 and display interface chip 112, expandable in partioned blocks, coupled to the controller, for receiving outputs from the controller representative of a desired character display, and providing display drive outputs corresponding to the desired character display compatable in voltage and timing with a selected display technology such as a liquid crystal display; and a display device such as a liquid crystal display, expandable in partioned blocks corresponding to the partioned blocks of the display interface device and connected thereto, the display means being of the particular display technology compatable with the display interface means and timing such as that output from that controller 112, for receiving the outputs from the display interface means and for providing a visable representation of the desired character display in response thereto. As is described in greater detail in copending application Ser. No. 168,853, filed July 14, 1980 the cascadable display driver 70 is comprised of a master display driver and at least one slave display driver, each display driver forming a partioned block of the display interface means. The master display driver is coupled to the controller and coupled to one of the slave display drivers, the master display driver converting a received output from the controller into a slave communication output for connection to the first slave display driver, all other slave display drivers being connected in a daisy chain with the first slave display driver. Each slave display driver couples the slave communication output from the proceeding slave display driver to the next slave display driver.

In the preferred embodiment, the calculator system of FIGS. 4A–C includes a controller means 30 expandable in functional blocks, for providing arithmetic processing and data manipulation and processing in the master controller 101, and timekeeping I/O functions in controller 102. In the preferred embodiment, the controller 100 of FIG. 4A is combined to be contained with the controller 101. The master controller 101 is coupled to the I/O controller 102 to allow for communication between the individual controllers. The memory shown in FIGS. 4A–C is comprised of on-board read only memory 103 and on-board read/write memories 104 and 105, as well as plug-in memories 106 and 107 which may be either read only, read/write or a combination thereof. The external stimulus means 60 is shown in part as a 9×5 keyboard coupled to the I/O controller 102 of the controller. Additionally, the I/O controller 102 is coupled to an external peripheral piezoelectric buzzer 110, and has provisions for connection to an additional external peripheral, such as printer connection 111. The display interface 40 is comprised of the cascadable display drivers 70 and the display interface voltage controller chip 112. The display voltage controller chip provides regulated multi-voltage power source supplies for the liquid crystal display, as well as for providing regulated power supply voltages to the integrated circuit chips of the calculator system of FIGS. 4A–C.

Referring again to FIGS. 4A–D the controller is coupled to the memory by a four bit bidirectional bus having either command, address, or data signals, present thereon, only one of these signals being present on the bus at any time as shown by bus 330 of FIGS. 4A–C. The processors embodied by controllers 100-102 of FIGS. 4A–C, is coupled to the common bus 330 for selectively transmitting (outputting) command, data, and address signals onto this common bus. The processor means includes for receiving certain other command, data, and address signals from the common bus. The memory 103, 104, 105, 106, and 107, of FIGS. 4A–C is coupled to the processor via the common bus, the memory for storing and outputting data. The memory includes means for selectively transferring (outputting or storing) data with the processor in response to receiving one of a unique subset of command signals. The memory may be comprised of read-only or read-write memories, or both. In the preferred embodiment, the processor further includes means for selectively providing an active chip select control signal, and the memory is responsive to the unique subset of said command signals only when an active chip select control signal is received. In the preferred embodiment, the chip select signal is coupled to the memory seperate from the common bus. Additionally, in the preferred embodiment, a clock signal is coupled from the processor to the memory on yet another seperate bus, and the memory stores and transmits data in synchronisim with the received clock signal.

Figure 5:
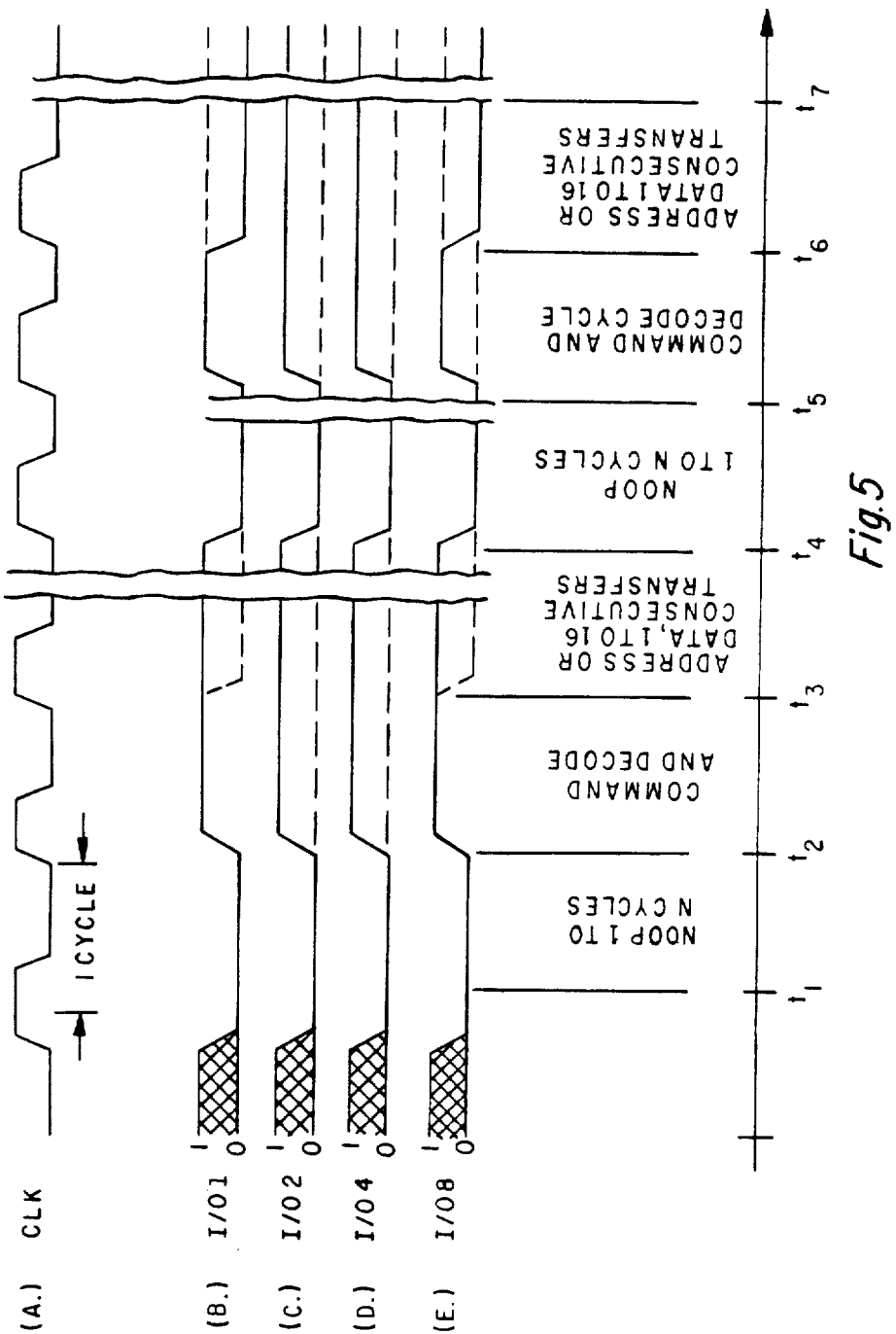
FIGS. 5A–E are a signal waveform timing diagram of the signal transfer protocol for the common bus 330 as shown in FIGS. 4A–C.

Referring to FIGS. 5A–F, a signal waveform timing diagram is shown. The signal transfer protocol for the common bus as embodied in the present invention is shown in FIGS. 5A–F. Referring to FIG. 6, a state command table for the communications protocol of the present invention is shown. The timing waveforms of FIGS. 5A–F and the state transistion table of FIG. 6 may each be better understood by being viewed together. Referring to FIG. 6, and specifically referring to sequence of states 00 to 0F, it is shown that so long as the chip select control signal is at a zero (inactive) logic level and is not responsive to the common bus 330 the memory chip to which the chip select is coupled is deselected. Referring to sequence state 10 of FIG. 6, it is shown that when the chip select coupled to a particular memory means is at a logic 1 level, then the common bus is selected as to that particular memory. When the chip select is at a logic one (active) level and the common bus I/O lines I/O1, I/O2, I/O4, and I/O8 are all at the logic zero level, the common bus is in the "no-op" state. Referring to FIGS. 5A–E, clock cycles T1 and T4, it is seen that the no-op condition may be from one to N cycles long, depending on the time lag between a command sequence ending, and a subsequent command sequence commencing. When a command sequence is completed, the device responding to the command forces a no-op state condition onto the common bus prior to its outputs going high impedance via a zero output circuit as described in greater details with reference to 711D of FIG. 12F, and 889D of 15F. The I/O latch maintains the common bus at the no-op state signal levels after the memory output lines go to the high impedance state. A command is decoded as commencing when the chip select is at a logic one level (active) and when a predetermined bit position of the common bus, I/O 1 in a preferred embodiment as shown in FIGS. 5A–F and 6, switches from a logic zero level to a logic 1 level, and when the previous state of the common bus was a no-op state. These conditions define the command commencement transition. The remaining bit positions of the common bus define the instruction to be performed upon detection of a command commencement transition. As shown in FIG. 6, at sequence state addresses 18-1F, commands to which the memory of the present invention are responsive (the command subset) include the load address command, read address command, read two digits from memory command, read sixteen memory digits from memory command, and where the memory is a read/write memory, the additional two commands of write two digits to memory and write sixteen digits to memory. The memory performs separate memory cycles responsive to each of said commands. Referring to FIGS. 5A-F, the common bus communications protocol as utilized in the preferred embodiment of the present invention is shown. FIGS 5C-F correspond to the common bus lines, FIG. 5B corresponds to the chip select line coupled to a particular memory means, and FIG. 5A corresponds to the clock signal coupled from the processor means to the memory means. Each time period, T1-T7, is synchronized with the clock signal of FIG. 5A. Referring to time period T1, with the chip select signal at a logic one level, and the I/O bus is at a logic zero level on all bit positions, the common bus contains a no-op state command. Following the no-op state of period T1, period T2 shows a command decode state of signals on the common bus, triggered by the transition (command commencement transition) of I/O 1 at the start of period T2. The I/O lines of FIGS. 5D-F are interpreted by a command decode circuit within the memory according to the communication protocol of FIG. 6 states 19-1F, as described with reference to FIGS. 7A-C. Referring to time period T3, data is transferred on the common bus in accordance with the instruction decoded during time period T2. Thus, address data may be selectively transferred to the memory to load into an on chip program counter responsive to the load address command, or the memory program counter contents may be selectively read from the memory program counter onto the common bus responsive to the read address command or multiple digits of data may be selectively read out of storage (retrieved) in the memory responsive to the read two digits and read sixteen digits commands, or multiple digits of data may be selectively written into storage in the memory responsive to the write two and write sixteen digits commands. The time period T3 is variable, with the number of consecutive transfers, (memory cycles) corresponding to the decoded command. Referring to time period T4, a no-op state is forced onto the common bus by the memory following the completion of the command cycle. This no-op state will be maintained by the I/O latch until such time as a device coupled to the common bus outputs of a signal other than a no-op state signal. When a subsequent command commencement transition is detected it triggers the start of the command and decode cycle of period T5, corresponding to period T2. Time period T6 corresponds to time period T3 in that address or data is transfered on the common bus during this time period in accordance with the decoded command. As can be seen from FIGS. 5A-F the basic command cycle consists of a no-op state time period such as T1, followed by a command and decode time period such as T2, followed by a data transfer time period such as T3, and finally followed by a no-op state time period such as T4 to end the command cycle.

Figure 7A:
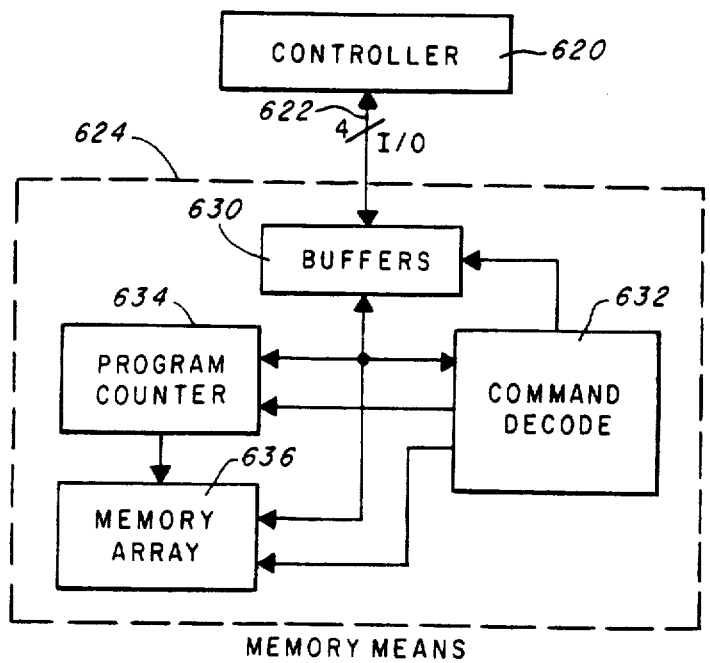
FIGS. 7A–C are block diagrams of systems embodying the command protocol as discussed with reference to FIGS. 5A–E and 6, the I/O latch and the modular system as discussed with reference to FIGS. 4A–C, with FIG. 7A embodying a block diagram of a system having a memory means (either read-write, or read-only, or both types of memories)

Referring to FIG. 7A, a block diagram of a memory system embodying the command protocol as discussed with reference to FIGS. 5A-F and 6, and the modular system as discussed with reference to FIGS. 4A-C is shown. A controller 620 including an I/O pulldown latch is coupled to a common I/O bus 622. The controller 620 provides command, data, and address signals onto the bus 622. A memory 624 is coupled to the I/O bus 622. The memory 624 is comprised of buffer amplifiers 630, command decode 632, program counter 634, and memory array 636. The signals received from the I/O bus 622 are buffered by the buffer amplifiers 630. The output from the buffer amplifiers 630 is coupled to the command decode 632, the program counter 634, and the memory means 636. The output from the buffer amplifiers 630 is selectively coupled to the command decode 632, program counter 634 or memory array 636, in response to an output signal from the command decode. The operation of the circuit of FIG. 7A may be better understood by tracing a complete cycle of the command protocol. Assuming first that the signals present on the I/O bus 622 are at the no-op state, the controller 620 outputs a command signal onto the bus 622 which is coupled to the memory 624, and specifically to the buffer amplifiers 630. The output from the buffer amplifiers 630 is coupled to the command decode 632 (instruction decode) which detects the command commencement transition and proceeds to decode the particular received command. Responsive to the received command from the controller 620, the command decode 632 provides an active decode output signal to the buffer amplifiers 630 to direct the output frm the amplifiers to the program counter 634 or the memory array 636. Additionally, responsive to the received command signal, the command decode provides an active one of a second group of decode output signals to the program counter 634 and provides an active one of a third group of decode output signals to the memory array 636. The program counter 634 in response to the active decode output signal of the second group either stores received data from buffer amplifiers 630 within a counter memory, outputs the present program count value from the counter memory to buffer amplifiers 630 to be coupled to the I/O bus 622, or outputs the program count value to the memory array 636. The memory array 636 stores received data from the buffer amplifiers 630 at the location specified by the program counter output or outputs stored data from the location specified by the program counter output to the buffer amplifiers 630 for coupling to the I/O bus 622, responsive to the received active decode output signal of the third group from the command decode 632 and in response to the received output from the program counter 634. Upon completion of the command initiated (originated) cycle, the memory 624 outputs signals at the no-op state onto the bus 622 to prepare the system for a subsequent command cycle.

Figure 7C:
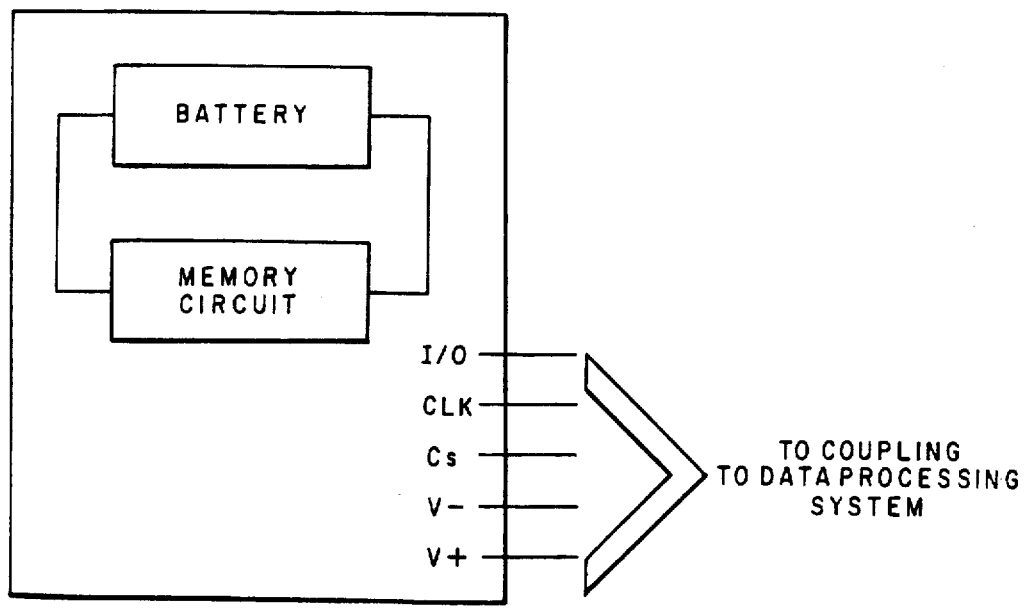
Figure 7B:
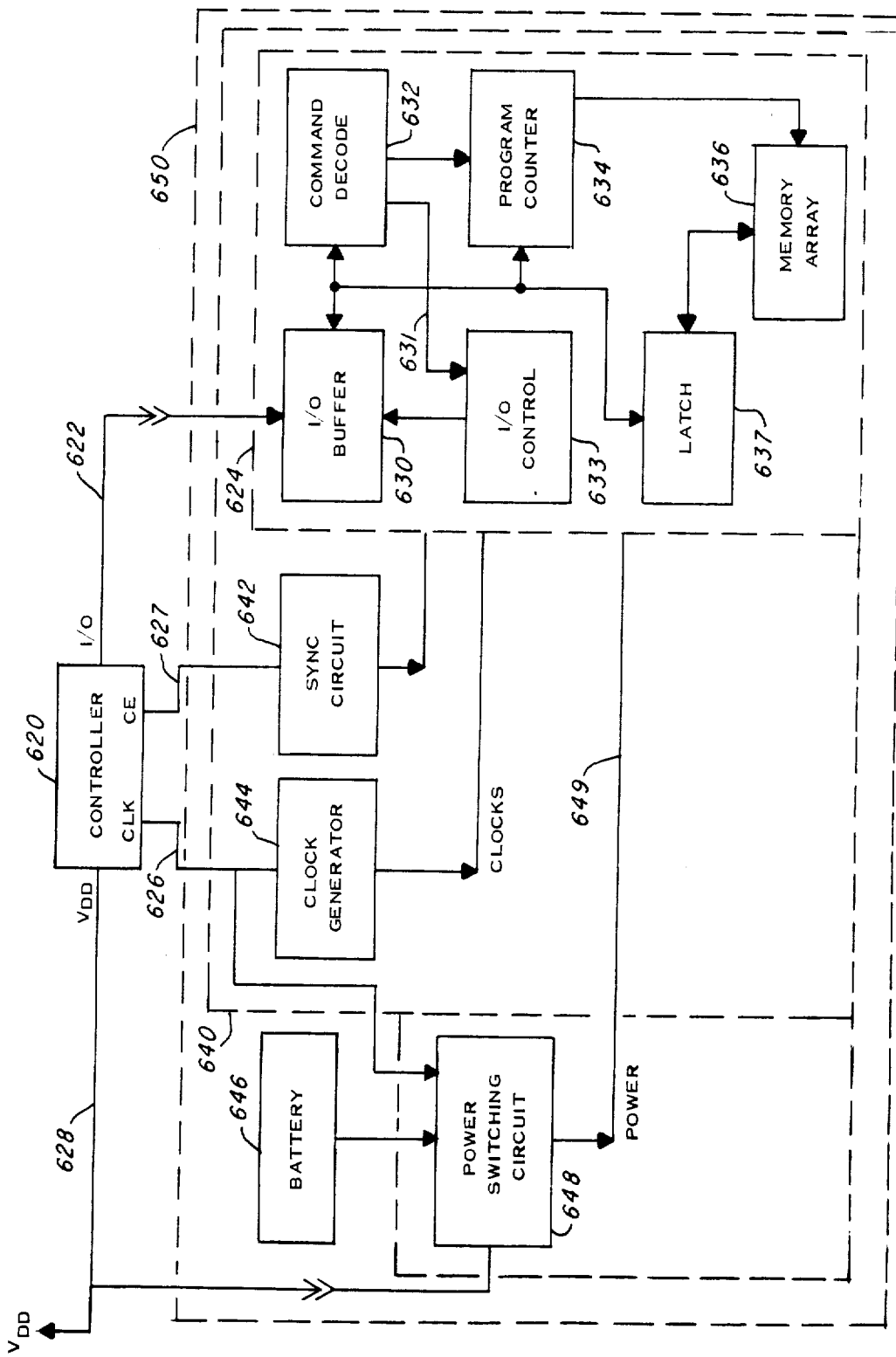

Referring to FIG. 7B, a more detailed block diagram of FIG. 7A is shown. The memory 624 is shown as further comprising an I/O control 633 coupled to the buffer amplifier 630 and command decode 632. The I/O control 633 selectively couples one of a data bus, an address bus, and a control bus within the memory 624 to the common I/O bus 622 via the buffer amplifiers 630 responsive to a fourth command signal 631 received from the command decode 632. The command decode 632 provides the fourth control output 631 in response to receiving selected ones of the command signals. Additionally, the memory 624 is shown as being further comprised of a latch 637 coupled to the buffer amplifier 630, the command decode 632, and the memory array 636. The latch 637 provides data word size and format conversion to allow an 8 bit wide memory array 636 to couple to a 4 bit wide I/O bus 622 in the preferred embodiment. This concept may be expanded to other word size conversions. Alternatively, the memory array 636 may be comprised of an array organized of the same word width as that of the I/O bus 622 thereby obviating the need for a word size format conversion and for the latch 637. In a preferred embodiment, an integrated circuit 640 includes the memory 624 coupled to a synchronization circuit 642, to a clock generator circuit 644. When the memory array 636 is a read/write memory array, the integrated circuit 640 further includes a power switching circuit 648. In the read/write memory preferred embodiment, the power switching circuit 648 provides a power output 649 coupled to the memory 624. In the preferred embodiment, the integrated circuit 640 is mounted within a housing 650, which is a portable housing provided for coupling and mounting into a module receipt compartment within the housing that contains the controller 620. The module 650 provides for coupling of a synchronizing oscillator clock signal 626 to the clock generator 644. The clock generator 644 provides clock outputs to the memory 624 responsive to the received clock signal 626 from the controller 620. Additionally the module 650 has provision for coupling to a chip enable or chip select output 627 from the controller 620 to the sync circuit 642 of the integrated circuit 640 of the module 650. Responsive to the chip enable signal 627, the sync circuit 642 selectively provides an enable output to the memory 624 so as to activate command decode 632 and related circuitry within the memory 624 so as to be responsive to the signals on the I/O bus 622. Furthermore, the module 650 has provision for coupling the main power source of the controller 620 which may be a battery contained within the common housing of controller 620, or may be an externally provided power source. In a read only memory (ROM) embodiment of the memory array 636 (where the module 650 is a read only memory plug in module) the main power source 628 is coupled to the integrated circuit 640 and directly to the memory means 624. However, in a read/write memory (RAM) embodiment of the memory array 636 and therefore, in a read/write memory plug in module 650, the main power source 628 is coupled to the integrated circuit 640 only via power switching circuit 648. Additionally, in the read/write memory embodiment of the module 650, an independent power source, battery 646, is contained within the module 650 and coupled to the power switching circuit 648 of the integrated circuit 640 as shown in FIG. 7C. The output from the power switching circuit 648 provides a constant power output 649 to the memory 624, either from the main power source 628 of the controller 620 or from the battery 646 of the module 650. The power switching circuit 648 provides uninterrupted power before, during, and after coupling to the main power source 628.

The power switching circuit 648 is coupled to the clock output 626 via the clock output coupling of the module 650. The power switching circuit 648 provides the power output 649 from the main power source 628 when the main power source 628 is coupled to the power switching circuit 648 and a predetermined number of clock signals are received from the clock output 626, detected and counted by the power switching circuit 648 and a predefined count is reached, or alternatively after a fixed time interval has expired during which the clock outputs are properly (continuously) received. Alternatively, when the power switching circuit 648 is not coupled to the first power source 628, or when the power switching circuit 648 is coupled to the first power source 628 but the predefined number of clock signals (for the predetermined time) has not been received via the clock output 626, then the power switching circuit 648 provides said power output 649 from the module battery 646. Thus, the RAM module 650 includes the power switching circuit means 648, within the integrated circuit 640, to provide a non-interrupted power source, 649, to the read/write memory cells in the memory array 636, from either the battery 646, or the external power source 628, independent of the status of coupling to the external power source 628. This results in a non-volatile, removable, read/write memory allowing for both in calculator program development and simultaneously providing a removable transportable non-volatile program storage file.

In the preferred embodiment, the memory 624 is responsive to the command signals from the controller 620, such that the memory 624 selectively performs, either storage or retrieval of data to or from multiple locations in the memory array 636 in response to particular command signals, and in response to address signals as output from program counter 634. The memory 624 includes means responsive to other command signals for selectively storing address signals in the program counter 634 in response to receiving a first other command signal and the corresponding address signal in a single command memory cycle as part of the command protocol; and means for selectively automatically incrementing program counter 634 in synchronism with each of the received or transmitted (transferred) data signals, synchronized to the clock output 626 of the controller means 620, in response to these particular command signals. Thus, in response to particular single command signals, the memory 624 provides multiple memory cycles of data storage or retrieval, with the program counter automatically incrementing. Thus, responsive to a first command signal and a corresponding address signal output from program counter 634, the memory 624 outputs data from multiple memory locations, comprising but a single command memory cycle. In the preferred embodiment, means are provided for outputting data from two memory locations or from sixteen memory location, within the memory 624, in response to a read two location command signal or a read sixteen location command, respectively. Additionally, the memory 624 is responsive to a second command signal and a corresponding address signal output from program counter 634 so as to store received data signals (sequentially transferred data signals in the preferred embodiment) in multiple memory locations within the memory array 636 in the memory 624. The means for storing multiple data signals responsive to a single command signal in a single command cycle is responsive to a third command signal (store two location command) so as to store sequentially transferred received data in two memory locations within the memory, and is responsive to a received fourth command (store sixteen location command) so as to store sequentially transferred received data in sixteen memory locations within the memory 624. As discussed above, the memory 624 may be comprised of a read-only memory within the memory array 636, in which case the "store in memory location" instructions are not applicable. Alternatively, the memory 624 may be comprised of a read/write memory within the memory array 626, in which case memory 624 is responsive to both store and read commands. The read-only memory embodiment and read/write memory embodiment of the integrated circuit 640

(and of the module 650 incorporating this integrated circuit) are each discussed separately with reference to detailed block diagrams and corresponding detailed circuit schematics corresponding to the integrated circuit 640 of FIG. 7B. The read-only memory embodiment is detailed in FIGS. 8-13, while the read/write memory embodiment is detailed in FIGS. 14-19.

Figure 8:
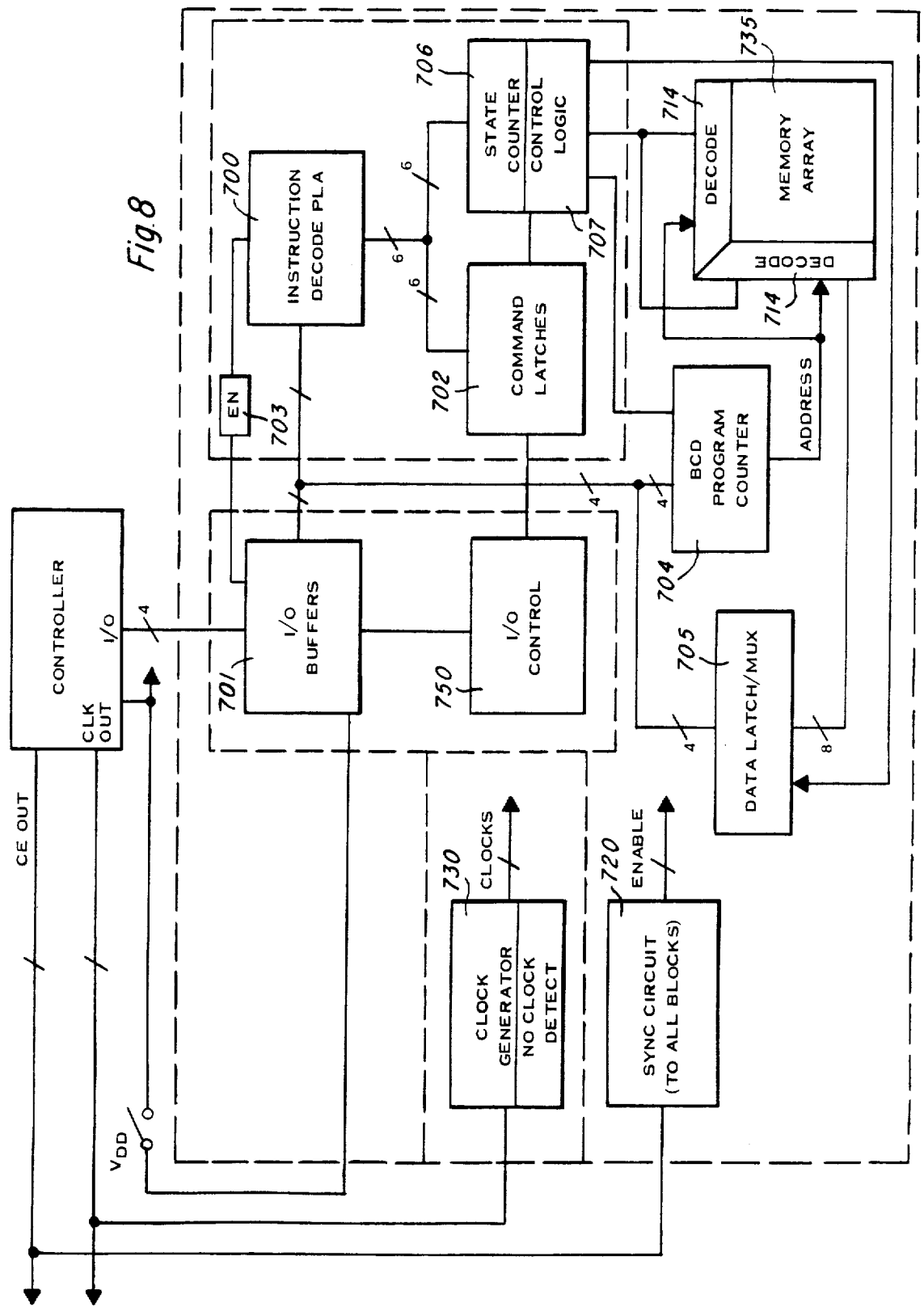
FIG. 8 is a block diagram of the system of FIG. 7A detailing the read-only memory embodiment of the integrated circuit 640 as shown in a removable and transportable module such as module 650 of FIG. 7B.
Figure 10A:
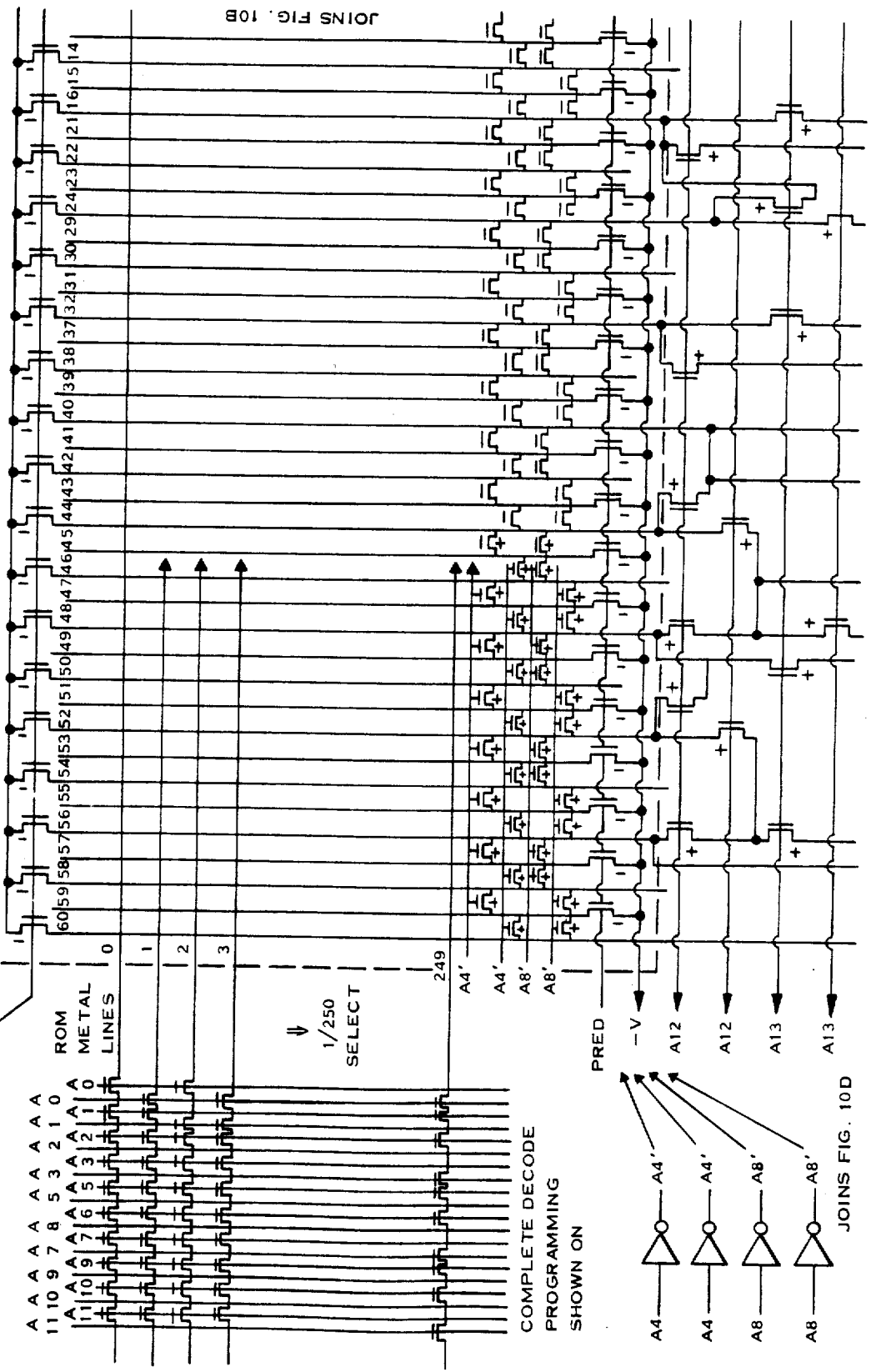
Figure 10B:
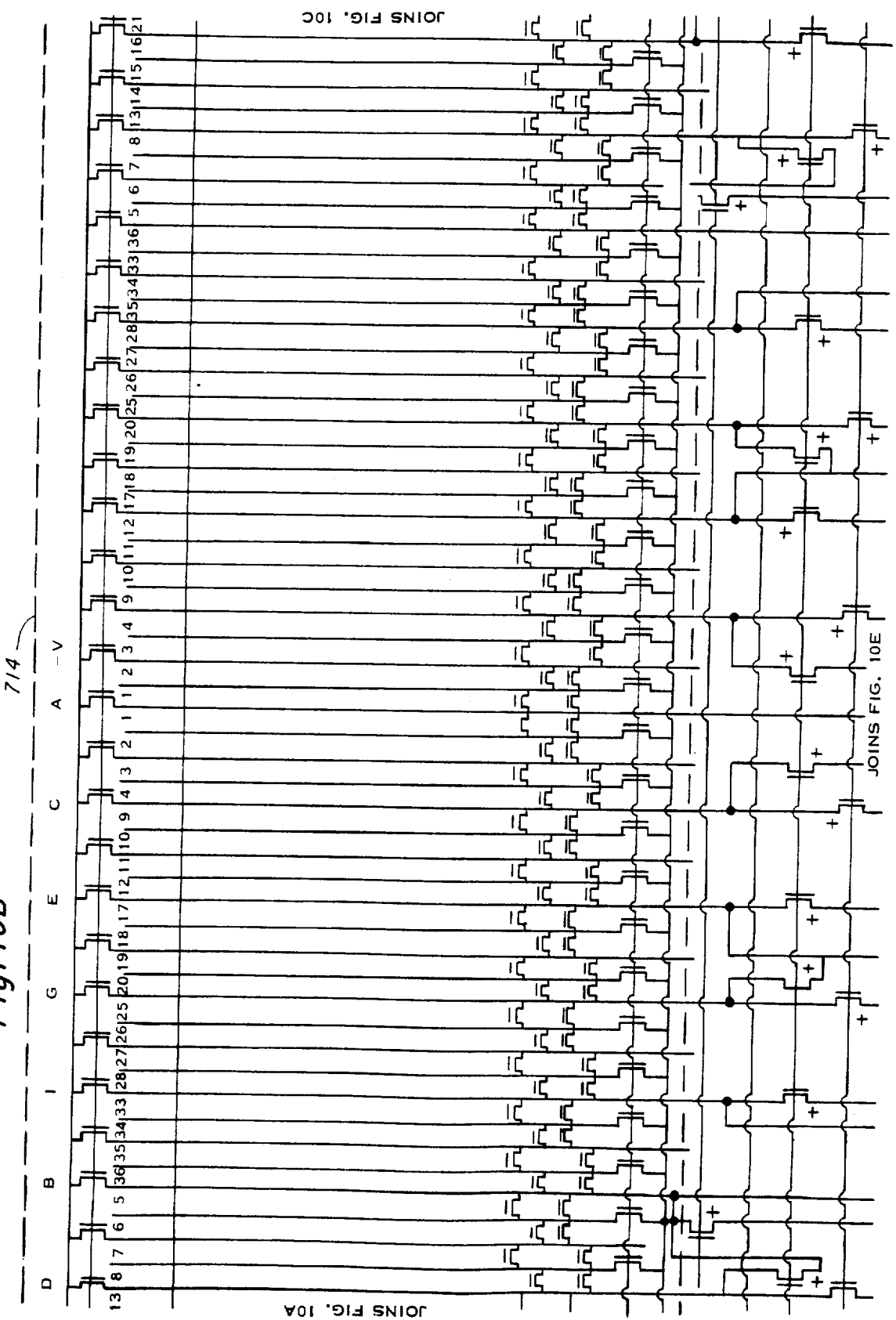
Figure 10C:
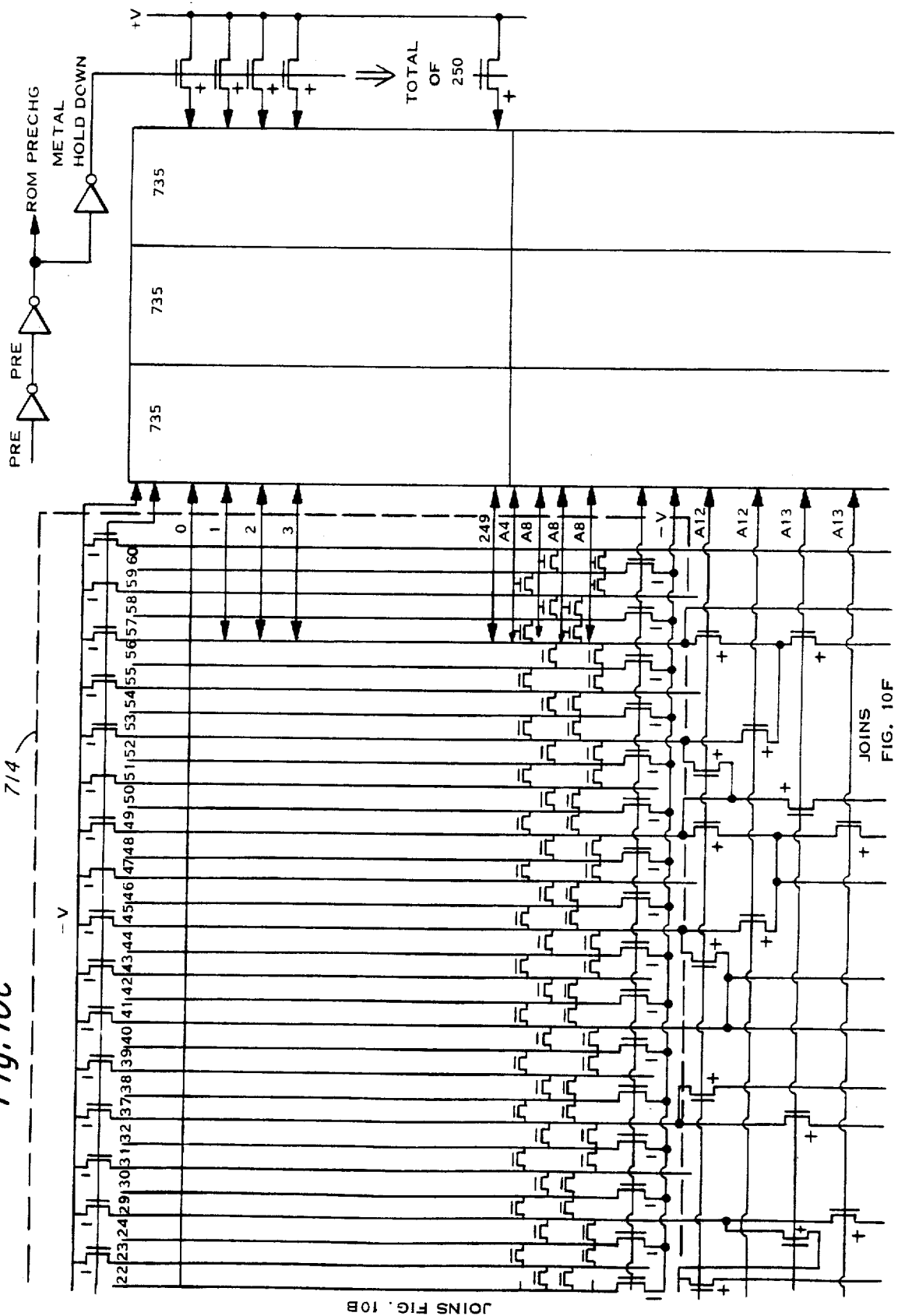
Figure 10D:
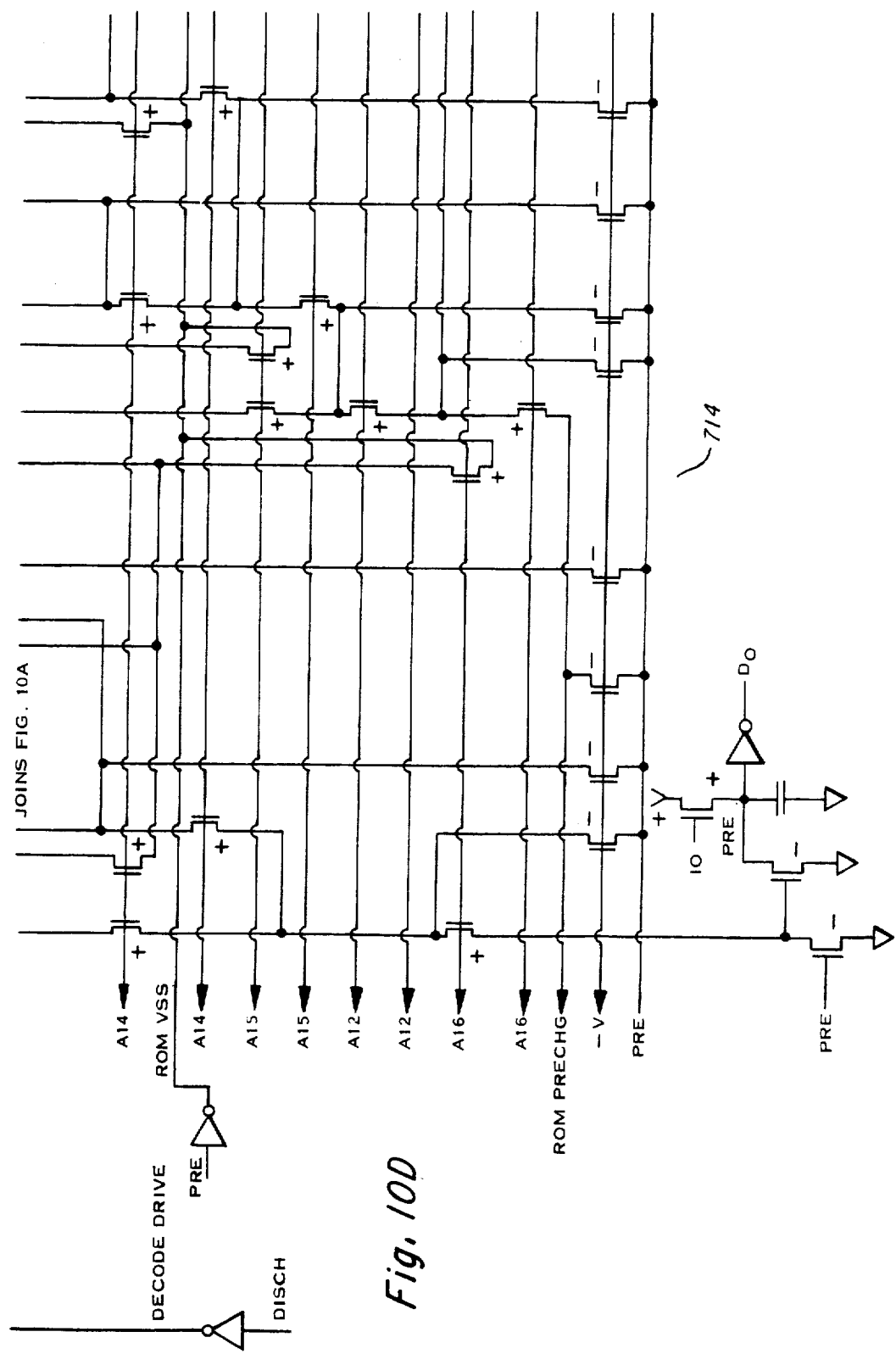
Figure 10E:
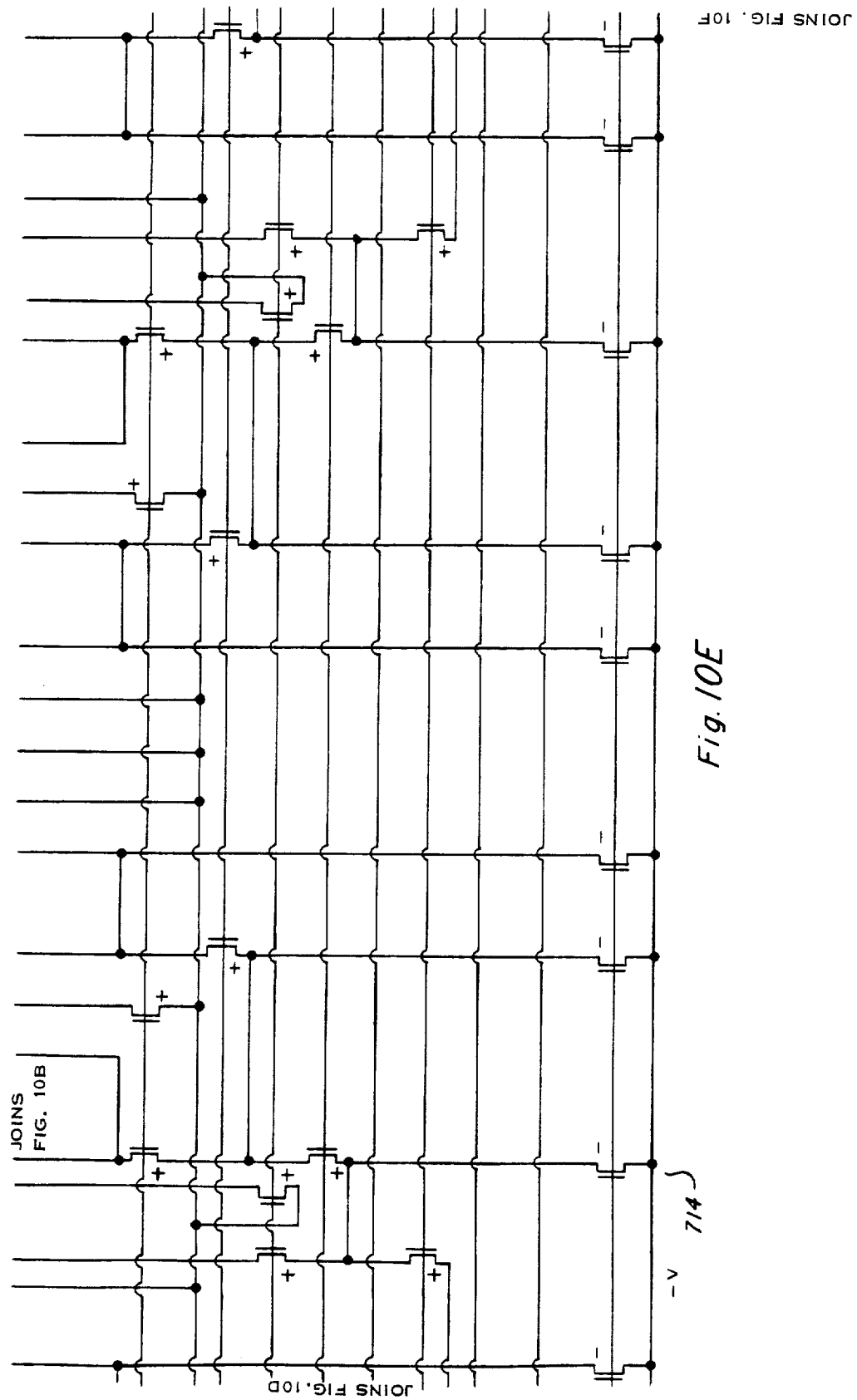
Figure 10F:
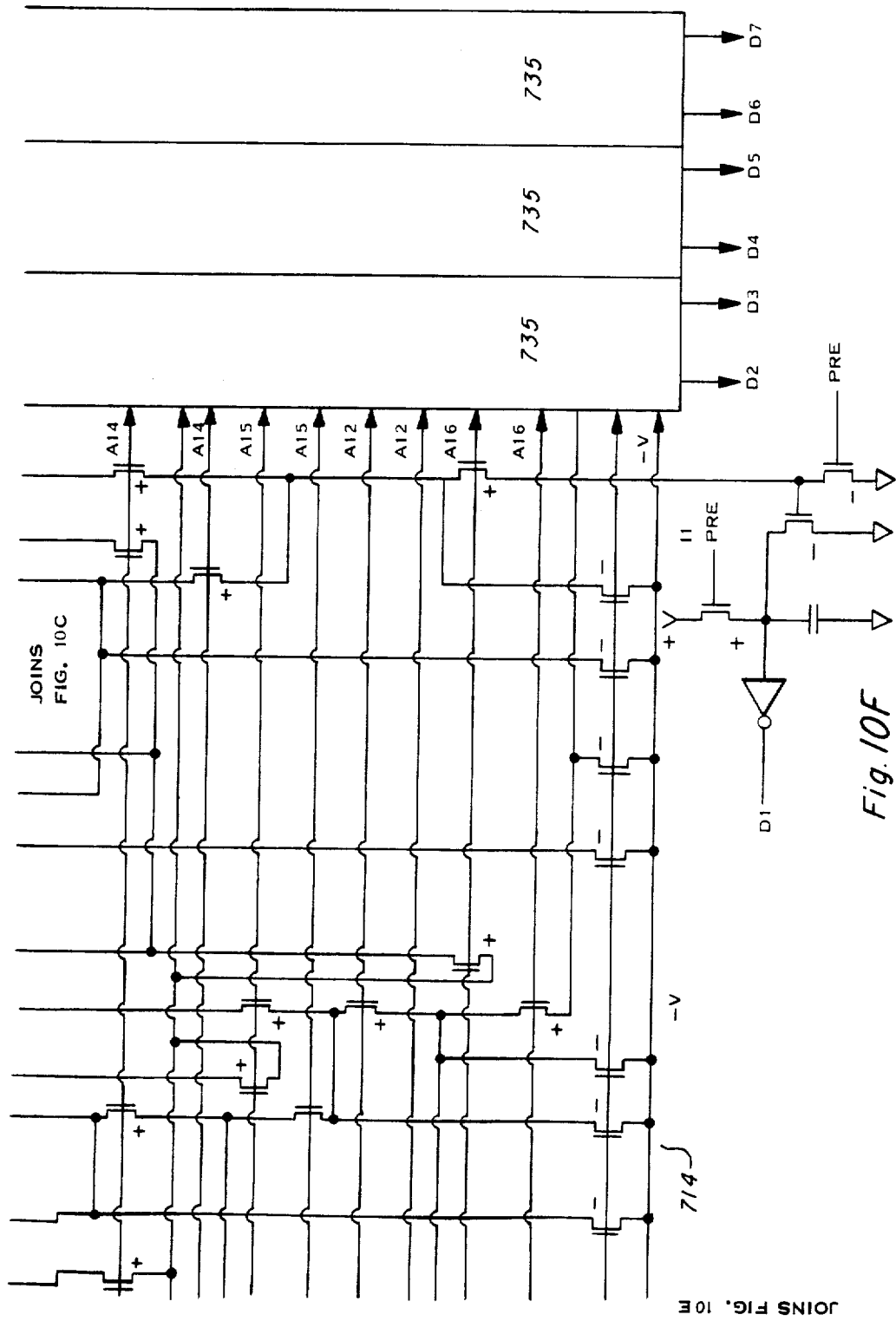

Referring to FIG. 8, the read only memory embodiment of the integrated circuit 640 as shown in the removable and transportable module 650 of FIG. 7B is shown. The block elements of FIG. 8 correspond to block elements of FIG. 7B and to blocked portions of detailed circuit schematics illustrated in, FIGS. 9-12. A clock generator circuit 730, as detailed in FIG. 12AA, and a no clock detect circuit 740, as detailed in FIG. 12AA, correspond to the clock generator circuit 644 of FIG. 7B. The sync circuit 720, as shown in detailed schematic form in FIG. 12AA, corresponds to the synchronization circuit 642 of FIG. 7B. An I/O buffer 701, as shown in detailed schematic form in FIG. 12AA, corresponds to the I/O buffer 630 of FIG. 7B. The I/O control 750, as shown in FIG. 12AB, corresponds to the I/O control 633 of FIG. 7B. An enable circuit 703, as shown in detailed schematic form in FIG. 12BA, an instruction decode programmable logic array (PLA) 700, as shown in greater detail in FIG. 12BA, the command latches 702, as shown in greater detail in FIG. 12BB, and the state counter 706 and control logic 707, as shown in greater detail in schematic form in FIGS. 12EA-12F, in combination correspond to the command decode 632 of FIG. 7B. The instruction decode PLA 700 is coupled to the I/O buffers 701 for receipt of signals therefrom, and to the enable circuit 703. Additionally, the instruction decode PLA 700 is coupled to the command latches 702 and to the state counter 706 and control logic 707. The outputs of the control logic 707 are coupled to a memory decode circuit 714 and memory array cells 735, as shown in greater detail in FIGS. 10A-F, corresponding to the memory array 636 of FIG. 7B. Additionally, the outputs of the control logic 707 are coupled to a BCD program counter 704, as shown in greater detail in FIGS. 12CA-DB, corresponding to the program counter 634 of FIG. 7A. The outputs from the BCD program counter 704 are coupled to the decode circuit 714. Additionally, the BCD program counter 704 is coupled to the I/O buffers 701 so as to provide a means of transferring program counter data. A data latch 705, as shown in greater detail in FIG. 12DA, corresponds to the latch means 637 of FIG. 7B. The data latches 705 are coupled to the I/O buffers 701 and to the decode circuit 714.

Referring to FIG. 9, a drawing interrelationship layout is provided for FIGS. 10A-G which provide a detailed schematic circuit representation of the read only memory array cells 735 and associated decode circuit 714 corresponding to the memory array 636 of FIG. 7B.

Figure 11:
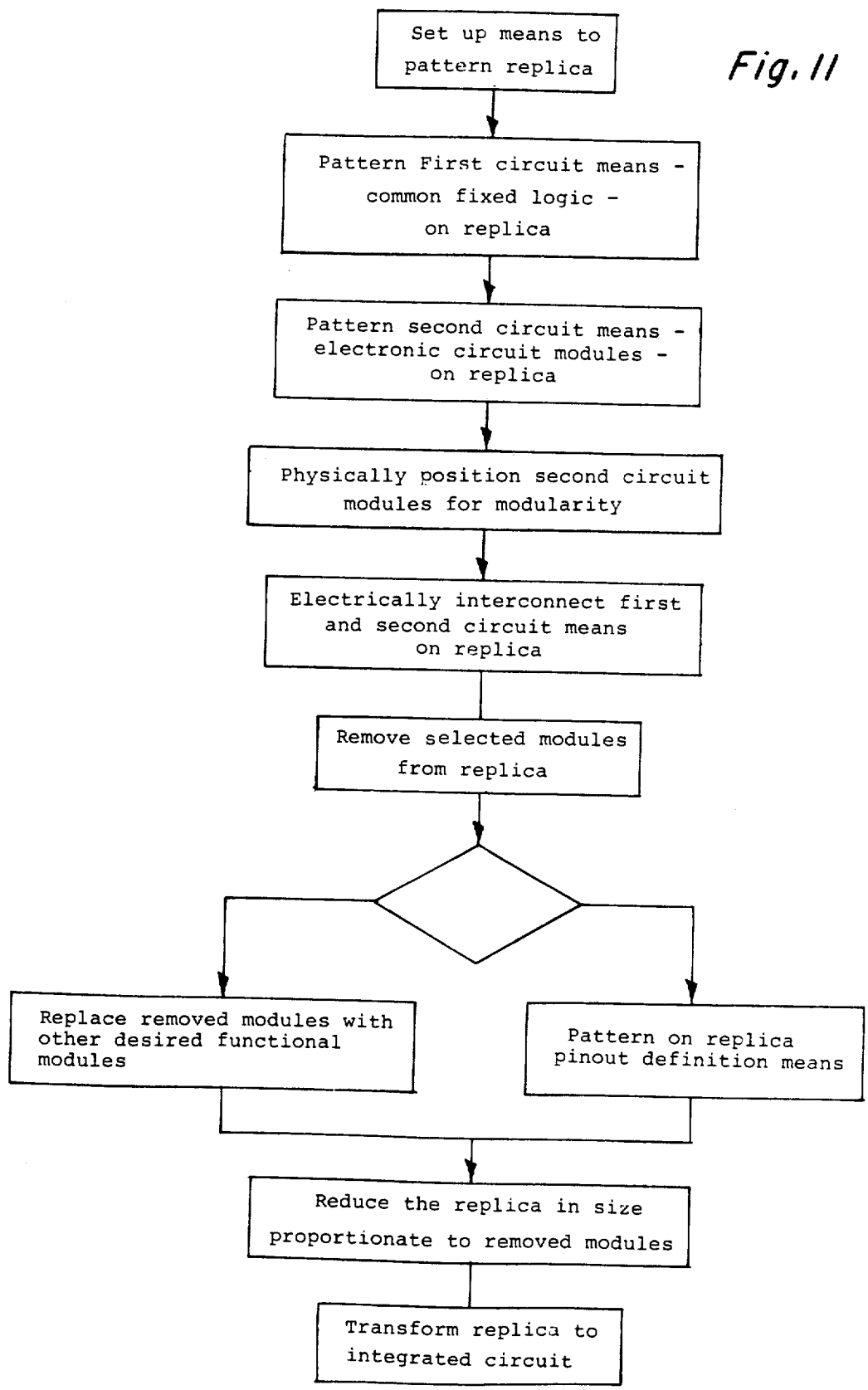
FIG. 11 is a drawing interrelationship layout of FIGS. 12AA–F
Figure 12A:
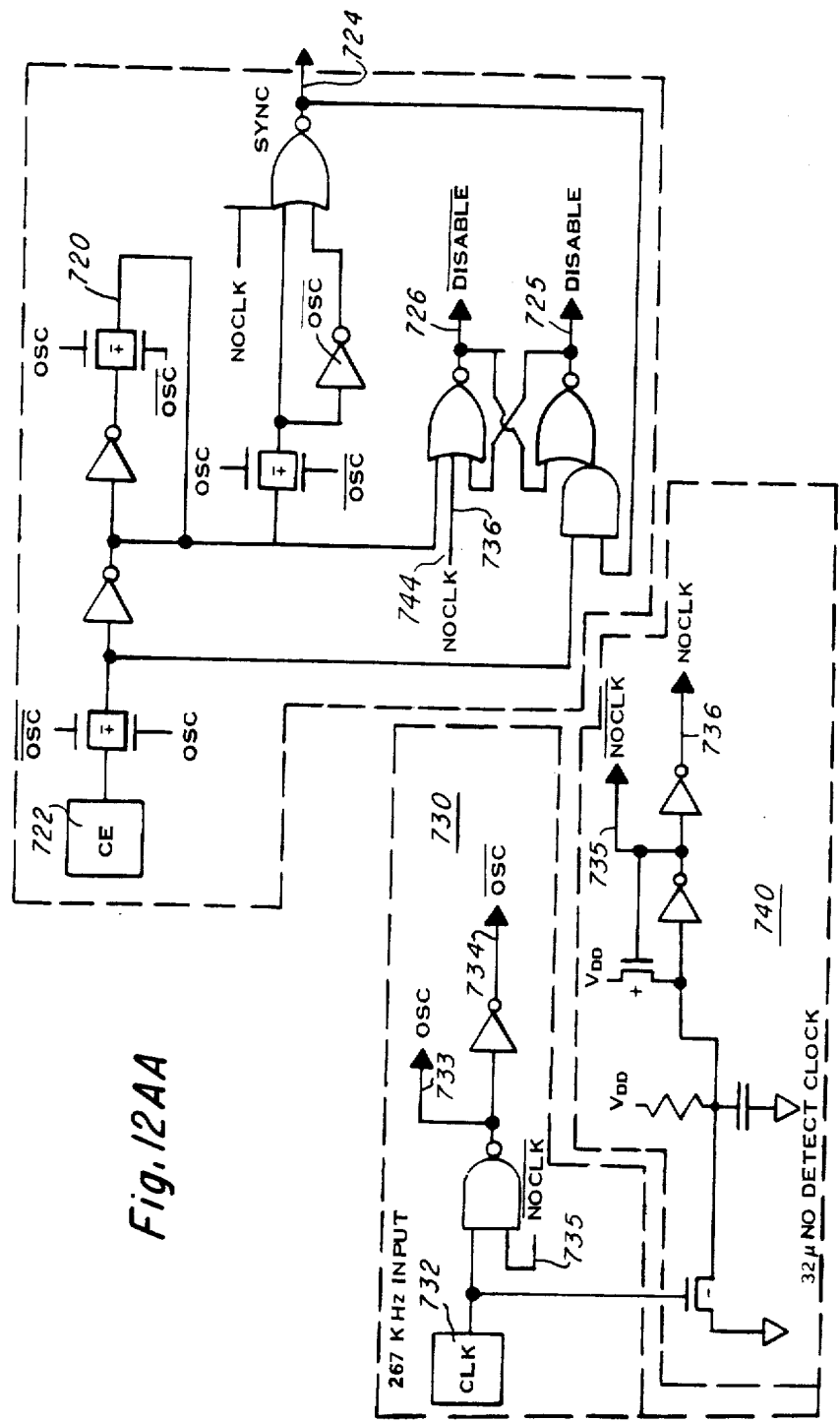
FIG. 12AA illustrates a detailed circuit schematic of the No-Clock detector 740 and the sync circuit 720.
Figure 12D:
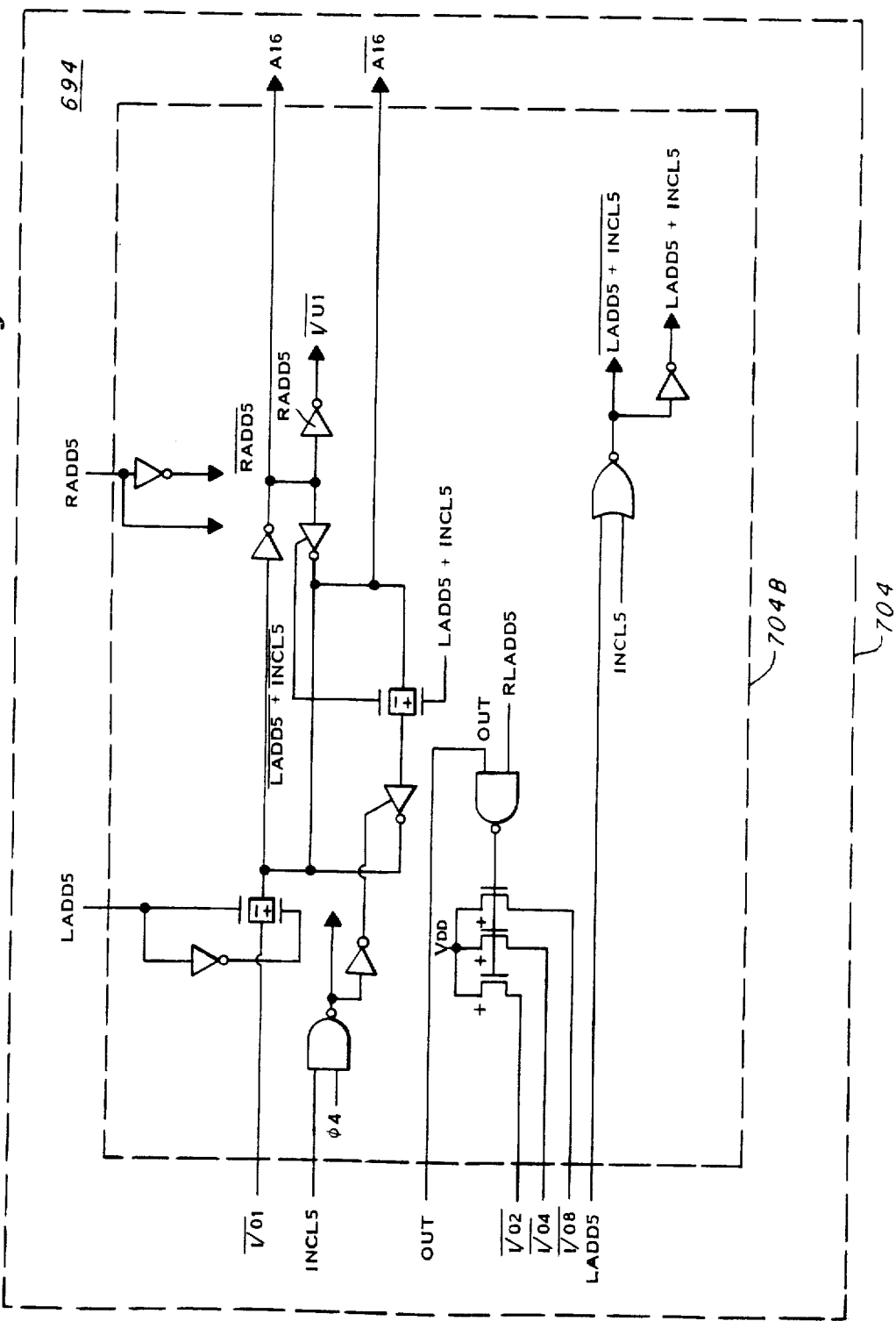
FIG. 12DA illustrates a schematic diagram of data latches 705.
Figure 12E:
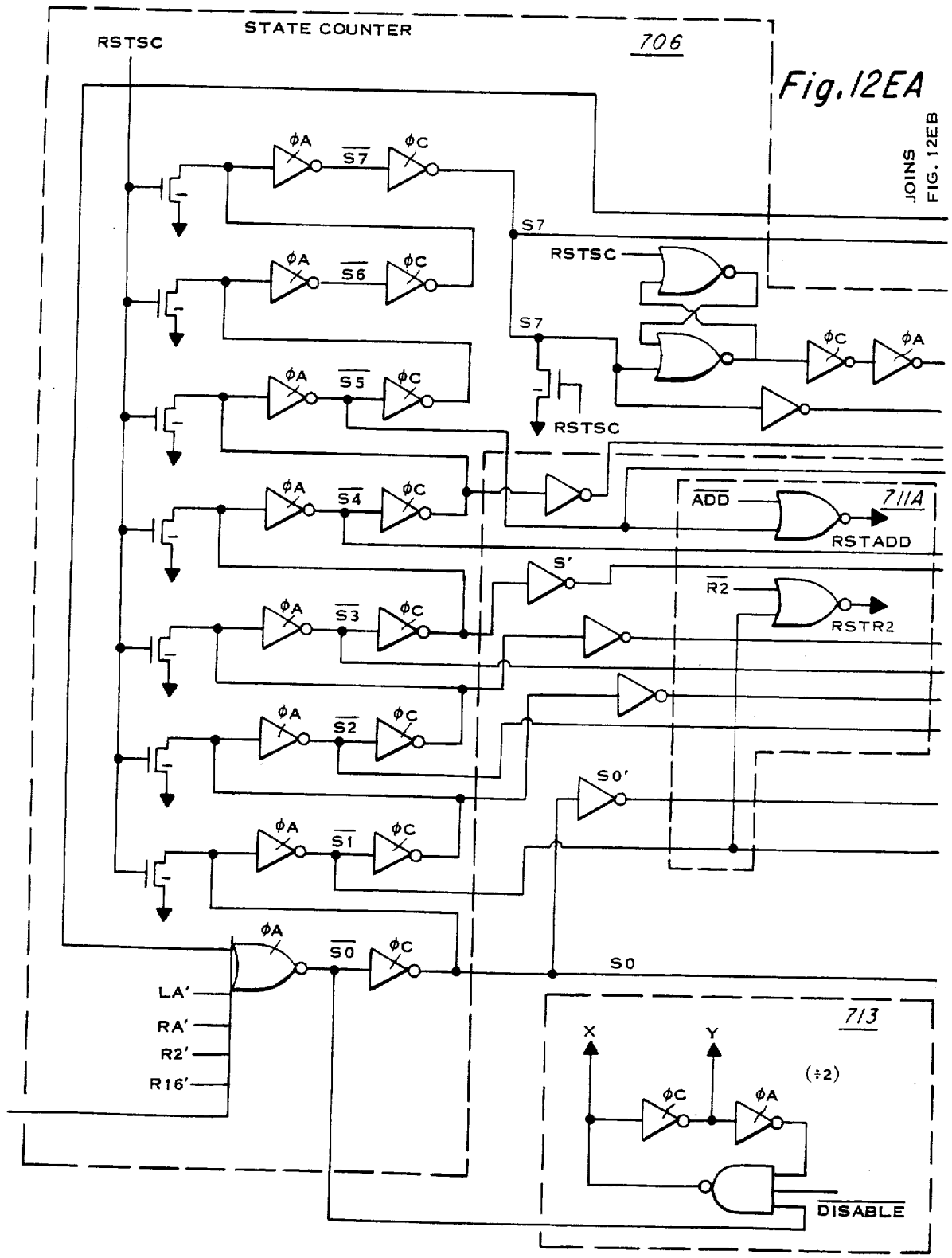
FIGS. 12EA and 12EB illustrate a schematic of state counter 706.
Figure 12E:
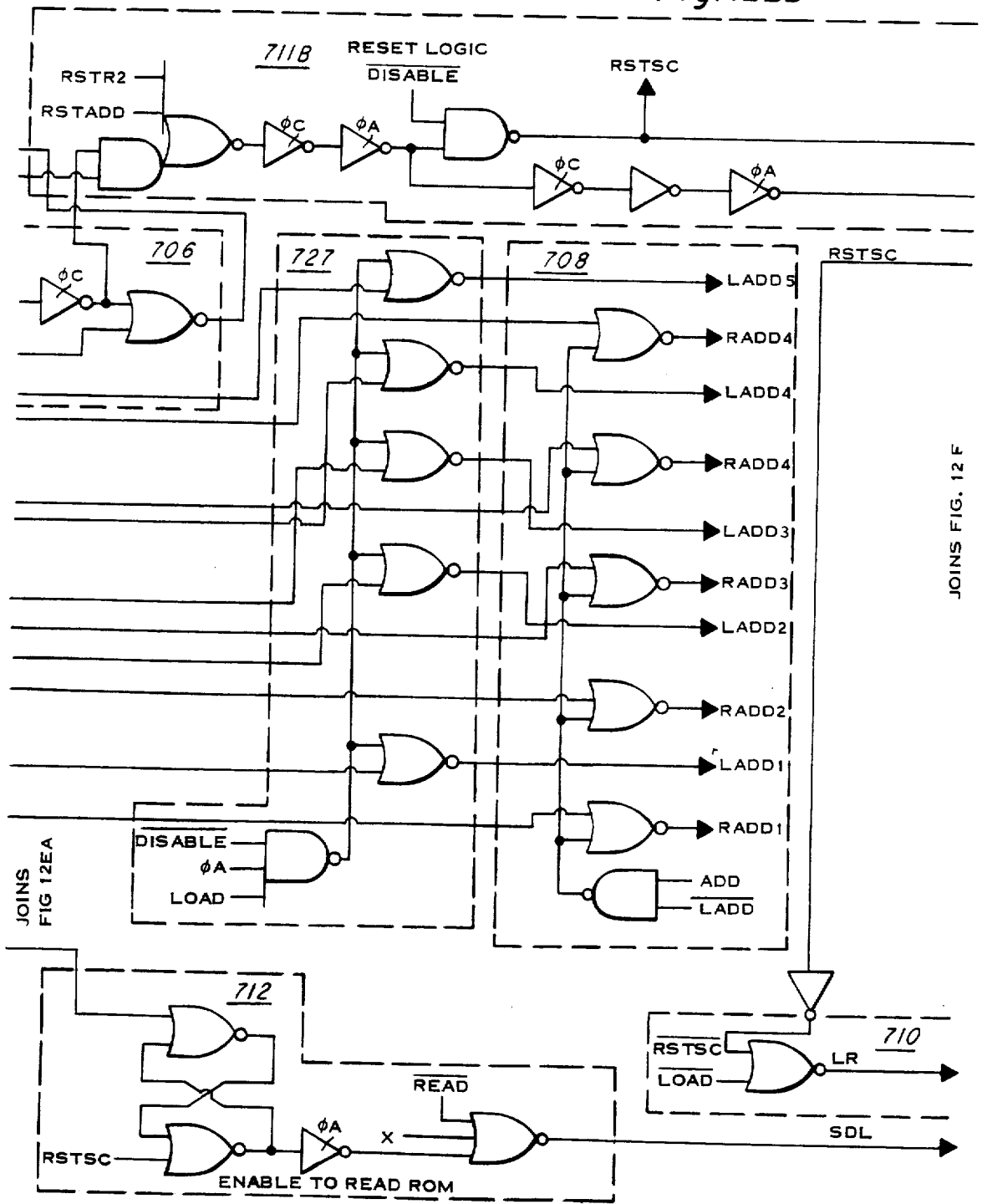
Figure 12G:
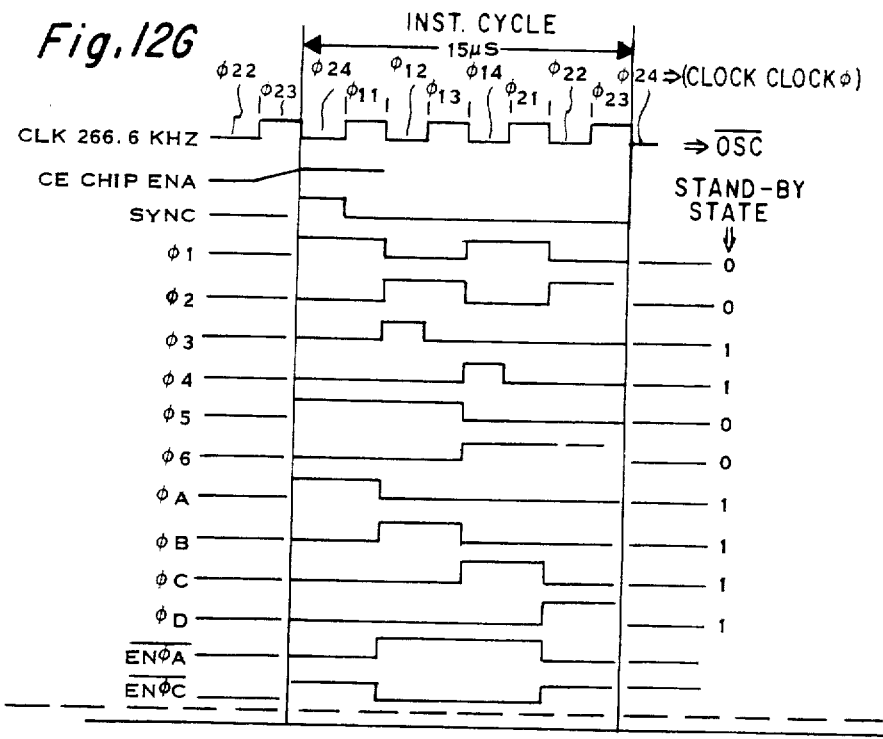
FIG. 12BA illustrates a detailed schematic of output buffers 791, I/O buffers 701, PLA 700 and enable circuit 703.
FIGS. 12CA, 12CB and 12DB illustrate a schematic diagram of BCD program counter 704.

Referring to FIG. 11, a drawing interrelationship layout is provided for FIGS. 12AA-G, which provide a detailed schematic circuit representation of the clock generator 730, the no clock detector 740, the sync circuit 720, the I/O buffers 701, the I/O control 750, the enable circuit 703, the instruction decode PLA 700, the command latches 702, the state counter 706 and control logic 707, the data latches 705, and the BCD program counter 704, as described above with reference to FIG. 8. Referring to FIG. 12G, a zero state latch circuit function (placing all zeroes or a no op state onto the common I/O bus) is included in the end of instruction reset logic 711.

Referring to FIGS. 12AA and 12AB, the clock generator circuit 730, synchronization circuit 720, no-clock detect circuit 740 and I/O control 750 are shown in detailed schematic form. The synchronization circuit 720 is coupled to an interconnection node 722 which couples to the chip enable bus which is coupled to the controller circuit as shown in FIG. 8. The synchronization circuit provides a sync output 704 and DISABLE ($\overline{\text{DISABLE}}$) signal output 725 (726), these signals 724, 725 and 726 coupled to other block elements of the memory means 640. The oscillator circuit is coupled to an interconnection node 732 which provides for coupling to the clock signal bus which is coupled to the clock output from the controller circuit 620. The clock generator circuit 730 provides oscillator clock outputs OSC 733 and $\overline{\text{OSC}}$ 734, these signals coupled to other blocks of the memory 640. The clock generator 730 is coupled to the synchronization circuit 720 for receiving the sync signal 724, the DISABLE signal 725, and the $\overline{\text{DISABLE}}$ signal 726. Additionally, the clock generator 730 is coupled to the no-clock detect circuit 740 for receiving therefrom a NOCLK signal 735. The no-clock circuit 740 is coupled to the clock interconnection point 732, and provides a NOCLK signal 735 and a $\overline{\text{NOCLK}}$ signal 736, these signals 736 and 736 coupled to other blocks of the memory means 640. The signals 735 and 736 are indicative in the true state that no clock signal has been received via interconnection node 732. The clock generator means 730 provides OSC signal 733 and $\overline{\text{OSC}}$ signal 734 responsive to receipt of a clock signal from the interconnection node 732, and and in response to receiving a non-true NOCLK signal 735 from the no-clock detect circuit 740. The synchronization circuit 722 provides sync signal 724 at an active logic level when an active chip enable signal is received via the interconnection node 722, the OSC signal 733 and $\overline{\text{OSC}}$ signal 734 are active and cycling, and the $\overline{\text{NOCLK}}$ signal 744 is at an inactive level, indicating that active cycling clock signals are being received. Additionally, the synchronization circuit 720 provides said DISABLE signal 725 and said $\overline{\text{DISABLE}}$ signal 726 when either no clock signal has been received and a $\overline{\text{NOCLK}}$ signal 736 is received in an active state, or when the chip enable signal received via interconnection point 722 is at an inactive state. The clock generator circuitry 730 is further comprised of a multi-phase clock generator circuit for providing clock phase signals $\emptyset 1$, $\overline{\emptyset 1}$, $\emptyset 2$, $\overline{\emptyset 2}$, $\emptyset 3$, $\emptyset 4$, $\overline{\emptyset 4}$, $\emptyset 5$, $\emptyset 6$, $\emptyset_a$, $\overline{\emptyset_a}$, $\emptyset_b$, $\overline{\emptyset_b}$, $\emptyset_c$, $\overline{\emptyset_c}$, $\emptyset_d$, and $\overline{\emptyset_d}$. The multiphase clock generator portion of the clock generator 730 is coupled to the synchronization circuit 720 for receipt of the sync signal 724, the DISABLE signal 725, and the $\overline{\text{DISABLE}}$ signal 726. Additionally, the clock generator circuit 730 provides two output signals $\overline{\text{EN}}$ 519 c and $\overline{\text{EN}}$ $\emptyset$a, providing synchronization linkage between the timing of $\emptyset_c$ and $\emptyset_b$, and $\emptyset_a$ and $\emptyset_b$, respectively. Referring to FIG. 12BA, I/O buffers 701 are coupled to interconnection nodes 742, 743, 744 and 745, respectively coupling to the least significant bit ascending to the most significant bit of a received data word, respectively. The interconnection nodes 742-745 provide for coupling to the I/O bus 336 which is coupled for transferring data words with the controller 620. The data words present on the bus 336 are structured so as to follow the command protocol as described above with reference to FIGS. 5-7.

Referring to FIG. 12BA, the I/O buffer 701 receives data from the interconnection nodes 742-745, selectively coupling the received data word to the instruction decode PLA 700 and to the command detect-enable circuit 703, I/O buffer 701 also provides additional output couplings for transferring I/01, I/02, I/04, and I/08, to other internal circuit nodes. The coupling of the data word from the interconnection nodes 742-745 to the remainder of the circuit blocks of the memory 640 is selectively enabled responsive to the receipt of an IN signal as received from the I/O control 750 of FIG. 12AA. Alternatively, the I/O buffers 701 receives signals from other circuit block elements of memory 640 via nodes 746, 747, 748, and 749, selectively coupling these received signals to the interconnection nodes 742, 743, 744, and 745, respectively, in response to an active received OUT signal, as received from the I/O control means 750. The data word received from control bus 336 by the I/O buffers 701 is selectively coupled to the instruction decode PLA responsive to a decode enable signal 698 received from the PLA command detect enable means 703. When an active decode signal 698 is received by the instruction decode PLA 700, the received data word is coupled to the PLA, and is therein decoded as a command from the command protocol sequence. Alternatively, the instruction decode may be accomplished by table lookup, or other techniques. The outputs of the instruction decode PLA 700 are synchronously gated to provide outputs coupled to the command latches. As shown in FIGS. 12BA and 12BB, in the preferred embodiment of the read-only-memory means, decoded commands provided as separate active decode outputs from the instruction decode PLA are: load address (LA) into program counter, read address (RA) from program counter, read two data words from memory (R2), and read sixteen data words from memory (R16). Additional or different command decodes may be provided for depending on the application. For example, in a read/write memory embodiment, as shown in FIGS. 15A-F, the additional commands of write two received data words into memory (W2) and write sixteen received data words into memory (W16) are provided. The command latches 702 are coupled to the synchronization means 722 for receiving the DISABLE signal therefrom, and are additionally coupled to the reset logic 711 for receiving the RSTCL signal therefrom. The command latches 702 are comprised of individual command decode and synchronization latch circuits 770, 771, 772, and 773. Latch 770 is coupled to the disable signal, the RSTCL signal, the LA signal and the RA signal, and in response to these signals provides an ADD and $\overline{\text{ADD}}$ signal output for coupling to the enable means 703, the I/O control means 750 and other circuit elements. Latch 771 is coupled to receive the DISABLE signal, the RSTCL signal, the R2 signal and the R16 signal, and in response to these signals provides a READ and a $\overline{\text{READ}}$ signal for coupling to enable means 703 and I/O control 750, as well as to other circuit blocks. Latch 722 is coupled to receive the DISABLE signal, the RSTCL signal, and the R2 signal, and in response to these signals provides an output signal R2, and $\overline{\text{R2}}$, for coupling to other circuit blocks. Additionally, the command latches 702 includes a latch 773 which is coupled for receiving the DISABLE signal, and the LA signal, and in response to these signals provides a LOAD signal, signifying a load program counter condition. The LOAD signal is coupled to other circuit blocks, including said I/O control 750.

Referring again to FIG. 12AB, the I/O control 750 is coupled to the command latches 702 for receiving the $\overline{\text{ADD}}$, the $\overline{\text{LOAD}}$, and the $\overline{\text{READ}}$ signal. Additionally, the I/O control 750 is coupled to receive the DISABLE output signal from synchronization means 722. Furthermore, the I/O control 750 is coupled to receive clock signals $\emptyset_b$ and $\emptyset_d$ from the clock generator 730. Responsive to these received signals I/O control 750 provides output signals IN, $\overline{\text{IN}}$, OUT, and $\overline{\text{OUT}}$. These signals are coupled to other circuit blocks of the memory 640, and particularly to said I/O buffer 701. Referring again to FIG. 12BA, the output buffer 791 is shown in detailed schematic form as utilized in the I/O buffer 701 in the preferred embodiment. The Enable Means 703 is coupled for receiving $\overline{\text{ADD}}$ signals from the command latches 702. Additionally, enable means 703 is coupled for receiving the DISABLE signal from the synchronization means 722. The enable means 703 selectively couples the most significant bit I/08 of the received data word from the I/O buffer 701 to an output which provides the command detect decode signal 698 to PLA 700. Signal I/08 is selectively gated into the combinational logic of enable means 703 responsive to a clock signal (clock signal $\emptyset_4$ in the preferred embodiment) from the clock generator means 730. Responsive to received signals enable means 703 command detect enable PLA 700 provides command detect decode output 698 so as to enable the instruction decode PLA 700 to receive and decode the received data word from I/O buffer 701, and to provide active decode control word outputs responsive thereto.

The state counter 706 (not shown in FIGS. 12EA and 12EB in detail) is coupled to the instruction decode PLA 700 for receiving the LA', RA', R2', and R16' outputs therefrom. (Note that in the read/write memory embodiment of the memory means 640 that the state counter (879 of FIG. 15E) receives the additional decode signal outputs W2 and W16 from the read/write memory instruction command decode 810 as shown in FIG. 15BA). When any of the instruction decode outputs coupled to the state counter 706 goes to an active state, the state counter 706 is activated to begin sequencing responsive to received clock generator 730 outputs $\emptyset_a$ and $\emptyset_c$. Operation of the state counter 706 is additionally responsive to the RSTSC output signal from the reset logic 711A and 711B FIGS. 12EA and 12EB which is coupled to the state counter 706 at multiple points. When the RSTSC signal is at an inactive signal level, and one of the received command decode outputs, LA', RA', R2', or R16', is at an active signal level, then the state counter 706 will provide state counter outputs S0, to S7, and their complementary signals where required, responsive to received clock generator outputs $\emptyset_a$ and $\emptyset_c$. The state counter 706 in the preferred embodiment is a dual count state counter whose clock sequencing rate is determined by the received clock generator 730 outputs $\emptyset_a$ and $\emptyset_c$. The S0 output from the state counter 706 is coupled to the divide-by-two timer circuit 713 which provides outputs X and Y responsive to the received clock generator 730 outputs $\emptyset_a$ and $\emptyset_c$, and in response to the received $\overline{\text{DIS ABLE}}$ signal from the synchronization circuit 720 being at an inactive level. The divide-by-two timer circuit 713 is used for setting the timing of instructions. The reset logic 711 is comprised of three major parts, 711a, 711b, as shown in FIGS. 12EA and 12EB and 711c, as shown in FIGS. 12E-F. The reset logic circuit 711a is coupled to receive the $\overline{\text{ADD}}$ and $\overline{\text{R2}}$ outputs from the command latches 702, and to receive the $\overline{S1}$ and $\overline{S5}$ outputs from the state counter 706. Responsive to a received $\overline{ADD}$ instruction, the reset logic 711a provides a RSTADD (reset on address command) synchronized to state 5 ($\overline{S5}$) of the state counter. Additionally, responsive to the receipt of an active $\overline{R2}$ output from the command latches 702, the reset logic 711a provides an output RSTR2, synchronized to the first state ($\overline{S1}$) of the state counter 706. The reset logic 711b is coupled to receive the output signals RSTADD and RSTR2 from the reset logic 711a. Additionally, the reset logic 711b is coupled to receive the state 7 (S7) output and the DC' (delayed count state 7) output from the state counter 706. Additionally, the reset logic 711b is coupled to receive the $\overline{DISABLE}$ output signal from the synchronization circuit 720, and clock phase outputs $\emptyset_a$ and $\emptyset_b$ from the clock generator 730. Responsive to these received signals, the reset logic 711b provides a RSTSC signal for coupling to the state counter 706, and for providing a RSTCL signal output for coupling to the command latches, and other blocks. The third subpart of the reset logic, 711c, is coupled to receive said RSTCL and the RSTSC outputs from the reset logic 711b. Furthermore, the reset logic 711c is coupled to receive $\overline{READ}$, $\overline{ADD}$ and $\overline{LOAD}$ outputs from the command latches 773, to receive the $\overline{DISABLE}$ output from synchronization circuit 720, and to receive clock phase output $\emptyset a$ from clock generator 730. The reset logic 711c provides a send zero output ($\overline{SZ}$) in response to these received inputs coupled thereto. The send zero output ($\overline{SZ}$) is coupled to a zero latch 711d. Zero latch 711d provides outputs I/01, I/02, I/04, and I/08, these outputs being coupled to I/O buffer 701 at nodes 746-749. The zero latch 711d provides zero logic level signal outputs at I/01, I/02, I/04, and I/08 (no-op state) in response to receiving an active level set zero (SZ) signal output from the reset logic send zero decode circuit 711c. As described earlier with reference to FIGS. 5–7, the command protocol utilized in the preferred embodiment requires that a noop condition (zero logic level) state be forced onto the common bus 336 at the end of a command sequence in order to set up the bus protocol for the next command sequence.

The load address logic circuit 727 is coupled to receive the $\overline{DISABLE}$ signal output from synchronization circuit 720, the $\emptyset a$ output from clock generator 730, and the $\overline{LOAD}$ signal from command latches 702. In response to these received signals load address circuit 727 selectively gates received state counter outputs S0', S1', S2', S3', and S4', coupling these selectively gated state counter outputs to the read address control logic circuit 708. Responsive to these selectively gated state counter outputs received from load address logic circuit 727, and responsive to received $\overline{ADD}$ and $\overline{LOAD}$ outputs from said command latches 702, said read address control logic 708 provides outputs read address one (RADD1), load address one (LADD1), read address two (RADD2), load address two (LADD2), read address three (RADD3), load address three (LADD3), read address four (RADD4) load address four (LADD4), read address five (RADD5), and load address five (LADD5). These output signals RADD1-5, and LADD1-5 are coupled to control inputs of the program counter circuit 704, as shown in FIGS. 12CA, 12CB, 12DA and 12DB in detailed schematic form.

A read ROM enable circuit 712 is coupled to the state counter 706 for receiving the state zero (S0) output signal, and is coupled to the reset logic 711b for receiving the RSTSC signal. Unless an active RSTSC signal output is received, the S0 output signal sets an internal latch within the enable circuit 712. This latch output is synchronously coupled to other combinational circuits of the enable circuit 712. The enable circuit 712 is also coupled to receive the READ output signal from the command latches 702, and the X output from the divide by two circuit 713. Responsive to READ, X, and latch output signal, the enable circuit 712 provides an enable read output signal (SDL).

The data latch control circuit 709, as shown in FIG. 12F, is coupled to the read ROM enable circuit 712 for receiving the SDL output signal, and is additionally coupled to clock generator 730 for receiving $\emptyset a$ and $\emptyset c$ output signals therefrom. Responsive to the received SD1, $\emptyset a$ and $\emptyset c$ output signals, the data latch control circuit 709 provides an output SD2 coupled to data latches 705. Additionally, an output SD1 from ROM control 710 is also coupled to the lata latches 705 (of FIG. 12DA). The data latch control circuit 709 further includes of a means for providing a load data latch output signal (LD) in response to a received $\emptyset a$ signal from clock generator 730, and in response to receiving a first ROM control output R1 from ROM control means 710. The data control circuit 705 is coupled to the data latch control circuit 709 for receiving the LD and SD2 output signals therefrom.

The ROM control circuit 710, as shown in FIGS. 12EB and 12EF, is coupled to reset logic 711b for receipt of the $\overline{RSTSC}$ output signal and is coupled to the command latches 702 for receipt of the LOAD signal, and in response to these received signals provides an output signal LR for coupling to other parts of the ROM control circuit 710 and for coupling to the read address control logic 708. Additionally, the ROM control circuit 710 is coupled to the synchronization circuit 720 for receipt of the DISABLE signal therefrom, and is coupled to clock generator 730 for receipt of output signals $\emptyset_B$, $\overline{\emptyset}_B$, and $\emptyset D$. In response to these received signals ROM control means 710 provides a precharge output (PRE) and a discharge output (DISCH) for coupling to ROM array 735 and ROM decode 714. Additionally, ROM control circuit 710 provides a R1 output. The read address control logic 708 is coupled to the ROM control logic 710 for receiving the LR output therefrom and for receiving a precharge decode signal (PPRE) output. Read read address control logic 708 provides an output signal INCL1 in response to received signals LR and PPRE. In the preferred embodiment, the INCL1 signal is at an active logic one level when both inputs thereto are at a logic zero level, signifying a precharge decode true, and a true load condition.

The program counter 704, as shown in detailed circuit schematic form in FIGS. 12CA, 12CB and 12DB, is coupled to read address control logic circuit 701 for receipt of LADD1-5 and RADD1-5. Additionally, the program counter 704 is coupled to the synchronization circuit 720 for receipt of the DISABLE signal therefrom. The program counter 704 is also coupled to the I/O control 750 for receipt of the IN and OUT signals therefrom. The program counter 704 is also coupled to the clock generator 730 for receipt of clock phase outputs therefrom. Finally, the program counter 704 is coupled to the I/O buffers 701, and particularly to nodes 746-749 of the I/O buffers 701, for transferring data to and from program counter 704. The program counter 704 provides address outputs A0-A16, and complementary address outputs A0-A16, responsive to received inputs. In the preferred embodiment, the program counter 704 is comprised of four BCD digits, as shown in detail in FIGS. 12CA and 12CB, each digit being individually readable or writable responsive to received RADD1-5 signals or LADD1-5 signals, respectively. A fifth BCD half digit position is provided for, as shown in FIG. 12DB, stage 704b, which provides address outputs A0-A16 and A0-A16. Additionally, each BCD digit 690, 691, 692, 693, and 694, includes BCD program counter circuitry including carry forward, inhibit 9, and other circuitry necessary to implement a five BCD digit stage counter. The address outputs A0-A16 and A0-A16 from the program counter 704 are coupled to the decode circuit 714.

The data latches 705 are coupled to the read ROM enable circuit 712 for receipt of the SDL signal output therefrom, and are coupled to the data latch control circuit 709 for receipt of the SD2 and LD signal outputs therefrom. Additionally, the latch control circuit 709 is coupled to the I/O buffer 701, and particularly to connection nodes 746-749, for providing bi-directional data transfer with I/O buffers 701 and therefrom to the I/O control bus 336. In the preferred embodiment, the ROM array 735 is organized as an eight bit wide word, primarily for layout and bar size considerations. Since the I/O bus 336 is a four bit data bus (in the preferred embodiment), and since the internal data transfer path coupled to nodes 736-749 is also a four bit wide data path (in the preferred embodiment), outputs from the ROM 735 coupled to data latch 705 must be selectively stored and multiplexed onto the four bit wide data bus. The outputs D0-D7 from the ROM 735 are selectively stored in the data latch 705 responsive to the received LD signal, outputs D0-D3 being selectively coupled to the four bit data bus coupling to nodes 746-749 responsive to a received SD1 output signal, and data bits D4-D7 being selectively coupled to the four bit wide data bus and therefrom to output nodes 746-749 responsive to a received SD2 signal.

Referring to FIG. 12G, the clock timing waveforms for the received signals CLK coupled to clock generator means 730, and external signal CE (chip enable) as shown coupled to synchronization circuit 722, illustrated in FIG. 12AA, the internal clock and timing signals generated from the received clock and chip enable signals, together with sync signal output 724 from the synchronization circuit 720 as shown in FIG. 12AA, clock generator 730 outputs ∅1-∅6, and ∅a-∅d, as shown in FIG. 12AA, and EN∅a, and EN∅c are shown. The timing waveforms show the interrelationship of external and internal clock signals to a single instruction cycle in the preferred embodiment of the memory in a system with the controller circuit.

Figure 12H:
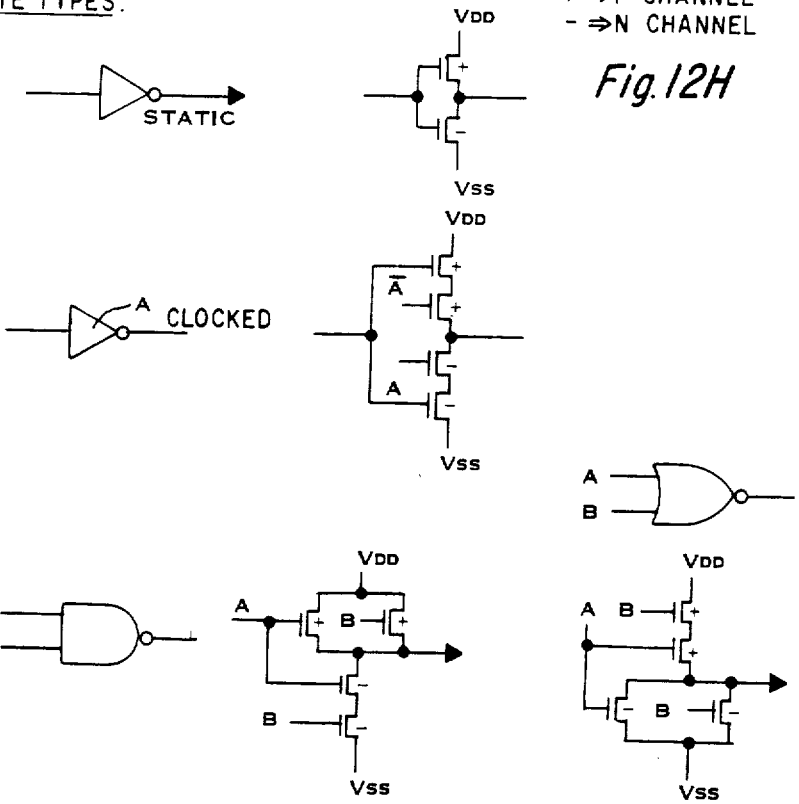

Referring to FIG. 12H, the logic symbol conventions utilized in the FIGS. 12AA to 12F are shown opposite the CMOS detailed circuit schematic embodiment as used in the preferred embodiment.

Figure 13:
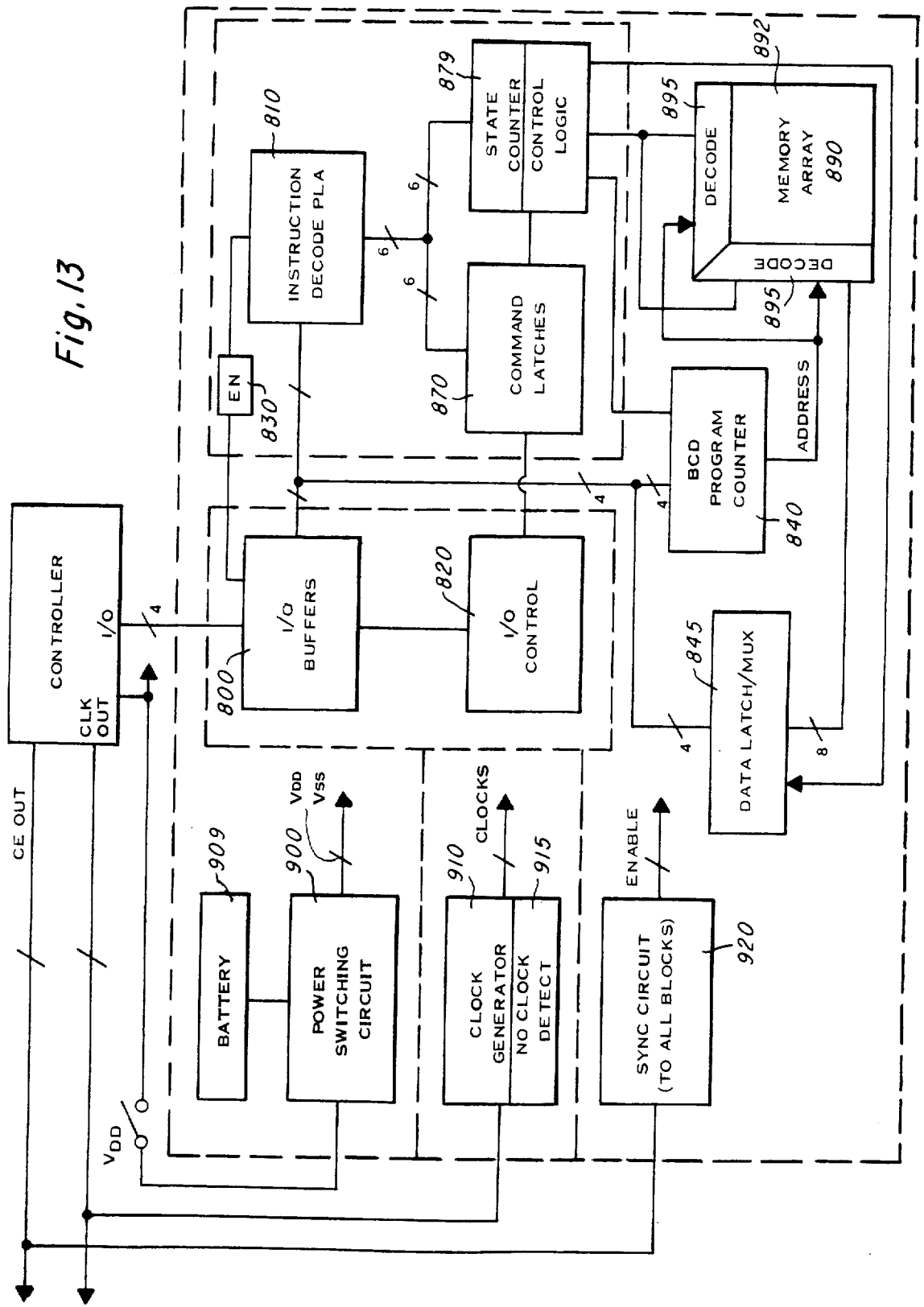
FIG. 13 is a block diagram of the read-write embodiment of the memory module 650 and the memory means 640 as shown in FIGS. 7B and 7C.

Referring to FIG. 13, a block diagram of the read/write embodiment of the memory module 650 and the memory 640 as shown in FIG. 7B is shown in detailed block form. The basic functional circuit blocks of FIG. 13 are for the most part equivalent to the basic functional circuit blocks of FIG. 8, except for the addition of the power switching circuit 900, which in the preferred embodiment forms an integral part of integrated circuit 630, and a battery 909 which forms an integral part of the memory module 650 and is coupled to the integrated circuit power switching circuit 900. The clock generator 910 is identical to the clock generator 730 of FIG. 8. The synchronization circuit 920 of FIG. 13 is identical to the synchronization circuit 720 of FIG. 8. The I/O buffers 800 of FIG. 13 are identical to the I/O buffers 624 of FIG. 8. The I/O control circuit 820 of FIG. 13 is identical to the I/O control circuit 750 of FIG. 8. Finally, the state counter 879 of FIG. 13 is identical to the state counter 706 of FIG. 8. The remainder of the electrical circuitry of FIGS. 13-17, with the exception of the power circuit 900 and circuitry related thereto, are similar to the corresponding functional circuit blocks and circuitry of FIGS. 8-12, with addition and changes being made to accommodate a read/write memory as opposed to a read-only-memory. The basic functions performed by each of the circuit blocks of FIG. 13 are virtually identical to the function performed by the corresponding circuit functional block of FIG. 8.

Figure 15A:
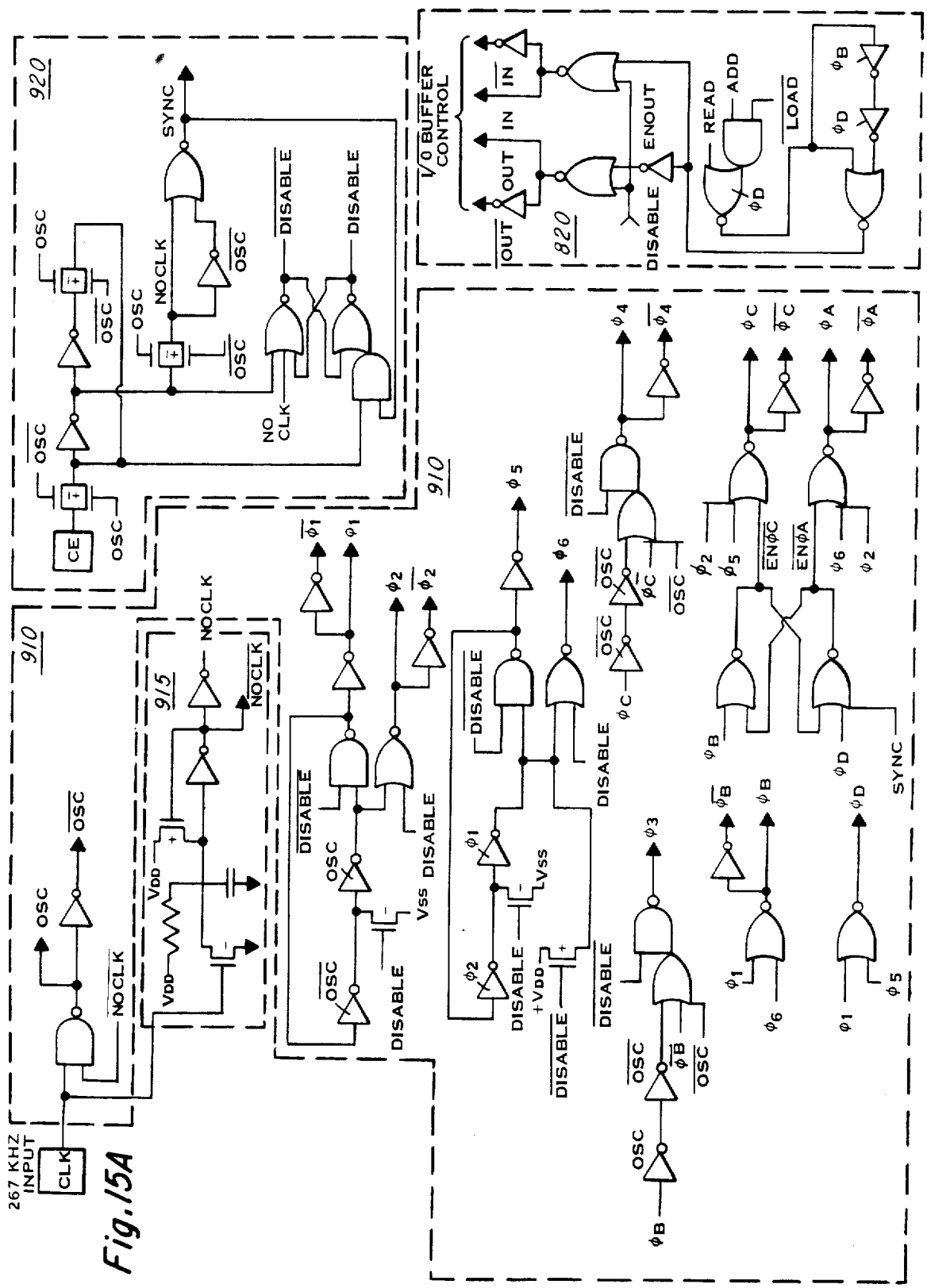
FIG. 15A illustrates the detailed schematic diagram of clock generator 910, no clock detect circuit 915, clock synchronization circuit 920 and I/O buffer control 820.

The clock generator means 910 and no clock detect means 915 of FIG. 13 are shown in greater detail in FIG. 15A, along with the I/O buffer control means 820 and clock synchronization circuit means 920. The I/O buffers 800, instruction command decode means 810, command detect enable circuitry 830, and command latches 870 of FIG. 13 are shown in detailed schematic form in FIGS. 15BA and 15BB. The BCD program counter 840 of FIG. 13 is shown in detailed schematic form in FIGS. 15CA-15DB. Note that due to the lesser number of words of storage in the read/write memory means as compared with the read-only-memory means, the program counter 840 (of FIGS. 13 and 15CA-15DB), provides three BCD digits of addressing as opposed to the program counter 704 of the read-only-memory means comprising five BCD digits. The data latches 845 of FIG. 13 are shown in detailed schematic form of FIG. 15DA. The state counter 879, and other control logic are shown in detail schematic form in FIGS. 15E and 15F.

Referring to FIG. 14, the layout interrelationship of FIGS. 15A to 15H is shown. Referring to FIG. 15A, the synchronization circuit 920, responsive to a received chip enable signal and to a received no clock output signal, selectively provides a sync output, a DISABLE output and a DISABLE output for coupling to other circuit blocks of the circuitry of FIGS. 15A-15F. The clock generator 910 selectively provides outputs OSC and OSC responsive to a received CLK input from the controller and provides clock phase outputs ∅0-∅6, and ∅1-∅6, and ∅A and EN ∅C clock signals, selectively providing these clock phase signal outputs responsive to the received oscillator clock input from the external controller and to the received SYNC and DISABLE signals from the synchronization circuit 920. Additionally, the no clock detect circuit 915 is coupled to receive the externally provided clock input, and responsive thereto provides a NOCLK and a NOCLK signal output for coupling to the other circuit blocks, including synchronization circuit 920. The I/O buffer control 820 provides buffer control signal outputs IN, IN, OUT, OUT, and ENOUT, in response to receiving the DISABLE output signal from the synchronization circuit 920, the ∅B and ∅D clock outputs from the clock generator circuit 910, and a READ, an ADD, and a LOAD signal output from command latches 870. The clock generator 910, no clock detect circuit 915, synchronization circuit 920, and I/O buffer control 820 are identical to the corresponding circuitry of FIGS. 12AA and 12AB for the clock generator 730, no clock detect circuit 740, I/O control 750, and synchronization circuit 720, respectively.

Referring to FIG. 15BA, connection nodes 811, 812, 813 and 814, provide for coupling to the external I/O communication bus 336 for coupling to the controller circuit. The I/O buffers 800 are coupled to the nodes 811-814 for coupling to the external bus 336. The output buffers 804 of the buffer means 800 are shown in greater detail in detail sectional 804 of FIG. 15BA. The I/O buffers 800 provide interconnection nodes 805-808 which is coupled to an internal I/O bus 802 which is coupled to the command decode 810, as well as to other functional block elements. The I/O buffers 800 of FIG. 15BA are in the preferred embodiment identical to the I/O buffers 701 of FIG. 12BA. The command decode 810 is similar to the instruction decode PLA 700 of FIG. 12BA except for the addition of decode circuit structure for decoding the additional instructions of write two words into memory (W2) and write 16 words into memory (W16). Thus, the command decode 810 selectively provides an active output on one of signal outputs LA, RA, R2, R16, W2, and R16 responsive to the decoded received command from the I/O buffers 800 as received from the command bus 336, when an active DECODE enable output is received from the enable means 830. The command decode outputs LA, RA, R2, R16, W2, and W16, are coupled to the command latches 870 (FIG. 15BB) and are therein decoded to provide command latch outputs ADD, $\overline{ADD}$, READ, $\overline{READ}$, RW2, WRITE, and LOAD. One of the command latch outputs is selectively activated responsive to the docoded command outputs from the command decode 810, the DISABLE signal from synchronization means 820, and the RSTCL signal received from the reset logic 884. Note that the command latches 870 of FIG. 15BB are substantially identical to the command latches 702 of FIG. 12BB, with the addition of command latches and decode circuitry for providing a WRITE and a RW2 output. The enable circuit 830 of FIG. 15BA is similar to the enable circuit 703 of FIG. 12BA, except that in addition to receiving the READ, ADD, and DISABLE signals, the enable circuit 830 also receives as an input the WRITE signal as output from the command latches 870. The enable circuit 830 selectively provides an active output signal so as to enable the instruction decode circuitry 810 to receive and decode a data word from I/O buffers 800, responsive to the received READ, ADD, WRITE, and DISABLE signals. The enable circuit 830 provides means for inhibiting command decode once a command sequence has commenced until the command sequence is completed.

Referring to FIGS. 15CA and 15CB, the program counter 840 of FIG. 13 is shown in detailed schematic form. Program counter 840 is comprised of three BCD digit stages 841, 842 and 843. The circuitry of counter stages 841 and 842 are identical to that of counter stage 690 illustrated in FIGS. 12CA and 12CB, and the discussion of counter stage 690 with reference to FIGS. 12CA and 12CB is equally applicable to counter stages 841 and 842. The last digit of the program counter stages, 843, is shown in an expanded detailed circuit schematic form in FIG. 15DB. In the preferred embodiment, the program counter stage counter stage 843 is designed so as to count to 7 (111 in binary), and then reset to 0. This is because, in the preferred embodiment, the read/write memory program counter 840 is designed to count from 0 to 799 (decimal). The program counter 840, in a like manner to the program counter 704 of FIGS. 12CA and 12DB, may be designed so as to contain a plurality of counter stages, greater than or less than those shown in the preferred embodiments, and may be designed with other counter circuitry design types.

The data latches 845, as shown in detailed schematic form of FIG. 15DA, are comprised of bidirectional data latches storing received data words from the internal bus 802 during sequential memory cycles in separate latch locations, and outputting this stored received data to the data interface 894 of the memory 892. In the preferred embodiment, since the data bus 802 is four bits wide while the memory word size is eight bits, two successive transfers of four bits of data from the bus 802 to the data latches 845 are required prior to transfer of one eight bit data word to the memory 892. Additionally, the data latches 845 store a received eight bit data word, in the preferred embodiment, as output from the memory 892, and selectively transfer four bits at a time from the eight bit data word onto the I/O bus 802 for coupling to the external bus 336. The data latches load data from the memory 892 responsive to a LRD signal received from data latch control and RAM rewrite logic 885 as shown in detail in FIGS. 15E and 15F, multiplexing the loaded data onto the bus 802 responsive to receiving an SD1 and an SD2 signal in a manner analogous with that described with reference to the data latches 705, as described with reference to FIG. 12DA. Additionally, the data latches 845 store sequentially transferred and received data words from the bus 802 in separate latches responsive to receiving an LD1 and an LD2 signal as received from said data control and read write logic 885 as shown in detail in FIG. 15F. The memory circuit 892 of FIG. 15DA is shown in greater detail in FIGS. 17A-17C. The decode schematic diagram of the power switching circuit 900. The decode circuit 895 of the memory 892 is coupled to the address outputs A0-A10 of the program counter means 840.

Figure 15E:
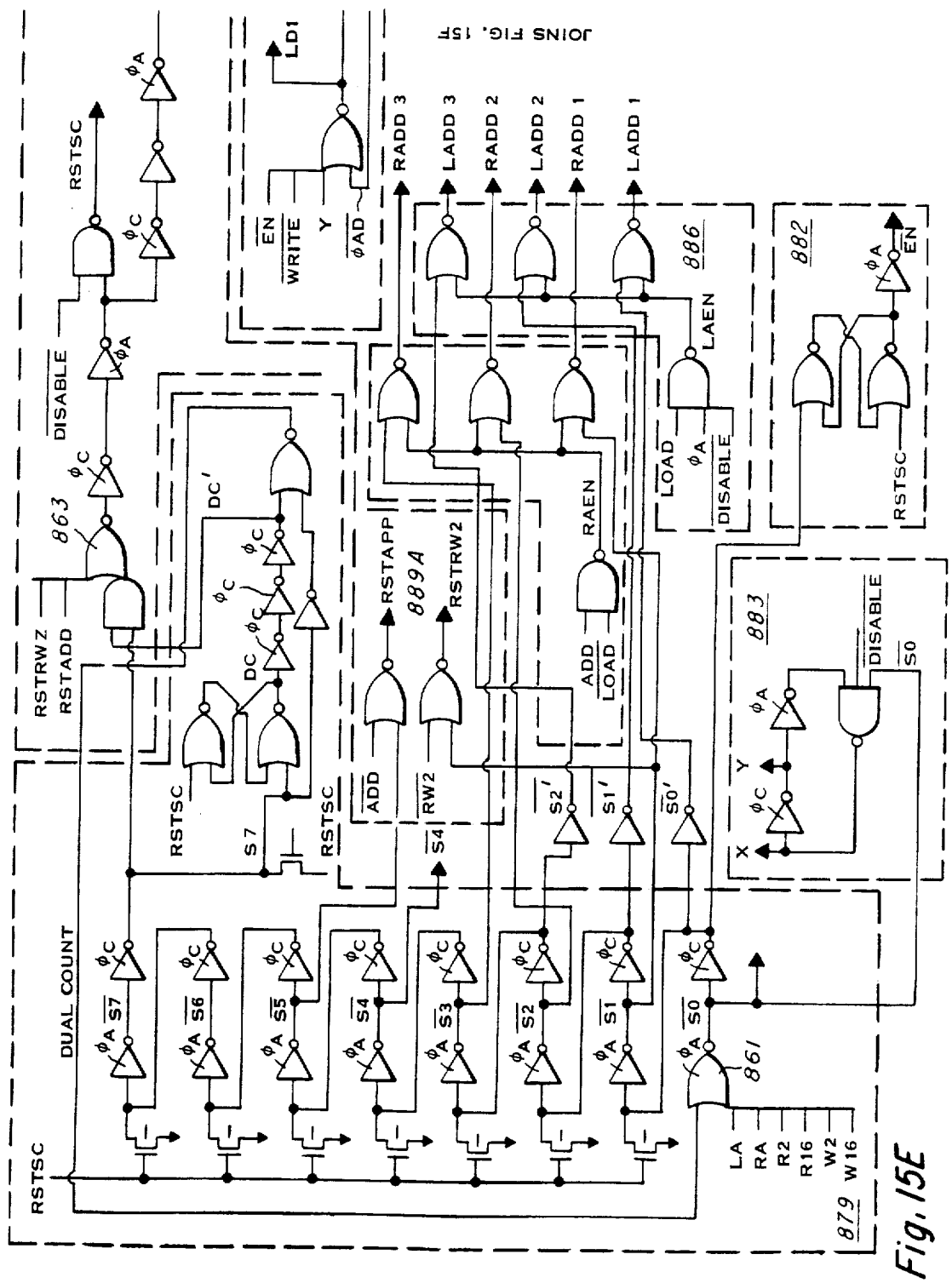
FIG. 15E illustrates the detailed schematic diagram of state counter 879, memory 882 and divide-by-two timer 883.
Figure 15F:
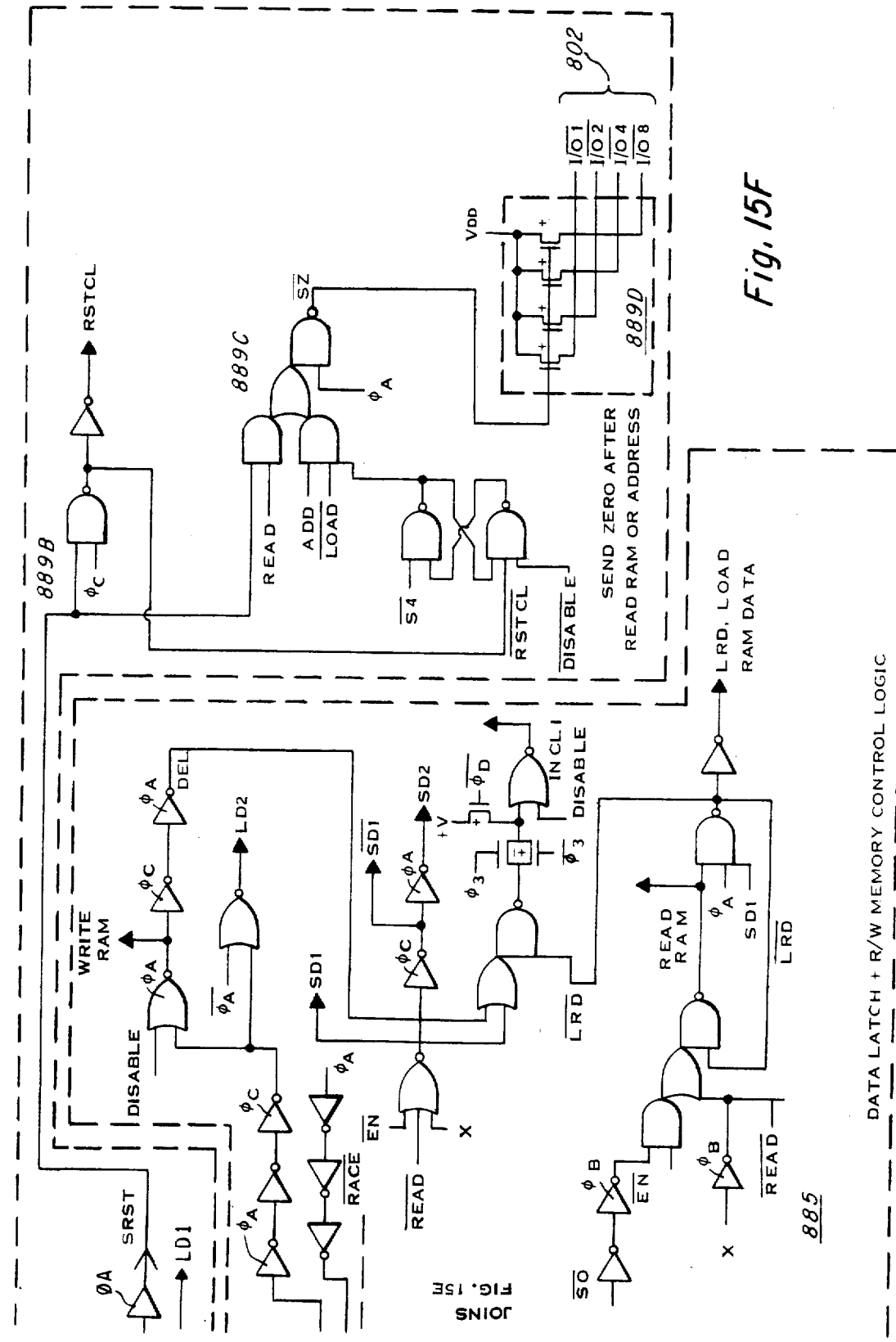
FIG. 15F illustrates the detailed schematic diagram of data latch and read/write control logic 885.
Figure 15G:
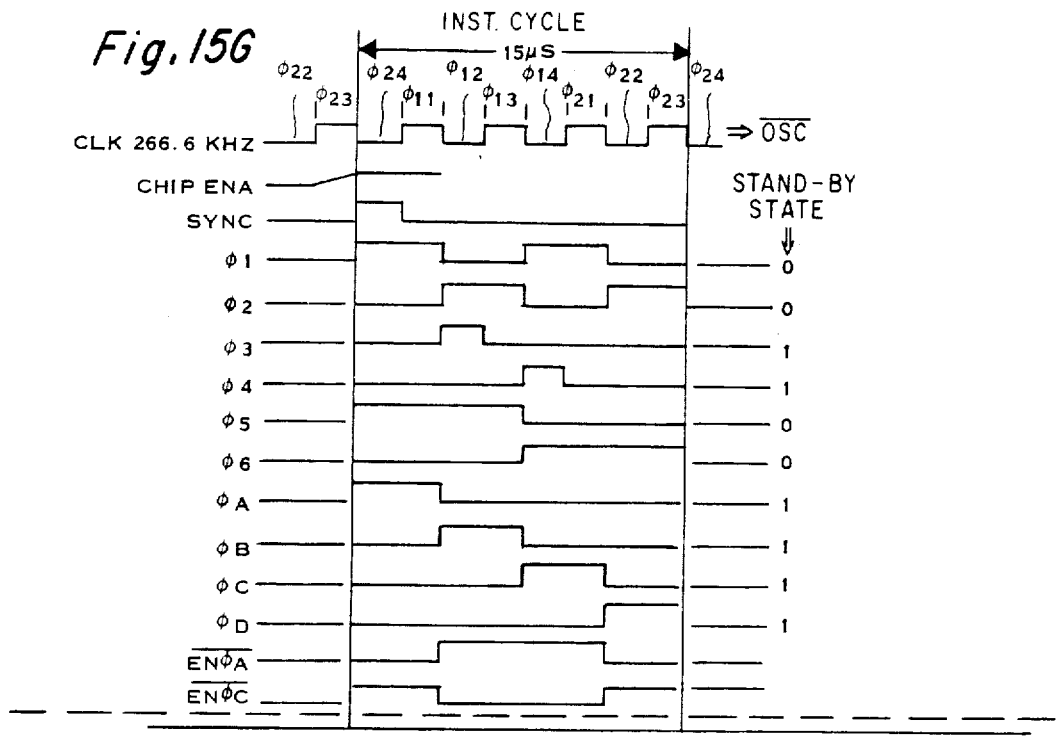
FIG. 15G illustrates the timing waveforms and FIG. 15H illustrates standard elements for the circuits illustrated in FIGS. 15A-15F.
Figure 15H:
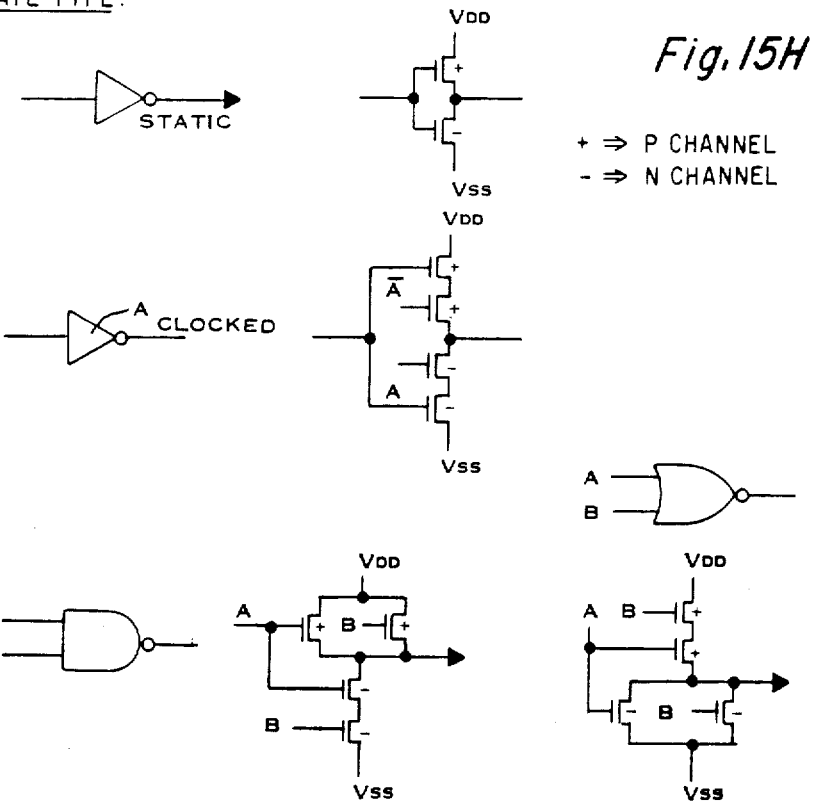

Referring to FIG. 15E, the detailed circuit schematic for the state counter 879, the read/write circuit 882, the divide-by-two timer 883, the write address control logic 881, the end of instruction reset logic 889, and the data latch control and read/write logic 885 are shown. The remainder of the end of instruction reset logic 889 and data latch control and read/write logic 885 is shown in FIG. 15F. The state counter 879 is identical to the state counter 706 of FIG. 12F except that output signals W2 and W16 received from the command decode circuit 810 are coupled to the state counter 879 in addition to output signals LA, RA, R2, and R16 (which are also present in the state counter 706). Specifically, the input signals W2 and W16 are coupled to the input of NOR gate 861 which also has coupled thereto the LA, RA, R2 and R16 inputs. The state counter 879 of FIG. 15E, like the counterpart state counter 706 of FIGS. 12EA and 12EB, provides outputs S0-S7, and S0-S7 responsive to receiving the $\emptyset A$, $\emptyset C$, RSTSC, LA, RA, R2, R16, W2 and W16 input signals. Functionally, the end of instruction reset logic 889 of FIGS. 15E and 15F is substantially identical with the reset logic 711 of FIGS. 12EA, 12EB and 12F. The reset logic 889 is comprised of functional subgroups 889a, 889b, 889c and 889d, which correspond to the functional sub-blocks 711a-d of the reset logic 711 of FIGS. 12EA, 12EB and 12F. Each of the sub-blocks of the reset logic is substantially identical to the counterpart sub-blocks of FIGS. 12EA, 12EB and 12F. Reset logic sub-block 889a is coupled to the state counter 879 for receiving said S5 signal output and said S1 signal output therefrom. Additionally, the sub-group 889a of the reset logic is coupled to receive the ADD and the RW2 output signals from command latches 870. Responsive to the ADD signal and the S5 signal, reset logic 889A provides a RSTADD signal output, which is coupled to reset logic subgroup 889B. Furthermore, responsive to the RW2 and the S1 signals, reset logic sub-group 889a provides a RSTRW2 output which is coupled to the reset logic subgroup 889B. The input signal RW2 from the command latches 870 is substituted for the input signal R2 of sub-block 711a of FIG. 12EA, and a resultant output RSTRW2 is substituted for the responsive output signal RSTR2 of block 711a of FIG. 12EA so as to result in the reset logic sub-block 889a of FIG. 15E. The reset logic sub-block 889b of FIG. 15F is identical to the reset logic sub-block 711b of FIGS. 12EB and 12F except that the input signal RSTR2 of reset logic 711b is replaced by the RSTRW2 signal output from reset logic sub-block 889a in FIG. 15E. In a manner similar to that described with reference to block 711b of reset logic of FIGS. 12EB and 12F, the reset logic sub-block 889b provides a RSTSC signal output for coupling to other circuit blocks in the memory, an output signal SRST for coupling to reset logic sub-block 889c, an output signal RSTCL for coupling to other circuit blocks of the memory, responsive to receiving as inputs the RSTRW2 signal, the RSTADD signal (from sub-block 889a of the reset logic) in response to: clock generator outputs ØA and ØC, the DISABLE signal from synchronization circuit 920, the S7 signal output from state counter 879 and the Øc' signal output from state counter 879. The outputs of the reset logic 889b are coupled to other circuit blocks within the memory means to provide for synchronization and control of reset procedures within the memory. Reset logic sub-block 889c is coupled to said sub-block 889b for receiving SRST output signal and the RSTCL signal therefrom; to the synchronization circuit 920 for receiving the DISABLE signal therefrom; to the clock generator circuit for receiving the ØA signal therefrom, and to the command latches 870 for receiving therefrom the READ, ADD, and LOAD signals. Responsive to these input signals reset zero logic sub-block 889c provides a send zero signal $\overline{SZ}$ which is coupled to reset logic sub-block 889d.

After completion of a command cycle for reading the address from the program counter or reading data from the memory array, the send zero signal output $\overline{SZ}$ is activated so as to enable a zero latch within the reset logic sub-group 889d so as to couple zero logic level output signals (NO-OP condition) to the internal I/O bus 802 for coupling to the external communications I/O bus 336. The send zero signal ($\overline{SZ}$) is activated after a read command memory cycle from the memory array or from the program counter, since as the last device utilizing the command bus, it is the duty of the sending circuit to send a NO-OP condition signal pattern on the command bus 336 to allow for commencement of the next command cycle in accordance with the command protocol.

The read/write enable circuit 882 provides an enable output ($\overline{EN}$) which is coupled to the data latch control circuit 885, responsive to receiving the ØA signal and the S0 signal outputs from state counter 879, and in response to receiving the RSTSC signal from reset logic sub-group 889b. The divide-by-two circuit 883 of FIG. 15E is identical to the divide-by-two circuit 713 of FIG. 12EA, and the description with reference to FIG. 12EA of circuit 713 is equally applicable to the circuit 883 of FIG. 15E. The address control logic 886 of FIG. 15E is substantially identical to the address control logic 708 of FIG. 12EB except that the address control logic 886 controls three BCD digits of the address program counter while the address control logic 708 of FIG. 12EB controls five BCD digits of the address program counter. Responsive to receiving the ADD signal and the LOAD signal from command latches 870, the DISABLE signal from sychronization circuit 920, the $\overline{S0'}$, $\overline{S1'}$, $\overline{S2'}$, $\overline{S3}$, and ØA output signals from said state counter 879, said address control logic 886 provides signal outputs LADD1, LADD2, LADD3, RADD1, RADD2, RADD3, corresponding to load address digit 1, 2 or 3, or read address digit 1, 2 or 3, respectively. The outputs LADD1-3 and RADD1-3 are coupled to program counter means 840 for control of communication between the program counter 840 with the internal I/O bus 802.

The data latch control logic and read/write logic 885 provides outputs LD1, LD2, SD1, SD2, LRD, INCL1, READRAM, and WRITERAM, for coupling to other circuit block elements of FIGS. 15A–15F. The LD1, LD2, SD1, SD2, and LRD outputs from the logic 885 are coupled to the bidirectional data latches 845 of FIG. 15DA. The data latch and read/write logic 885 are coupled: to the divide-by-two timer 884, receiving the X and Y signal outputs therefrom; to the read/write enable logic 882 for receiving the $\overline{EN}$ signal therefrom; to the clock synchronization circuit 920 for receiving the DISABLE signal therefrom, to the state counter 879 for receiving the ØA, $\overline{ØA}$, ØC, $\overline{ØD}$, ØB, Ø3 and $\overline{Ø3}$ and S0; and is coupled to the command latches 870 for receiving the READ, and WRITE output signals therefrom. The data latch and read/write memory logic 885 provides the outputs LD1, LD2, SD1, SD2, INCL1, LRD (load RAM data), READRAM, and WRITERAM, responsive to receiving the $\overline{EN}$, WRITE, READ, X, Y, S0, ØA, ØB, ØC, $\overline{ØA}$, $\overline{ØD}$, Ø3, $\overline{Ø3}$, and DISABLE signals. The LD1, LD2, SD1, SD2, and LRD output signals provide control for the bidirectional data latches 845, selecting latch functions and multiplex functions for read and write cycles in response to the received signals coupled to the data latch and read/write memory control logic 885. The READRAM, WRITERAM, and SD1 output signals from the data latch and read/write memory control logic 885 are coupled to the memory array read/write control logic 897 as shown in FIGS. 17A–17C.

Figure 17A:
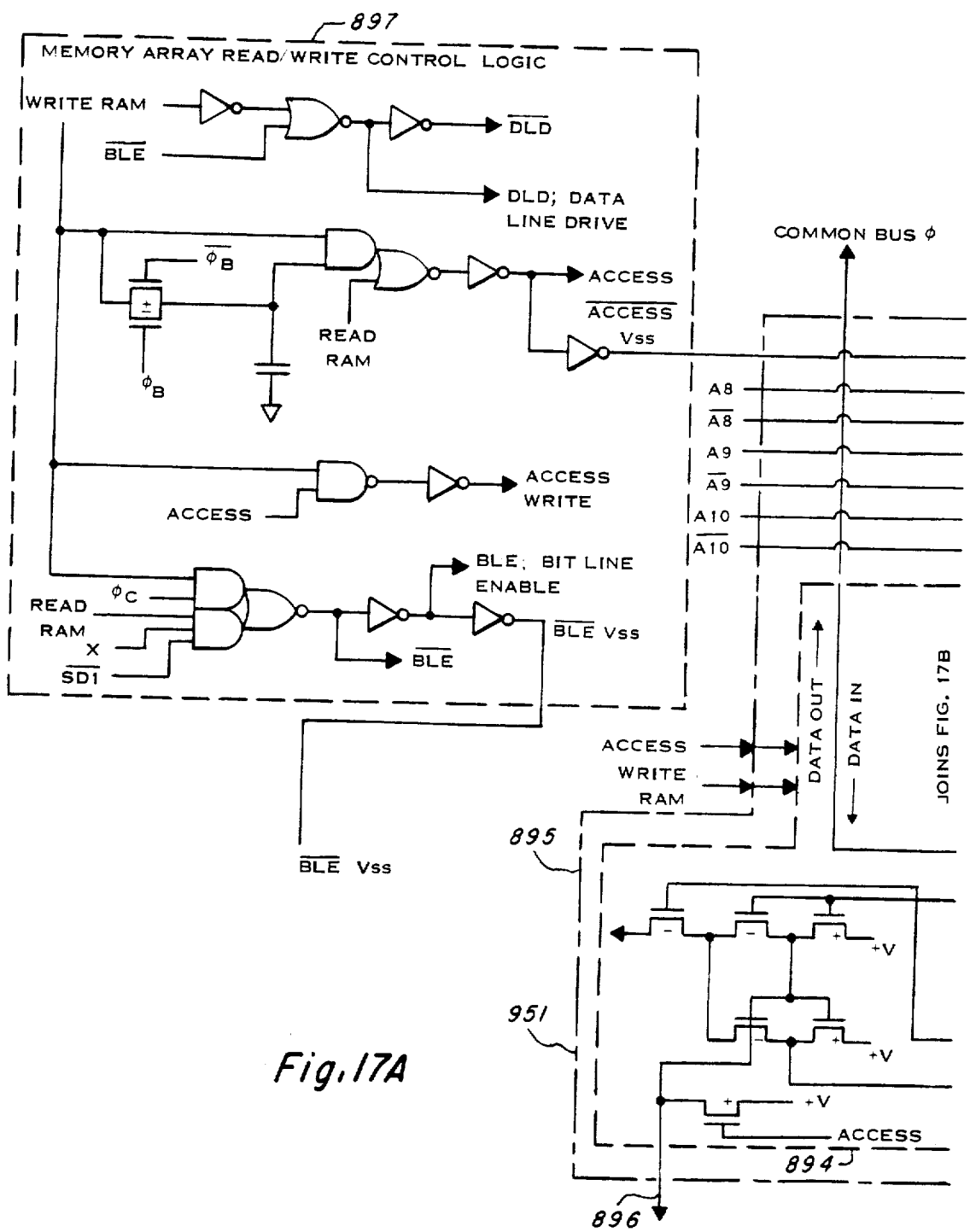
Figure 17C:
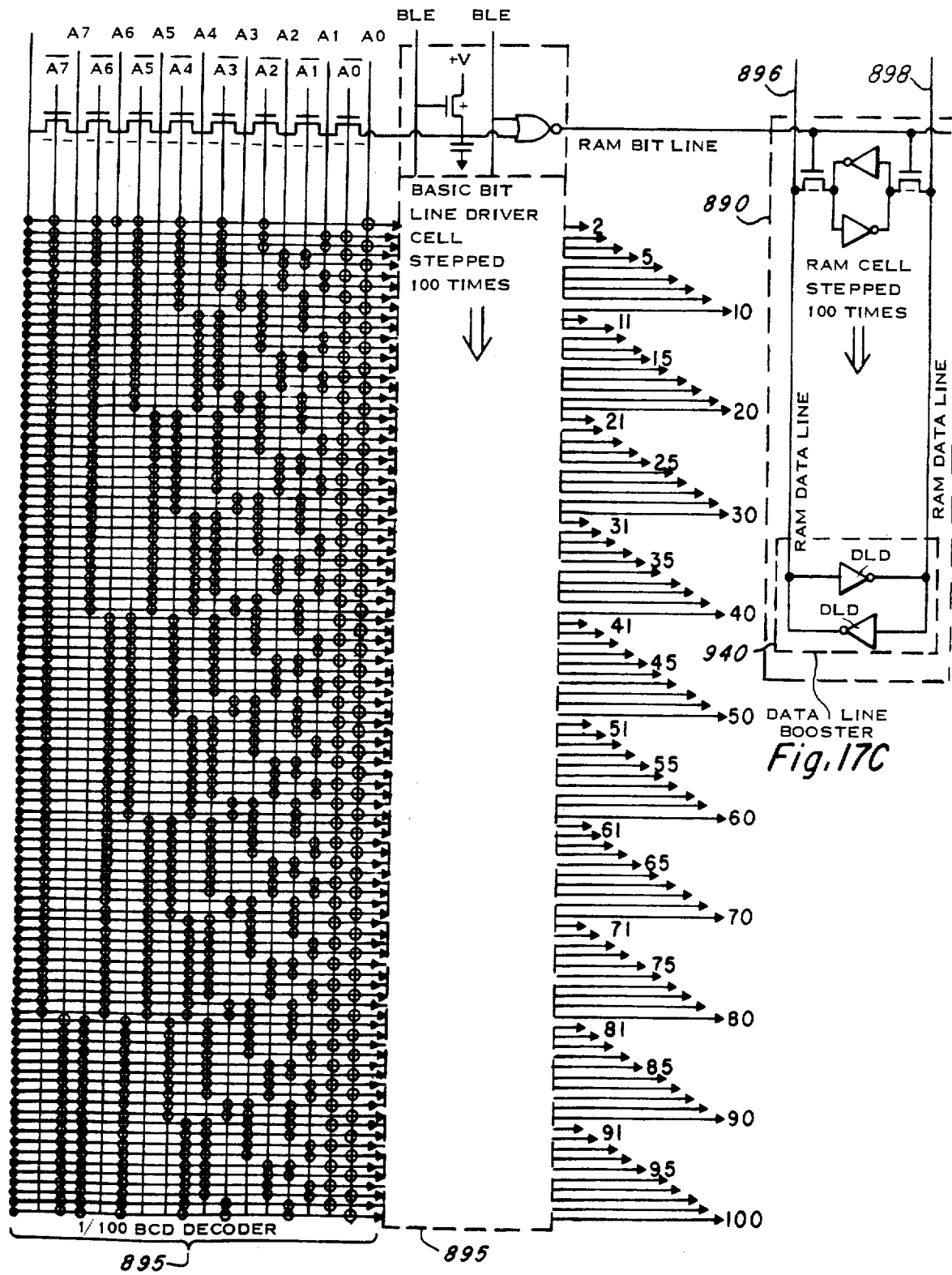

Referring to FIG. 16, the drawing interrelationship of FIGS. 17A–17C is shown. Referring to FIG. 17A, the memory array read/write control logic circuit 897 selectively provides data line drive output signals DLD and $\overline{DLD}$; memory array access control signal outputs ACCESS, $\overline{ACCESS}$, VSS, and ACCESS WRITE; and bit line enable output signals BLE, $\overline{BLE}$, and $\overline{BLE}$ VSS. These output signals are selectively provided responsive to: the signals WRITE RAM, READ RAM, and SD1, as received from the data latch and read/write memory control logic 885, the X output signal from divide by two circuit 883, and the ØB, $\overline{ØB}$, and ØC signals as received from state counter means 879. The BLE and $\overline{BLE}$ output signals and $\overline{BLE}$ VSS output signal are coupled to the bit line drivers of the decode means 895 as shown in FIG. 17C, to control selection of a particular set of bit line drivers. The DLD and $\overline{DLD}$ output signals from the memory array read/write control logic 897 are coupled to the array 890 so as to control the direction of data line transfer provided by data line booster 940 of the memory array 890. Address inputs from the program counter 840 are coupled to the address decode circuit 895 as shown in FIGS. 17A–17C, providing bit selection within the major RAM groups 951–958, as shown in FIG. 17B, and for selectively enabling one out of 100 RAM bit lines as shown in FIG. 17C. An access control logic circuit 894 provides RAM data line outputs 896, 898, and 941 from RAM group 951 for selectively coupling to the memory array 890, responsive: to the received address inputs A8–A10 and $\overline{A8}$–$\overline{A10}$; to ACCESS signals received from the memory array read/write control logic 897: and to the WRITE RAM signal output received from data latch and read/write memory control logic 885. Furthermore, the circuit 894 selectively couples input data from said common bus 0 to RAM data lines 896 and 898 or to to RAM data lines 941, when an active WRITE RAM and an active ACCESS signal are present, storing the received data signal from common bus 0 at a location within the memory array 890 responsive to the received address inputs from the program counter 840. The access control logic 894 is stepped six times per major RAM group, each RAM group coupling to a separate common bus bit position, common bus 0-common bus 7 coupling to major RAM groups 951–958, respectively.

What is claimed is:

1. A memory system comprising:
   a bidirectional bus means coupled to a source for providing command signals, address signals and data signals;
   a command decode means coupled to said bus means for generating respective first, second and at least a third decode outputs in response to receipt of first, second and at least a third command signals;
   a program counter means coupled to said bus means and to said command decode means for storing therein an address corresponding to an address signal received via said bus means upon receipt of said first decode output, for generating an address signal corresponding to said address stored therein upon receipt of said second decode output, and for sequentially and repetitively generating an address signal corresponding to said address stored therein and incrementing said address stored therein upon receipt of said third decode output, this sequential and repetitive operation being repeated a predetermined number of times corresponding to said third command signal; and
   a memory array coupled to said bus means, said command decode means and said program counter means, having a plurality of multibit data words stored at memory locations therein corresponding to said address signals, for providing multibit data words as data signals to said bus means upon receipt of said address signals from said program counter means in response to either said second decode output or said third decode output from said command decode means.

2. A memory system as claimed in claim 1, wherein:
   said third command signal is a multiple memory location recall command signal; and
   said memory means produces data signals corresponding to multibit data words stored at memory locations corresponding to said address signals received from said program counter means and applies said data signals to said bus means.

3. A memory system as claimed in claim 1, wherein:
   said third command signal is a multiple memory location store signal; and
   said memory array receives data signals from said bus means and stores multibit data signals corresponding to said received data signals at memory locations corresponding to said address signals received from said program counter means.

4. A memory system as claimed in claim 1, further comprising:
   memory module housing means having said bus means, said command decode means, said program counter means and said memory array disposed therein, said memory module housing means having connector means connected to said bus means for removable connection to a data processing apparatus.

5. A data processing apparatus comprising:
   a controller means for generating command signals, address signals and data signals, said command signals comprising a load address command signal, a single memory location command signal corresponding to memory transfer operation utilizing a single memory location, and at least one multiple memory location command signal corresponding to a memory transfer operation utilizing a predetermined number of memory locations;
   a bidirectional bus means coupled to said controller for transmitting said command signals, address signals and data signals;
   a command decode means coupled to said bus means for generating respective first, second and at least a third decode output in response to receipt of said load address command signal, said single memory location command signal and said at least one multiple memory location command signal, respectively;
   a program counter means coupled to said bus means and to said command decode means for storing therein an address corresponding to an address signal received via said bus means upon receipt of said first decode output, for generating an address signal corresponding to said address stored therein upon receipt of said second decode output, and for sequentially and repetitively generating an address signal corresponding to said address stored therein and incrementing said address stored therein upon receipt of said third decode output, this sequential and repetitive operation being repeated a predetermined number of times corresponding to said multiple memory location command signal; and
   a memory array connected to said bus means, said command decode means and said program counter means having a plurality of multibit data words stored at memory locations therein corresponding to said address signals, for providing multibit data words as data signals to said bus means upon receipt of said address signals from said program counter means in response to either said second decode output or said third decode output from said command decode means.

6. A data processing system according to claim 5 wherein said memory array is a read only memory.

7. A data processing system according to claim 5 wherein said memory array is a read/write memory.

8. A data processing apparatus as claimed in claim 5, wherein:

said at least one multiple memory location command signal includes a multiple memory location store command signal.

9. A data processing apparatus as claimed in claim 5 wherein:

said at least one multiple memory location command signal includes a multiple memory location recall command signal.

10. A data processing apparatus as claimed in claim 5 wherein:

said memory means further includes a memory controller means for generating an active enable output and an inactive enable output; and said command decode means includes means connected to said memory controller means for enabling generation of decode outputs in response to received command signals only when said memory controller means is generating said active enable output.

11. A data processing apparatus as claimed in claim 5 wherein:

said command signals generated by said controller means further includes an address read command signal;

said command decode means includes means for generating a fourth decode output in response to said address read command signal; and said program counter means includes means for generating an address signal corresponding to said address stored therein upon receipt of said fourth decode output and applying said address signal to said bus means.

* * * * *